(12) United States Patent
Kim et al.

(10) Patent No.: US 11,917,820 B2
(45) Date of Patent: Feb. 27, 2024

(54) VERTICAL SEMICONDUCTOR DEVICE AND FABRICATION METHOD THEREOF

(71) Applicant: SK hynix Inc., Icheon (KR)

(72) Inventors: Eun-Ho Kim, Suwon (KR); Eun-Joo Jung, Icheon (KR); Jong-Hyun Yoo, Suwon (KR); Ki-Jun Yun, Yongin (KR); Sung-Hoon Lee, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/368,630

(22) Filed: Jul. 6, 2021

(65) Prior Publication Data

US 2021/0335800 A1    Oct. 28, 2021

Related U.S. Application Data

(63) Continuation of application No. 16/570,089, filed on Sep. 13, 2019, now Pat. No. 11,088,160.

(30) Foreign Application Priority Data

Mar. 15, 2019    (KR) .................. 10-2019-0030113

(51) Int. Cl.
*H10B 43/20* (2023.01)
*H10B 43/10* (2023.01)
*H10B 43/30* (2023.01)
*H10B 43/40* (2023.01)

(52) U.S. Cl.
CPC ............ *H10B 43/20* (2023.02); *H10B 43/10* (2023.02); *H10B 43/30* (2023.02); *H10B 43/40* (2023.02)

(58) Field of Classification Search
CPC ................................ H01L 27/11565
See application file for complete search history.

(56) References Cited

U.S. PATENT DOCUMENTS

| | | | |
|---|---|---|---|
| 8,680,604 B2 | 3/2014 | Higashi et al. | |
| 8,759,217 B1 | 6/2014 | Chen | |
| 9,257,444 B2* | 2/2016 | Oh | H01L 27/11582 |
| 9,929,093 B2 | 3/2018 | Lee | |
| 2012/0135583 A1 | 5/2012 | Jang et al. | |

(Continued)

FOREIGN PATENT DOCUMENTS

| | | |
|---|---|---|
| CN | 107546229 A | 1/2018 |
| KR | 20180001301 A | 1/2018 |

OTHER PUBLICATIONS

Non-Final Office Action in related U.S. Appl. No. 16/597,603, dated Jan. 22, 2021.

*Primary Examiner* — Yu-Hsi D Sun

(57) ABSTRACT

A method for fabricating semiconductor device includes forming an alternating stack that includes a lower multi-layered stack and an upper multi-layered stack by alternately stacking a dielectric layer and a sacrificial layer over a substrate, forming a vertical trench that divides the upper multi-layered stack into dummy stacks, and forming an asymmetric stepped trench that is extended downward from the vertical trench to divide the lower multi-layered stack into a pad stack and a dummy pad stack, wherein forming the asymmetric stepped trench includes forming a first stepped sidewall that is defined at an edge of the pad stack, and forming a second stepped sidewall that is defined at an edge of the dummy pad stack and occupies less area than the first stepped sidewall.

11 Claims, 43 Drawing Sheets

(56) References Cited

U.S. PATENT DOCUMENTS

2013/0161821 A1   6/2013  Hwang
2014/0162420 A1   6/2014  Oh
2017/0141032 A1   5/2017  Jae
2017/0317088 A1   11/2017 Lee
2018/0145029 A1   5/2018  Tanzawa

* cited by examiner

VERTICAL SEMICONDUCTOR DEVICE AND FABRICATION METHOD THEREOF

CROSS-REFERENCE TO RELATED APPLICATIONS

The present application is continuation of U.S. application Ser. No. 16/570,089, filed Sep. 13, 2019, which claims priority of Korean Patent Application No. 10-2019-0030113, filed on Mar. 15, 2019, which is incorporated herein by reference in its entirety.

BACKGROUND

1. Field

Exemplary embodiments of the present disclosure relate to a semiconductor device and a method for fabricating the semiconductor device, and more particularly to a vertical semiconductor device including a multi-layered structure and a method for fabricating the vertical semiconductor device.

2. Description of the Related Art

A semiconductor device includes a memory device capable of storing data. The memory device may include memory strings. Each of the memory strings includes memory cells coupled in series to each other.

In order to improve the degree of integration of memory strings, a three-dimensional memory device has been proposed. Memory cells of the three-dimensional memory device are arranged three-dimensionally over a substrate. The three-dimensional memory device includes a multi-layered structure. The multi-layered structure is coupled to the memory cells, and includes conductive patterns that are arranged at different heights. The conductive patterns are coupled to contact plugs in order to independently apply electrical signals to the conductive patterns that are arranged at different heights. To this end, various technologies are being developed.

SUMMARY

Embodiments of the present disclosure are directed to a vertical semiconductor device having a pad area in which contact plugs may be coupled to a multi-layered structure, and a method for fabricating the vertical semiconductor device.

In accordance with an embodiment of the present disclosure, a method for fabricating a vertical semiconductor device includes depositing a plurality of conductive layers and a plurality of dielectric layers over a substrate, the conductive layers alternating with the dielectric layers, respectively, to form an alternating stack, etching a first trench in the alternating stack, the first trench having symmetric stepped sidewalls, and etching the first trench to form a second trench with a first stepped sidewall and a second stepped sidewall that is asymmetric to the first stepped sidewall.

In accordance with another embodiment of the present disclosure, a method for fabricating a semiconductor device includes forming an alternating stack over a substrate that extends from a cell region to a peripheral region of the semiconductor device, the alternating stack including conductive layers and dielectric layers, each of the conductive layers alternating with one of the dielectric layers, etching a first trench in the alternating stack, the first trench having symmetric stepped sidewalls, and etching the first trench to form a second trench with a first stepped sidewall and a second stepped sidewall that is asymmetric to the first stepped sidewall, wherein the second stepped sidewall occupies less surface area of the substrate than the first stepped sidewall.

DETAILED DESCRIPTION

Figure 1A:
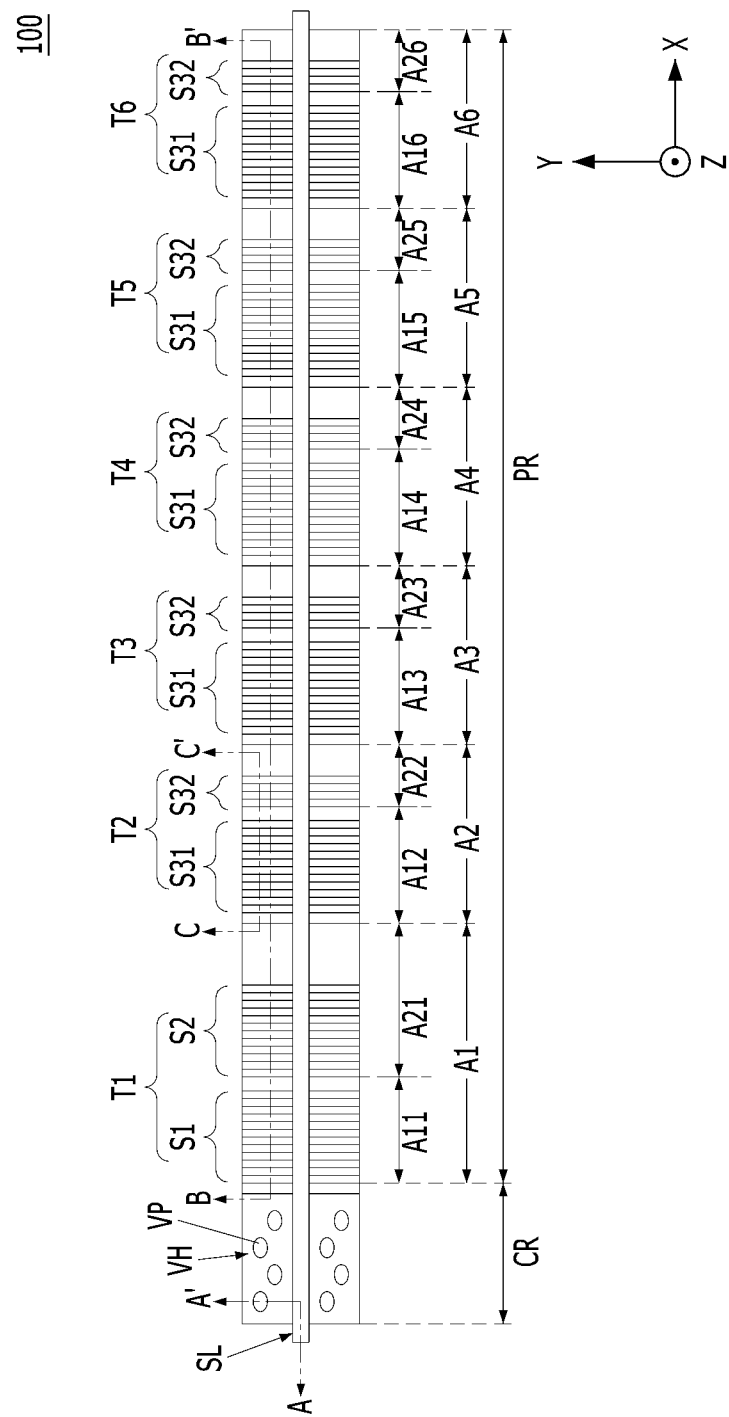
FIG. 1A is a plan view illustrating a vertical semiconductor device in accordance with an embodiment of the present disclosure.

Exemplary embodiments of the present disclosure will be described below in more detail with reference to the accompanying drawings. Embodiments have different forms and the scope of the present disclosure should not be construed as limited to the embodiments set forth herein. Rather, these embodiments are provided so that this disclosure will be thorough and complete, and will fully convey the scope of the claims to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
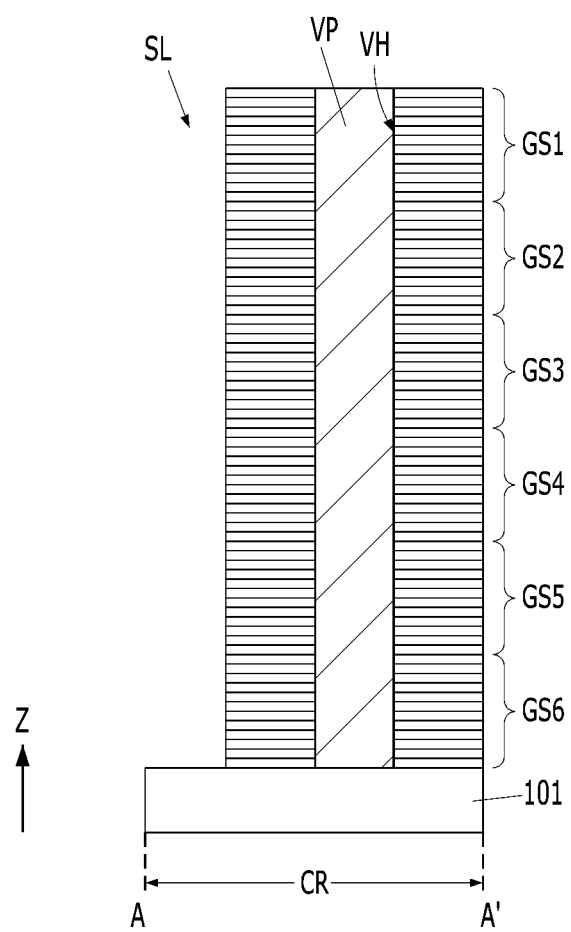
FIG. 1B is a cross-sectional view taken along a line A-A' shown in FIG. 1A.
Figure 1C:
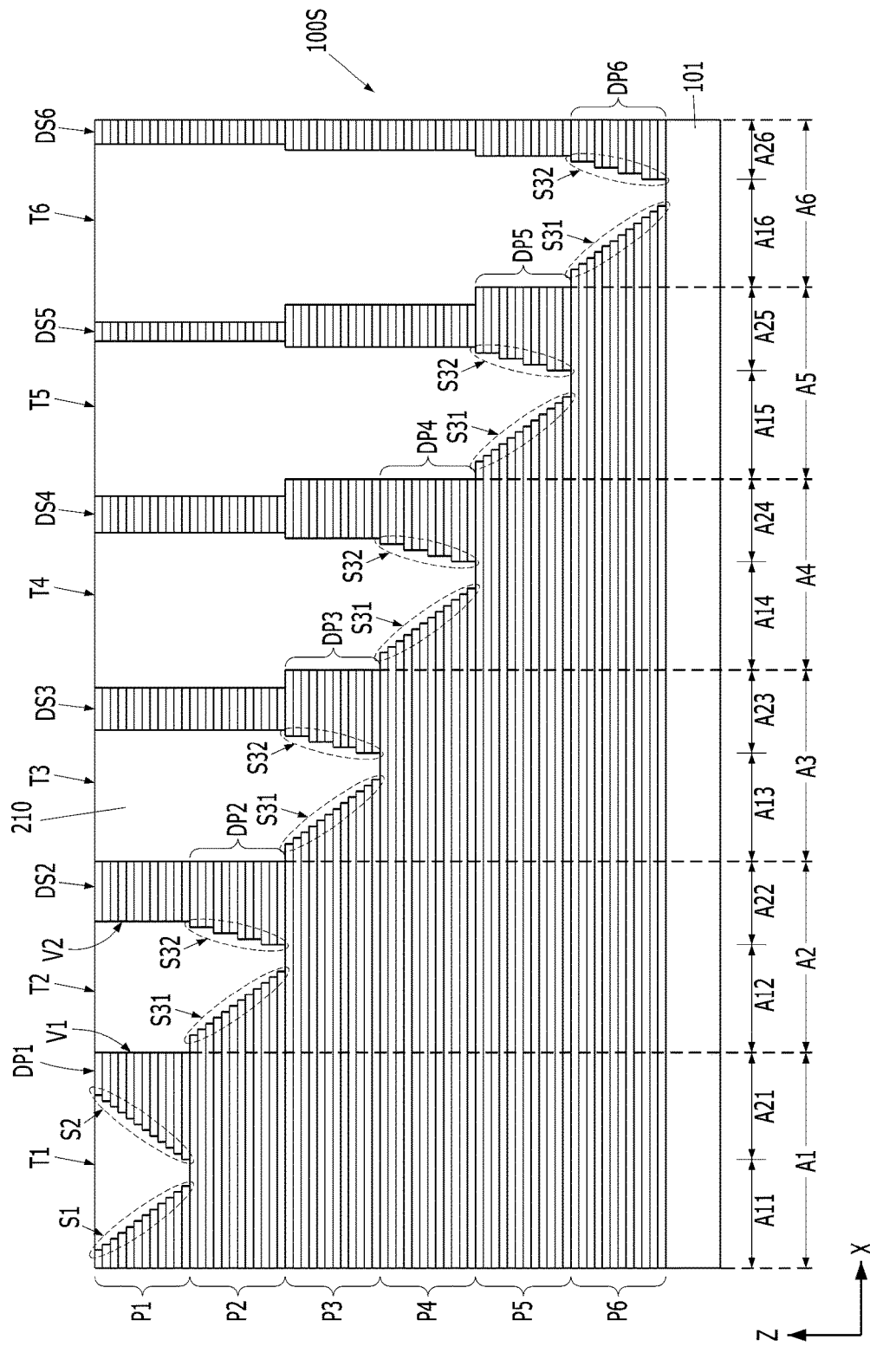
FIG. 1C is a cross-sectional view taken along a line B-B' shown in FIG. 1A.

FIG. 1A is a plan view illustrating a vertical semiconductor device in accordance with an embodiment of the present disclosure. FIG. 1B is a cross-sectional view taken along a line A-A' shown in FIG. 1A. FIG. 1C is a cross-sectional view taken along a line B-B' shown in FIG. 1A.

Referring to FIGS. 1A to 1C, the vertical semiconductor device 100 may include a cell region CR and a peripheral region PR. The cell region CR and the peripheral region PR may include a substrate 101 and a multi-layered stack structure 100S formed over the substrate 101. The peripheral area PR may include first to sixth areas A1 to A6. The first area A1 may be the closest to the cell region CR, and the sixth area A6 may be the farthest from the cell region CR. The first to sixth areas A1 to A6 may be sequentially arranged in a first direction X from the cell region CR. The first to sixth areas A1 to A6 may include pad areas A11 to A16 and dummy pad areas A21 to A26, respectively. The pad areas A11 to A16 and the dummy pad areas A21 to A26 may be isolated by stepped trenches T1 to T6. The stepped depth of trenches T1 to T6 may progressively increase. The stepped trenches T1 to T6 may include a symmetric stepped trench T1 positioned in the first area A1 and asymmetric stepped trenches T2 to T6 positioned in the second to sixth areas A2 to A6. The stepped trenches T1 to T6 may be in a line shape extending in a third direction Y.

The multi-layered stack structure 100S may include gate electrode stacks GS1 to GS6, gate pad stacks P1 to P6, and dummy gate pad stacks DP1 to DP6. The gate electrode stacks GS1 to GS6 may be formed in the cell region CR. The peripheral region PR may include gate pad stacks P1 to P6 and dummy gate pad stacks DP1 to DP6. The gate pad stacks P1 to P6 may extend from the gate electrode stacks GS1 to GS6 in the first direction X. The gate pad stacks P1 to P6 may correspond to edges of the gate electrode stacks GS1 to GS6. The gate pad stacks P1 to P6 and the dummy gate pad stacks DP1 to DP6 may be formed in the first to sixth areas A1 to A6, respectively. Supporting stacks DS2 to DS6 may be formed over the dummy gate pad stacks DP2 to DP6. A supporting stack may not be formed over the dummy gate pad stack DP1.

The first gate pad stack P1 and the first dummy gate pad stack DP1 may be positioned in the first area A1, and the first dummy gate pad stack DP1 may perform a function of a first supporting stack that minimizes dishing during a chemical mechanical polishing (CMP) operation. The second gate pad stack P2, the second dummy gate pad stack DP2, and the second supporting stack DS2 may be positioned in the second area A2. The third gate pad stack P3, the third dummy gate pad stack DP3, and the third supporting stack DS3 may be positioned in the third area A3. The fourth gate pad stack P4, the fourth dummy gate pad stack DP4, and the fourth supporting stack DS4 may be positioned in the fourth area A4. The fifth gate pad stack P5, the fifth dummy gate pad stack DP5, and the fifth supporting stack DS5 may be positioned in the fifth area A5. The sixth gate pad stack P6, the sixth dummy gate pad stack DP6, and the sixth supporting stack DS6 may be positioned in the sixth area A6.

Portions of the second to sixth gate pad stacks P2 to P6 may be positioned below the first gate pad stack P1 in the first area A1. Portions of the third to sixth gate pad stacks P3 to P6 may be positioned below the second gate pad stack P2 in the second area A2. Portions of the fourth to sixth gate pad stacks P4 to P6 may be positioned below the third gate pad stack P3 in the third area A3. Portions of the fifth and sixth gate pad stacks P5 and P6 may be positioned below the fourth gate pad stack P4 in the fourth area A4. A portion of the sixth gate pad stack P6 may be positioned below the fifth gate pad stack P5 in the fifth area A5. As described above, overlapping portions of the first to sixth gate pad stacks P1 to P6 may extend to the gate electrode stacks GS1 to GS6.

The first to sixth gate pad stacks P1 to P6 may be positioned in the first to sixth pad areas A11 to A16, respectively. The first to sixth dummy gate pad stacks DP1 to DP6 may be positioned in the first to sixth dummy gate pad areas A21 to A26, respectively. The second to sixth supporting stacks DS2 to DS6 may be positioned over the second to sixth dummy gate pad stacks DP2 to DP6, respectively.

The edges of the first to sixth gate pad stacks P1 to P6 may be spaced apart from each other in the first direction X. The edges of the first to sixth gate pad stacks P1 to P6 may not overlap with each other in the second direction Z. The first to sixth gate pad stacks P1 to P6 may have the same height.

The first to sixth dummy gate pad stacks DP1 to DP6 may be positioned to be spaced apart from each other in the first direction X. The first to sixth dummy gate pad stacks DP1 to DP6 may not overlap with each other in the second direction Z. The first to sixth dummy gate pad stacks DP1 to DP6 may have the same height.

The second to sixth supporting stacks DS2 to DS6 may be spaced apart from each other in the first direction X. The top surfaces of the first dummy gate pad stack DP1 and the second to sixth supporting stacks DS2 to DS6 may be positioned at the same level. The second to sixth supporting stacks DS2 to DS6 may have different heights in the second direction Z. The second supporting stack DS2 may be the lowest, and the height of each second supporting stack DS2 may gradually increase as from the second supporting stack DS2 to the sixth supporting stack DS6. The second to sixth dummy gate pad stacks DP2 to DP6 and the second to sixth supporting stacks DS2 to DS6 may extend vertically in the second direction Z.

The first to sixth gate electrode stacks GS1 to GS6 positioned in the cell region CR may be stacked in the second direction Z.

Figure 1D:
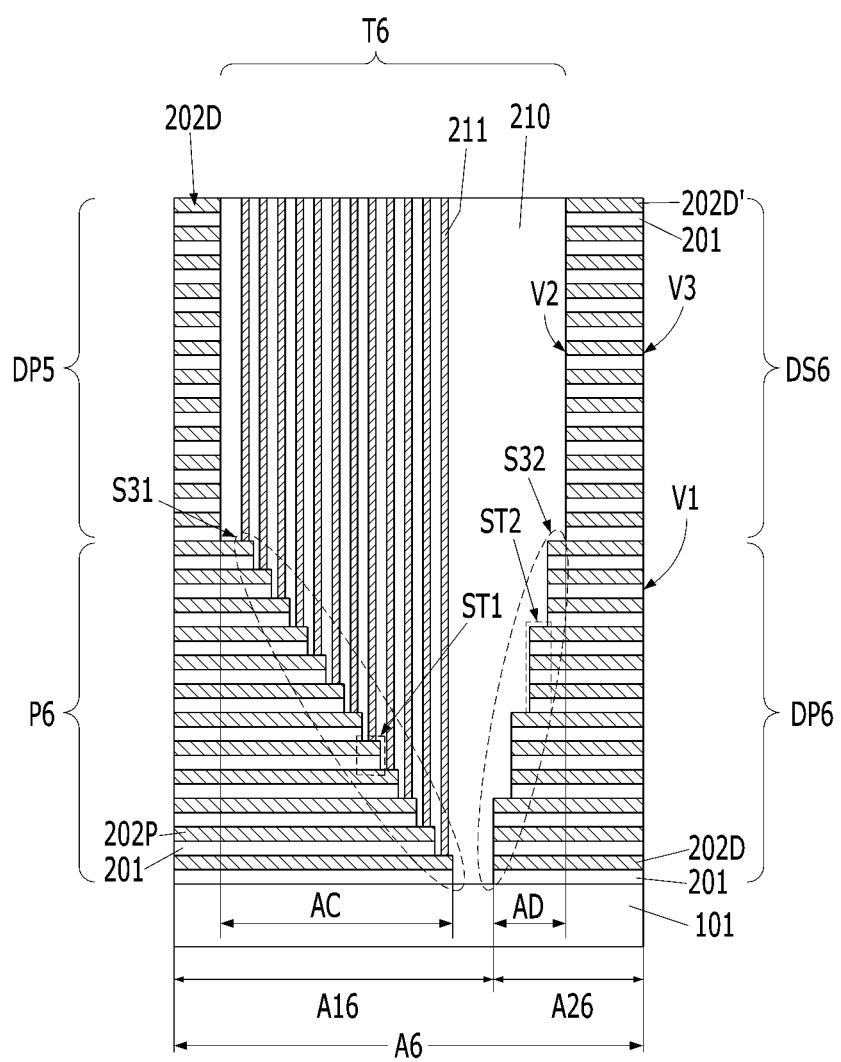
FIG. 1D is an enlarged detail view of a sixth area A6.
Figure 1E:
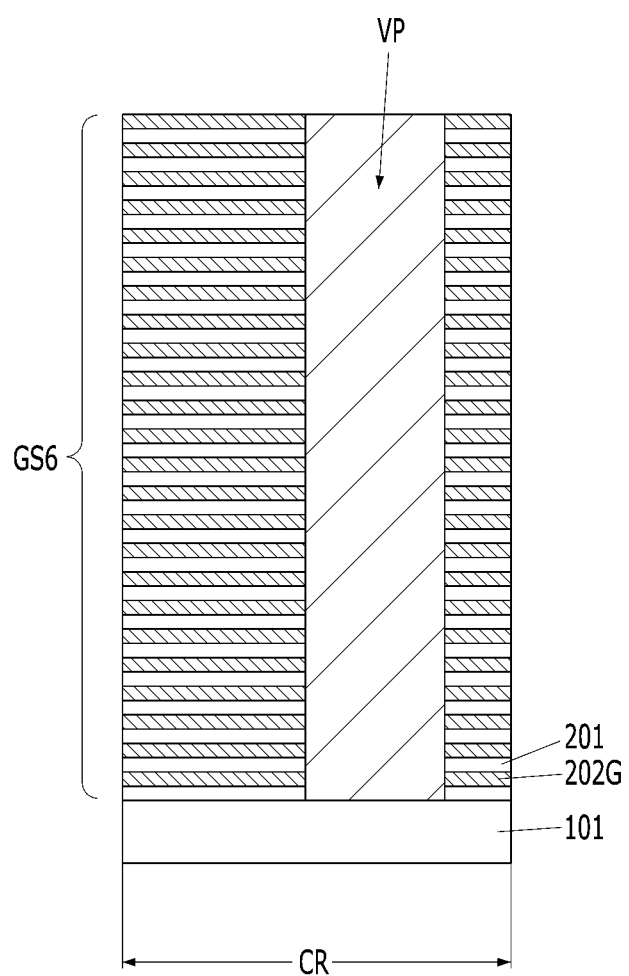
FIG. 1E is an enlarged detail view of a cell region CR extended to the sixth area A6.

FIG. 1D is an enlarged detail view of the sixth area A6. FIG. 1E is an enlarged detail view of the cell region CR extended to the sixth region A6.

Referring to FIGS. 1D and 1E, the sixth area A6 extending from the cell region CR may include the sixth gate pad stack P6, the sixth dummy gate pad stack DP6, and the sixth supporting stack DS6. The fifth dummy gate pad stack (DP5) may be positioned over the sixth gate pad stack P6. The sixth gate pad stack P6 and the fifth dummy gate pad stack DP6 may be divided by an asymmetric stepped trench T6. The asymmetric stepped trench T6 may include a first stepped sidewall S31 and a second stepped sidewall S32, where the first stepped sidewall S31 and the second stepped sidewall S32 may face each other. The sixth gate pad stack P6 may extend in the first direction X from the sixth gate electrode stack GS6 of the cell region CR. Another sidewall of the sixth dummy gate pad stack DP6 may have a vertical sidewall V1. Opposing sidewalls of the sixth supporting stack DS6 may be vertical sidewalls V2 and V3.

The sixth gate electrode stack GS6 may include gate electrodes 202G and dielectric layers 201, and the sixth gate pad stack DP6 may include gate pads 202P and dielectric layers 201. The sixth dummy gate pad stack DP6 may include dummy gate pads 202D and the dielectric layers 201, and the sixth supporting stack DS6 may include dummy pads 202D' and the dielectric layers 201. The gate electrodes 202G, the gate pads 202P, the dummy gate pads 202D, and the dummy pads 202D' may be made of the same conductive material. The dielectric layers 201 may be made of a dielectric material, such as silicon oxide.

In the sixth gate pad stack P6, the first stepped sidewall S31 may be formed by grouping a dielectric layer 201 and a gate pad 202P as a pair. The sixth gate pad stack P6 may be formed by alternately stacking a dielectric layer 201 and a gate pad 202P. In other words, the sixth gate pad stack P6 comprises a plurality of stacked pairs of dielectric layers 201 and gate pads 202P. For example, the sixth gate pad stack P6 may include 12 layers of the dielectric layers 201 and 12 layers of the gate pads 202P, individually. In other words, the sixth gate pad stack P6 may include a stack of 12 pairs of 'a dielectric layer 201 and a gate pad 202P'. Similarly to the sixth gate pad stack P6, the first to fifth gate pad stacks P1 to P5 may also be formed by alternately stacking the pairs of a dielectric layer 201 and a gate pad 202P.

In the sixth dummy gate pad stack DP6, the second stepped sidewall S32 may be formed by grouping a dielectric layer 201 and a dummy gate pad 202D as one pair. The sixth dummy gate pad stack DP6 may be formed by alternately stacking pairs of a dielectric layer 201 and a dummy gate pad 202D. For example, the sixth dummy gate pad stack DP6 may include 12 layers of the dielectric layers 201 and 12 layers of the dummy gate pads 202D. In other words, the sixth dummy gate pad stack DP6 may include a stack of 12 pairs of 'a dielectric layer 201 and a dummy gate pad 202D'. Similar to the sixth dummy gate pad stack DP6, the first to fifth dummy gate pad stacks DP1 to DP5 may also be formed by stacking the pairs of a dielectric layer 201 and a dummy gate pad 202D.

The first stepped sidewall S31 may include a plurality of first steps ST1 that ascend from the trench to the sidewall S31, and the second stepped sidewall S32 may include a plurality of second steps ST2 that ascended from the trench to the sidewall S32. The first steps ST1 may be shorter in height than the second steps ST2. As a result, the first stepped sidewall S31 and the second stepped sidewall S32 may be asymmetric, and the second stepped sidewall S32 may occupy less area (AD<AC) than the first stepped sidewall S31.

The first to sixth gate electrode stacks GS1 to GS6 may have an alternating stack structure in which the dielectric layers 201 and the gate electrodes 202G are alternately stacked. The first to sixth gate pad stacks P1 to P6 may have an alternating stack structure in which the dielectric layers 201 and the gate pads 202P are alternately stacked. The second to sixth supporting stacks DS2 to DS6 may have an alternating stack structure in which the dielectric layers 201 and the dummy pads 202D' are alternately stacked. The first to sixth dummy gate pad stacks DP1 to DP6 may have an alternating stack structure in which the dielectric layers 201 and the dummy gate pads 202D are alternately stacked. The same conductive layers may extend through the gate electrodes 202G, the gate pads 202P, the dummy gate pads 202D, and the dummy pads 202D'. The dummy gate pads 202D of the first to sixth dummy gate pad stacks DP1 to DP6 and the dummy pads 202D' of the second to sixth supporting stacks DS2 to DS6 may be referred to as a 'dummy conductive layer'. The gate electrodes 202G, the gate pads 202P, the dummy gate pads 202D, and the dummy pads 202D' may include a metal-based material. Herein, the metal-based material may include tungsten, titanium nitride, or a combination thereof. The first to sixth gate electrode stacks GS1 to GS6, the first to sixth gate pad stacks P1 to P6, the first to sixth dummy gate pad stacks DP1 to DP6, and the second to sixth supporting stacks GS2 to GS6 may have the same thickness.

According to another embodiment of the present disclosure, the first gate electrode stack GS1 may be referred to as a 'select gate electrode stack', and the second to sixth gate electrode stacks GS2 to GS6 may be referred to as 'word line stacks'. The first gate pad stack P1 may be referred to as a 'select gate pad stack', and the second to sixth gate pad stacks P2 to P6 may be referred to as 'word line pad stacks'.

The first to sixth gate pad stacks P1 to P6 and the first to sixth dummy gate pad stacks DP1 to DP6 may be isolated by the stepped trenches T1 to T6. The first gate pad stack P1 and the first dummy gate pad stack DP1 may be isolated by the symmetric stepped trench T1. The second to sixth gate pad stacks P2 to P6 and the second to sixth dummy gate pad stacks DP2 to DP6 may be isolated by the asymmetric stepped trenches T2 to T6.

The first gate pad stack P1 and the first dummy gate pad stack DP1 may be divided by the symmetric stepped trench T1. An edge of the first gate pad stack P1 may include a first stepped sidewall S1 which includes the gate pads 202P and the dielectric layers 201. An edge of the first dummy gate pad stack DP1 may include a second stepped sidewall S2 which includes the dummy gate pads 202D and the dielectric layers 201. The symmetric stepped trenches T1 may have two sidewalls facing each other, and the two sidewalls may correspond to the first stepped sidewall S1 and the second stepped sidewall S2, respectively. The first stepped sidewall S1 and the second stepped sidewall S2 may be symmetrical to each other. Another edge of the first dummy gate pad stack DP1 may have a vertical sidewall V1. The vertical sidewall V1 may be different from the first and second stepped sidewalls S1 and S2. Both sidewalls of the first dummy gate pad stack DP1 may be an asymmetric structure having the second stepped sidewall S2 and the vertical sidewall V1. The vertical sidewall V1 of the first dummy gate pad stack DP1 may end at the top gate pad 202P of the second gate pad stack P2. The vertical sidewall V1 of the first dummy gate pad stack DP1 may be shifted in the first direction X from the top gate pad 202P of the second gate pad stack P2 to the cell region CR. The vertical sidewall V1 of the first dummy gate pad stack DP1 and the top gate pad 202P of the second gate pad stack P2 may not be self-aligned.

The second gate pad stack P2 and the second dummy gate pad stack DP2 may be divided by the asymmetric stepped trench T2. An edge of the second gate pad stack P2 may include the first stepped sidewall S31 which includes the gate pads 202P and the dielectric layers 201. An edge of the second dummy gate pad stack DP2 may include the second stepped sidewall S32 which includes the dummy gate pads 202D and the dielectric layers 201. The asymmetric stepped trenches T2 may have two sidewalls facing each other, and the two sidewalls may correspond to the first stepped sidewall S31 and the second stepped sidewall S32, respectively. The first stepped sidewall S31 and the second stepped sidewall S32 may be asymmetrical to each other. Like the vertical sidewall V1 of the first dummy gate pad stack DP1, another edge of the second dummy gate pad stack DP2 may have a vertical sidewall (given with no reference numeral). The vertical sidewall of the second dummy gate pad stack DP2 may end at the top gate pad 202P of the third gate pad stack P3. The vertical sidewall of the second dummy gate pad stack DP2 may be shifted in the first direction X from the top gate pad 202P of the third gate pad stack P3 to the cell region CR. The vertical sidewall of the second dummy gate pad stack DP2 and the top gate pad 202P of the third gate pad stack P3 may not be self-aligned. The second supporting stack DS2 may be formed over the second dummy gate pad stack DP2, and both sidewalls of the second supporting stack DS2 may be the vertical sidewalls V2 and V3.

The third gate pad stack P3 and the third dummy gate pad stack DP3 may be divided by the asymmetric stepped trench T3. An edge of the third gate pad stack P3 may include the first stepped sidewall S31 which includes the gate pads 202P and the dielectric layers 201. An edge of the third dummy gate pad stack DP3 may include the second stepped sidewall S32 which includes the dummy gate pads 202D and the dielectric layers 201. The asymmetric stepped trenches T3 may have two sidewalls facing each other, and the two sidewalls may correspond to the first stepped sidewall S31 and the second stepped sidewall S32, respectively. The first stepped sidewall S31 and the second stepped sidewall S32 may be asymmetrical to each other. Like the vertical sidewall V1 of the first dummy gate pad stack DP1, another edge of the third dummy gate pad stack DP3 may have a vertical sidewall. The vertical sidewall of the third dummy gate pad stack DP3 may end at the top gate pad 202P of the fourth gate pad stack P4. The vertical sidewall of the third dummy gate pad stack DP3 may be shifted in the first direction X from the top gate pad 202P of the fourth gate pad stack P4 to the cell region CR. The vertical sidewall of the third dummy gate pad stack DP3 and the top gate pad 202P of the fourth gate pad stack P4 may not be self-aligned. The third supporting stack DS3 may be formed over the third dummy gate pad stack DP3. Like the second supporting stack DS2, both sidewalls of the third supporting stack DS3 may be vertical sidewalls.

The fourth gate pad stack P4 and the fourth dummy gate pad stack DP4 may be divided by the asymmetric stepped trench T4. An edge of the fourth gate pad stack P4 may include the first stepped sidewall S31 which includes the gate pads 202P and the dielectric layers 201. An edge of the fourth dummy gate pad stack DP4 may include the second stepped sidewall S32 which includes the dummy gate pads 202D and the dielectric layers 201. The asymmetric stepped trenches T4 may have two sidewalls facing each other, and the two sidewalls may correspond to the first stepped sidewall S31 and the second stepped sidewall S32, respectively. The first stepped sidewall S31 and the second stepped sidewall S32 may be asymmetrical to each other. Like the vertical sidewall V1 of the first dummy gate pad stack DP1, another edge of the fourth dummy gate pad stack DP4 may have a vertical sidewall. The vertical sidewall of the fourth dummy gate pad stack DP4 may end at the top gate pad 202P of the fifth gate pad stack P5. The vertical sidewall of the fifth dummy gate pad stack DP4 may be shifted in the first direction X from the top gate pad 202P of the fifth gate pad stack P5 to the cell region CR. The vertical sidewall of the fourth dummy gate pad stack DP4 and the top gate pad 202P of the fifth gate pad stack P5 may not be self-aligned. The fourth supporting stack DS4 may be formed over the fourth dummy gate pad stack DP4. Like the second supporting stack DS2, both sidewalls of the fourth supporting stack DS4 may be vertical sidewalls.

The fifth gate pad stack P5 and the fifth dummy gate pad stack DP5 may be divided by the asymmetric stepped trench T5. An edge of the fifth gate pad stack P5 may include the first stepped sidewall S31 which includes the gate pads 202P and the dielectric layers 201. An edge of the fifth dummy gate pad stack DP5 may include the second stepped sidewall S32 which includes the dummy gate pads 202D and the dielectric layers 201. The asymmetric stepped trenches T5 may have two sidewalls facing each other, and the two sidewalls may correspond to the first stepped sidewall S31 and the second stepped sidewall S32, respectively. The first stepped sidewall S31 and the second stepped sidewall S32 may be asymmetrical to each other. Like the vertical sidewall V1 of the first dummy gate pad stack DP1, another edge of the fifth dummy gate pad stack DP5 may have a vertical sidewall. The vertical sidewall of the fifth dummy gate pad stack DP5 may end at the top gate pad 202P of the sixth gate pad stack P6. The vertical sidewall of the fifth dummy gate pad stack DP5 may be shifted in the first direction X from the top gate pad 202P of the sixth gate pad stack P6 to the cell region CR. The vertical sidewall of the fifth dummy gate pad stack DP5 and the top gate pad 202P of the sixth gate pad stack P6 may not be self-aligned. The fifth supporting stack DS5 may be formed over the fifth dummy gate pad stack DP5, and the fifth supporting stack DS5 may include the vertical sidewalls.

The sixth gate pad stack P6 and the sixth dummy gate pad stack DP6 may be divided by the asymmetric stepped trench T6. An edge of the sixth gate pad stack P6 may include the first stepped sidewall S31 which includes the gate pads 202P and the dielectric layers 201. An edge of the sixth dummy gate pad stack DP6 may include the second stepped sidewall S32 which includes the dummy gate pads 202D and the dielectric layers 201. The asymmetric stepped trenches T6 may have two sidewalls facing each other, and the two sidewalls may correspond to the first stepped sidewall S31 and the second stepped sidewall S32, respectively. The first stepped sidewall S31 and the second stepped sidewall S32 may be asymmetrical to each other. Like the vertical sidewall V1 of the first dummy gate pad stack DP1, another edge of the sixth dummy gate pad stack DP6 may have a vertical sidewall. The sixth supporting stack DS6 may be formed over the sixth dummy gate pad stack DP6, and the sixth supporting stack DS6 may include the vertical sidewalls.

As described above, the asymmetric stepped trenches T2 to T6 may include the first stepped sidewall S31 and the second stepped sidewall S32. The first stepped sidewall S31 and the second stepped sidewall S32 may be opposite to each other and may have different slopes. For example, the first stepped sidewall S31 may have a tilt whose angle is greater than that of the second stepped sidewall S32. Thus, the first stepped sidewall S31 and the second stepped sidewall S32 may be asymmetric. The area AD occupied by the second stepped sidewall S32 may be larger than the area AC occupied by the first stepped sidewall S31.

The first stepped sidewall S31 and the second stepped sidewall S32 may have the same shape in each of the asymmetric stepped trenches T2 to T6. Also, the first stepped sidewall S31 and the second stepped sidewall S32 may have the same depth in each of the asymmetric stepped trenches T2 to T6.

The second to sixth gate pad stacks P2 to P6 may have the same height in the second to sixth areas A2 to A6. The second to sixth dummy gate pad stacks DP2 to DP6 may have the same height in the second to sixth arrays A2 to A6. The second to sixth supporting stacks DS2 to DS6 may have different heights in the second to sixth areas A2 to A6. For example, the second supporting stack DS2 may be the lowest in height, and the sixth supporting stack DS6 may be the highest in height.

Both sidewalls of the second to sixth supporting stacks DS2 to DS6 may include the vertical sidewalls V2 and V3, and the vertical sidewalls V2 and V3 may extend vertically from the second stepped sidewall S32 and the vertical sidewall V1. The fourth to sixth supporting stacks DS4 to DS6 that are formed in the fourth to sixth areas A4 to A6 among the second to sixth supporting stacks DS2 to DS6 may have a structure in which a plurality of supporting stacks are stacked.

Interlayer dielectric layers 210 may be formed in the stepped trenches T1 to T6. The contact plugs 211 may penetrate through the interlayer dielectric layers 210. The contact plugs 211 may be coupled to the first to sixth gate pad stacks P1 to P6, individually. The contact plugs 211 may be coupled to the respective gate pads 202P through the interlayer dielectric layers 210. The contact plugs 211 may not be coupled to the dummy gate pad 202D and the dummy pad 202D'.

FIGS. 2A to 2G are cross-sectional views illustrating a method for fabricating a vertical semiconductor device in accordance with an embodiment of the present disclosure. FIGS. 2A to 2G are cross-sectional views taken along a line C-C' of FIG. 1A for illustrating an example of a vertical semiconductor device fabrication method.

Figure 2A:
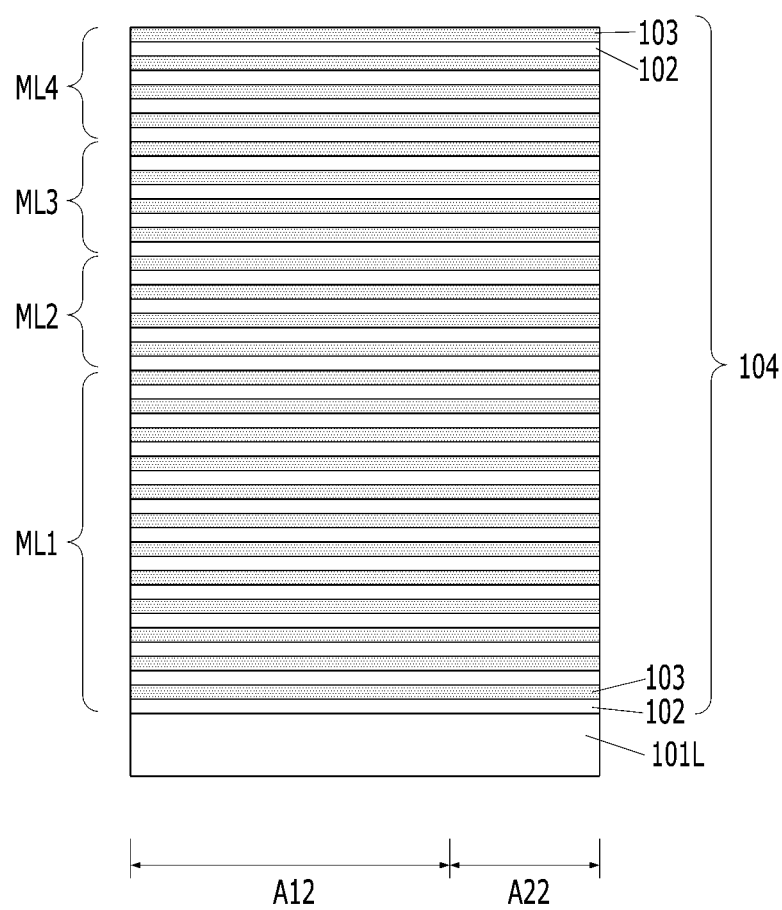
FIGS. 2A to 2G are cross-sectional views illustrating a method for fabricating a vertical semiconductor device in accordance with an embodiment of the present disclosure.

Referring to FIG. 2A, a multi-layered stack structure 104 may be formed over a lower structure 101L. The multi-layered stack structure 104 may include a plurality of first layers 102 and a plurality of second layers 103 that are alternately stacked. The lowermost layer of the multi-layered stack structure 104 may be a first layer 102, and the uppermost layer of the multi-layered stack structure 104 may be a second layer 103. The second layer 103 may be formed of a material different from that of the first layer 102. The first layer 102 may include a dielectric material, and the second layer 103 may be formed of a sacrificial material. The sacrificial material may be formed of a material having an etch selectivity to the first layer 102. The first layer 102 may be formed of silicon oxide, and the second layer 103 may be formed of silicon nitride.

According to another embodiment of the present disclosure, the first layers 102 may include a dielectric material, and the second layers 103 may include a conductive material. According to another embodiment of the present disclosure, both of the first layers 102 and the second layers 103 may be formed of a silicon-containing material. For example, the first layers 102 may be formed of undoped polysilicon, and the second layers 103 may be formed of doped polysilicon. Herein, the doped polysilicon may refer to polysilicon which is doped with an impurity, such as boron, arsenic, or phosphorous, and the undoped polysilicon may refer to polysilicon which is not doped with any impurity.

According to an embodiment, the multi-layered stack structure 104 may include a first multi-layered stack ML1 to a fourth multi-layered stack ML4. The first multi-layered stack ML1 to the fourth multi-layered stack ML4 may include a stack of alternating first layers 102 and the second layers 103. According to some embodiments of the present disclosure, the second multi-layered stack ML2 to the fourth multi-layered stack ML4 may include the same number of stacks of the first layers 102 and the second layers 103. The first multi-layered stack ML1 may include more stacks of the first layers 102 and the second layers 103 than the second to fourth multi-layered stacks ML2 to ML4. For example, the second multi-layered stack ML2 to the fourth multi-layered stack ML4 may be of an eight-layer structure in which the first layer 102 and the second layer 103 are stacked four times, individually, while the first multi-layered stack ML1 may be of a 24-layer structure in which the first layer 102 and the second layer 103 are stacked twelve times. In the first to fourth multi-layered stacks ML1 to ML4, the number of stacks of the first layer 102 and the second layer 103 may differ in various embodiments.

The lower structure 101L may include a substrate and a lower alternating stack disposed over the substrate, and the lower alternating stack may include the alternating stack of the first layers 102 and the second layers 103 similarly to the multi-layered stack structure 104. The lower structure 101L may be formed in a pad area A12 and a dummy pad area A22.

Accordingly, the pad area A12 and the dummy pad area A22 may include the lower structure 101L and the multi-layered stack structure 104 over the lower structure 101L.

Figure 2B:
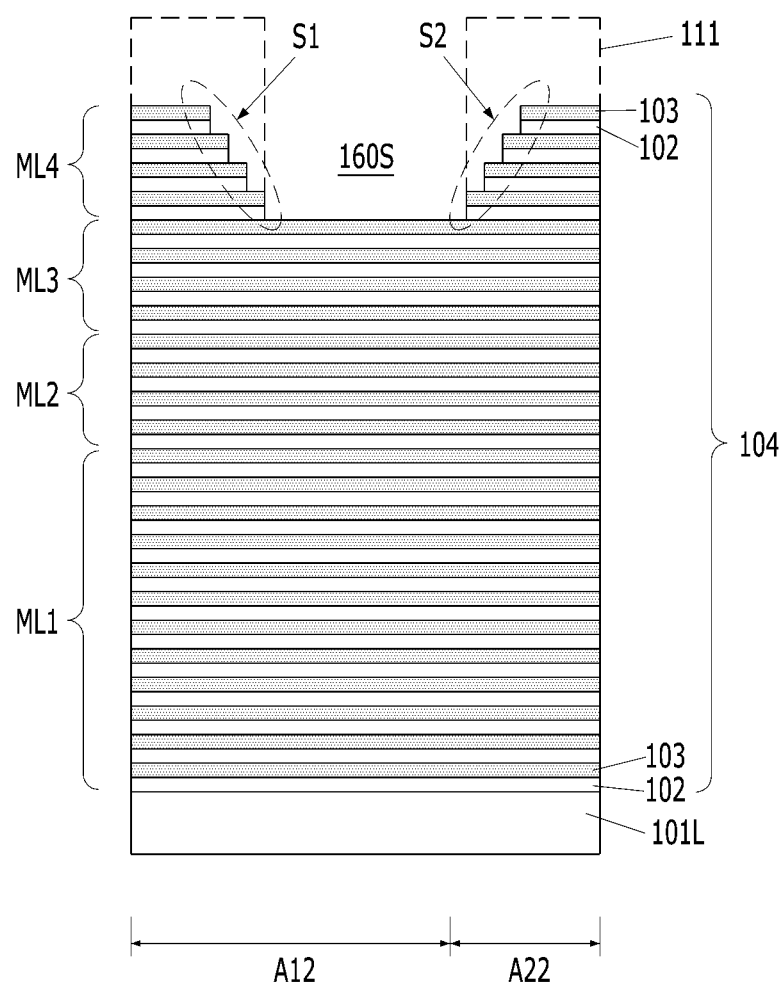

Referring to FIG. 2B, a symmetric stepped trench 160S may be formed. The symmetric stepped trench 160S may include a first stepped sidewall S1 and a second stepped sidewall S2. The first stepped sidewall S1 and the second stepped sidewall S2 may be symmetrical to each other.

The process for forming the symmetric stepped trench 160S may be performed through a plurality of etch processes and a plurality of slimming processes. For example, the process for forming the symmetric stepped trench 160S may include an etch process of etching the fourth multi-layered stack ML4 by using a first mask 111 and the slimming process of slimming the first mask 111.

The method of forming the symmetric stepped trenches 160S will be described with reference to FIGS. 3A to 3F. FIGS. 3A to 3F show a process of forming pairs of a first layer 102 and a second layer 103 that are included in the fourth multi-layered stack ML4 of the multi-layered stack structure 104 in the pad area A12 by using the first mask 111. In an embodiment, four steps are formed by the step forming process using one first mask 111, but other embodiments are possible. Hereinafter, first to fourth patterns 121 to 124 may be named according to the etched order, and each of the first to fourth dummy patterns 141 to 144 may be formed of a pair of a first layer 102 and a second layer 103, and the first to fourth dummy patterns 141 to 144 may form steps.

Meanwhile, while the first to fourth patterns 121 to 124 are formed, the first to fourth dummy patterns 141 to 144 may be formed. The first to fourth dummy patterns 141 to 144 may be formed in the dummy pad area A22. Each of the first to fourth dummy patterns 141 to 144 may be formed of a pair of a first layer 102 and a second layer 103, and the first to fourth dummy patterns 141 to 144 may form steps.

Figure 3A:
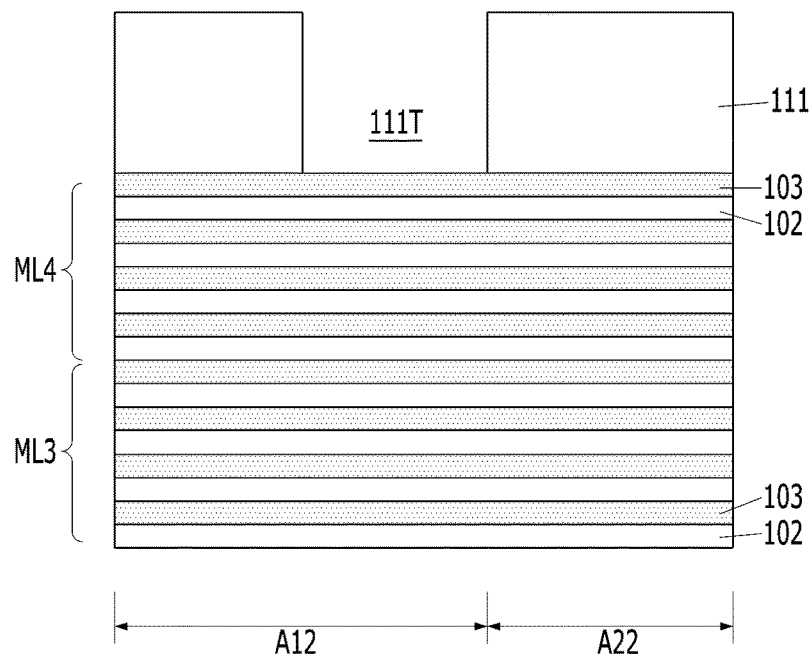
FIGS. 3A to 3F are cross-sectional views illustrating a method of forming a symmetric stepped trench 160S shown in FIG. 2B.

Referring to FIG. 3A, the first mask 111 may be formed over the fourth multi-layered stack ML4 of the multi-layered stack structure 104. The first mask 111 may include a photoresist pattern. The first mask 111 may include a first opening 111T. The first opening 111T may have a form of a trench extended in one direction (e.g. the Y direction in FIG. 1A). The first opening 111T may partially expose the upper surface of the fourth multi-layered stack ML4.

Figure 3B:
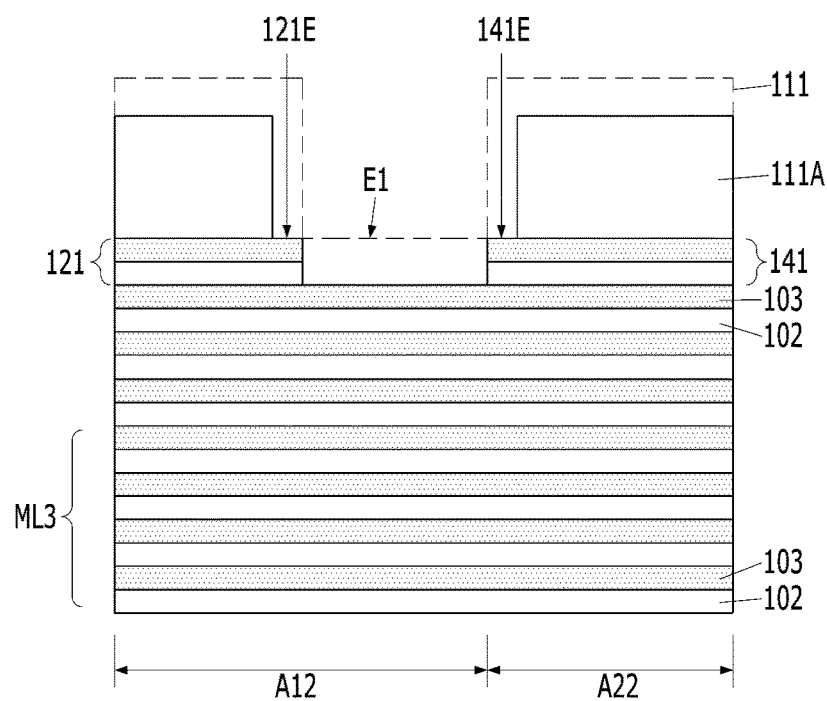

Referring to FIG. 3B, a first patterning process may be performed. The first patterning process may include a first etch process and a first slimming process that are sequentially performed. The first etch process may etch the uppermost pair of the second layer 103 and the first layer 102 of the fourth multi-layered stack ML4 by using the first mask 111 as an etch barrier. The first slimming process may refer to a process in which the top and sides of the first mask 111 are etched to have a reduced volume after the first etch process. As a result of the first slimming process, a first mask 111A having the reduced volume may be formed.

A portion of the fourth multi-layered stack ML4 may be etched by the first etch process. As a result, the first pattern 121 and the first dummy pattern 141 may be formed. The first pattern 121 and the first dummy pattern 141 may be divided by a first etched portion E1. The first etched portion E1 may be a portion from which the first layer 102 and the second layer 103 are etched and removed. The first pattern 121 and the first dummy pattern 141 may be a pattern which is formed of a stack of a first layer 102 and a second layer 103 (i.e., a pair of a first layer 102 and a second layer 103).

The first pattern 121 may be formed in the pad area A12, and the first dummy pattern 141 may be formed in the dummy pad area A22. The first etched portion E1 may have a form of a trench extended in a predetermined direction.

The first mask 111A formed by the first slimming process may have an opening which is wider than the first opening 111T, and the widened opening may expose an edge 121E of the first pattern 121 and an edge 141E of the first dummy pattern 141. The exposed area of the edge 121E of the first pattern 121 and the exposed area of the edge 141E of the first dummy pattern 141 may be the same. The exposed edge 121E of the first pattern 121 and the exposed edge 141E of the first dummy pattern 141 may be the edges of the second layer 103, which is part of the first pattern 121 and the first dummy pattern 141.

Figure 3C:
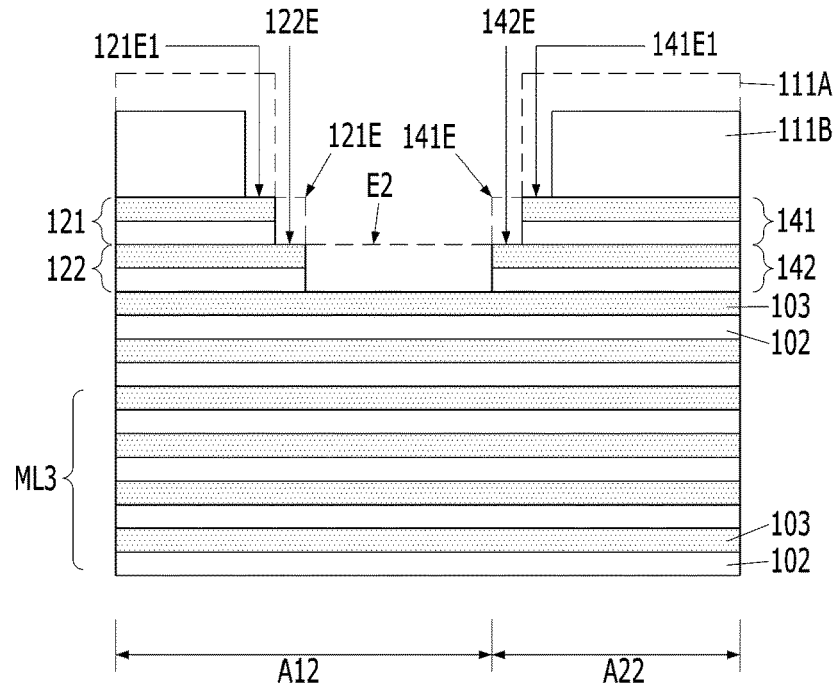

Referring to FIG. 3C, a second patterning process may be performed. The second patterning process may include a second etch process and a second slimming process that are sequentially performed. The second etch process may etch the second layer 103 and the first layer 102 below the first pattern 121 and the first dummy pattern 141 by using the first mask 111A as an etch barrier. The second slimming process may refer to a process in which the top and sides of the first mask 111A are etched to have a reduced volume after the second etch process. As a result of the second slimming process, a first mask 111B having the reduced volume may be formed.

The second pattern 122 and the second dummy pattern 142 may be formed by the second etch process. The second pattern 122 and the second dummy pattern 142 may be divided by a second etched portion E2. The second etched portion E2 may be a portion from which the first layer 102 and the second layer 103 are etched and removed. The second pattern 122 and the second dummy pattern 142 may be a pattern formed of a stack of a first layer 102 and a second layer 103. The second pattern 122 may be formed in the pad area A12, and the second dummy pattern 142 may be formed in the dummy pad area A22. The second etched portion E2 may have a form of a trench extended in a predetermined direction.

The edge 121E of the first pattern 121 and the edge 141E of the first dummy pattern 141 exposed through the first mask 111A may be etched by the second etch process.

The first mask 111B formed by the second slimming process may have an opening which is wider than the first mask 111A, and the widened opening may expose an edge 122E of the second pattern 122 and an edge 142E of the second dummy pattern 142. The exposed area of the edge 122E of the second pattern 122 and the exposed area of the edge 142E of the second dummy pattern 142 may be the same. The opening of the first mask 111B may further expose an edge 121E1 of the first pattern 121 and an edge 141E1 of the first dummy pattern 141. The exposed edge 122E of the second pattern 122 and the exposed edge 142E of the second dummy pattern 142 may be the edges of the second layer 103, which is part of the second pattern 122 and the second dummy pattern 142. The exposed edge 121E of the first pattern 121 and the exposed edge 141E of the first dummy pattern 141 may be the edges of the second layer 103, which is part of the first pattern 121 and the first dummy pattern 141.

Figure 3D:
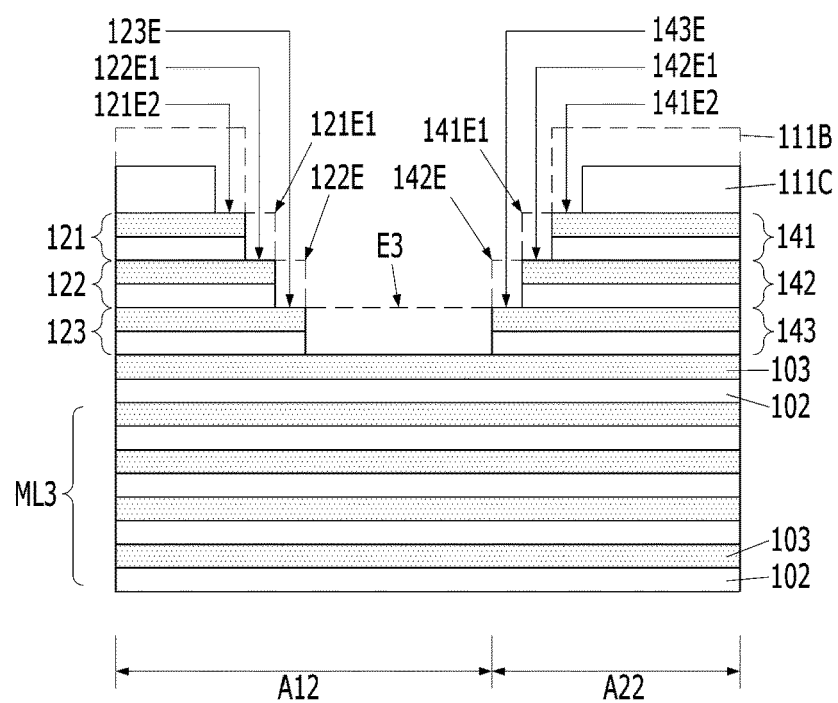

Referring to FIG. 3D, a third patterning process may be performed. The third patterning process may include a third etch process and a third slimming process that are sequentially performed. The third etch process may etch the second layer 103 and the first layer 102 below the second pattern 122 and the second dummy pattern 142 by using the first mask 111B as an etch barrier. The third slimming process may refer to a process in which the top and sides of the first mask 111B are etched to have a reduced volume after the third etch process. As a result of the third slimming process, a first mask 111C having the reduced volume may be formed.

The third pattern 123 and the third dummy pattern 143 may be formed by the third etch process. The third pattern 123 and the third dummy pattern 143 may be divided by a third etched portion E3. The third etched portion E3 may be a portion from which the first layer 102 and the second layer 103 are etched and removed. The third pattern 123 and the third dummy pattern 143 may be a pattern formed of a stack of a first layer 102 and a second layer 103. The third pattern 123 may be formed in the pad area A12, and the third dummy pattern 143 may be formed in the dummy pad area A22. The third etched portion E3 may have a form of a trench extended in a predetermined direction.

The edge 122E of the second pattern 122 and the edge 142E of the second dummy pattern 142 exposed through the first mask 111B may be etched by the third etch process. Also, the edge 121E1 of the first pattern 121 and the edge 141E1 of the first dummy pattern 141 may be etched by the third etch process.

The first mask 111C formed by the third slimming process may have an opening which is wider than the first mask 111B, and the widened opening may expose an edge 123E of the third pattern 123 and an edge 143E of the third dummy pattern 143. The exposed area of the edge 123E of the third pattern 123 and the exposed area of the edge 143E of the third dummy pattern 143 may be the same. The widened opening of the first mask 111C may further expose an edge 121E2 of the first pattern 121 and an edge 141E2 of the first dummy pattern 141. The widened opening of the first mask 111C may further expose an edge 122E1 of the second pattern 122 and an edge 142E1 of the second dummy pattern 142. The exposed edges 123E, 143E, 121E2, 141E2, 122E1 and 142E1 may be the edges of the second layer 103.

Figure 3E:
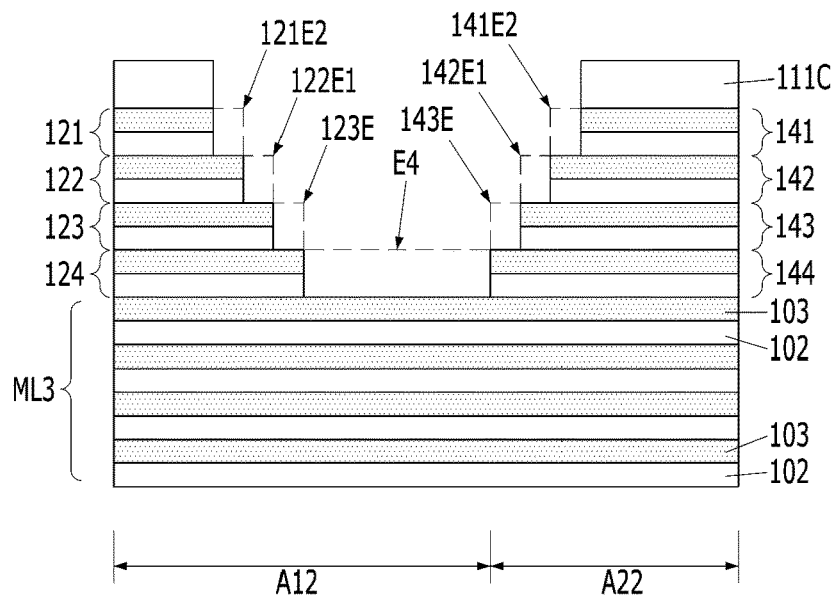

Referring to FIG. 3E, a fourth patterning process may be performed. The fourth patterning process may include a fourth etch process. The fourth etch process may etch the second layer 103 and the first layer 102 below the third pattern 123 and the third dummy pattern 143 by using the first mask 111C as an etch barrier. The fourth patterning process may not include a slimming process after the fourth etch process.

The fourth pattern 124 and the fourth dummy pattern 144 may be formed by the fourth etch process. The fourth pattern 124 and the fourth dummy pattern 144 may be divided by a fourth etched portion E4. The fourth etched portion E4 may be a portion from which the first layer 102 and the second layer 103 are etched and removed. The fourth pattern 124 and the fourth dummy pattern 144 may be a pattern formed of a stack of a first layer 102 and a second layer 103. The fourth pattern 124 may be formed in the pad area A12, and the fourth dummy pattern 144 may be formed in the dummy pad area A22. The fourth etched portion E4 may have a form of a trench extended in a predetermined direction.

The edge 123E of the third pattern 123 and the edge 143E of the third dummy pattern 143 exposed through the first mask 111C may be etched by the fourth etch process. Also, the edge 122E1 of the second pattern 122 and the edge 142E1 of the second dummy pattern 142 may be etched by the fourth etch process. Also, the edge 121E2 of the first pattern 121 and the edge 141E2 of the first dummy pattern 141 may be etched by the fourth etch process.

Figure 3F:
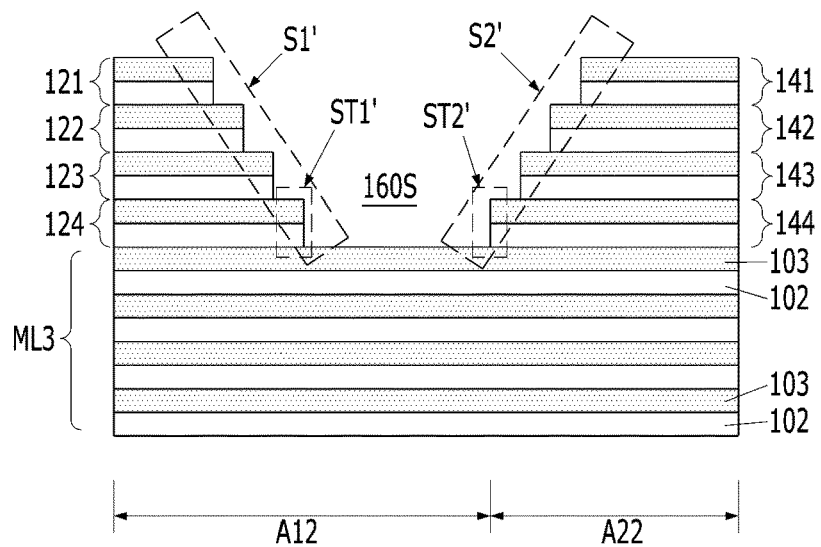

Referring to FIG. 3F, the first mask 111C may be removed.

Referring to FIG. 3A to 3F, the first to fourth patterns 121 to 124 and the first to fourth dummy patterns 141 to 144 may be formed by repeating an etch process and a slimming process. The stack of the first to fourth patterns 121 to 124 and the stack of the first to fourth dummy patterns 141 to 144 may be formed by etching the fourth multi-layered stack ML4. The stack of the first to fourth patterns 121 to 124 and the stack of the first to fourth dummy patterns 141 to 144 may be divided by the symmetric stepped trench 160S. The symmetric stepped trenches 160S may be defined by the first etched portion E1 to the fourth etched portion E4. The symmetric stepped trench 160S may have a tapered-trench shape with a width reducing in a depth direction.

The symmetric stepped trenches 160S may include a first stepped sidewall S1' and a second stepped sidewall S2'. The first stepped sidewall S1' may be formed in the pad area A12, and the second stepped sidewall S2' may be formed in the dummy pad area A22. The first stepped sidewall S1' and the second stepped sidewall S2' may face each other. The first stepped sidewall S1' may include a plurality of first steps ST1' and the second stepped sidewall S2' may include a plurality of second steps ST2'. The first stepped sidewall S1' and the second stepped sidewall S2' may have the same number of steps. For example, the first stepped sidewall S1' may include four first steps ST1' and the second stepped sidewall S2' may include four second steps ST2'. The first steps ST1' and the second steps ST2' may have the same shape, the same size, and the same height. The first steps ST1' and the second steps ST2' may each include a pair of a first layer 102 and a second layer 103. The first steps ST1' may be arranged to descend from the first pattern 121 to the fourth pattern 124 towards the base of the trench 160S. The second steps ST2' may be formed to ascend from the base of the trench 160S from the fourth dummy pattern 144 to the first dummy pattern 141. The second steps ST2' may descend from the first dummy pattern 141 to the fourth dummy pattern 144.

The first stepped sidewall S1' and the second stepped sidewall S2' may have the same height. The slopes of the first stepped sidewall S1' and the second stepped sidewall S2' may be the same. Herein, the slope may refer to the inclination of a line that runs through the upper corners of the steps. Both the first stepped sidewall S1' and the second stepped sidewall S2' may have a gradual slope. In other words, the tilts of the steps of the first steps ST1' and the second steps ST2' may be the same.

Thus, the first stepped sidewall S1' and the second stepped sidewall S2' may be symmetrical to each other.

Figure 2C:
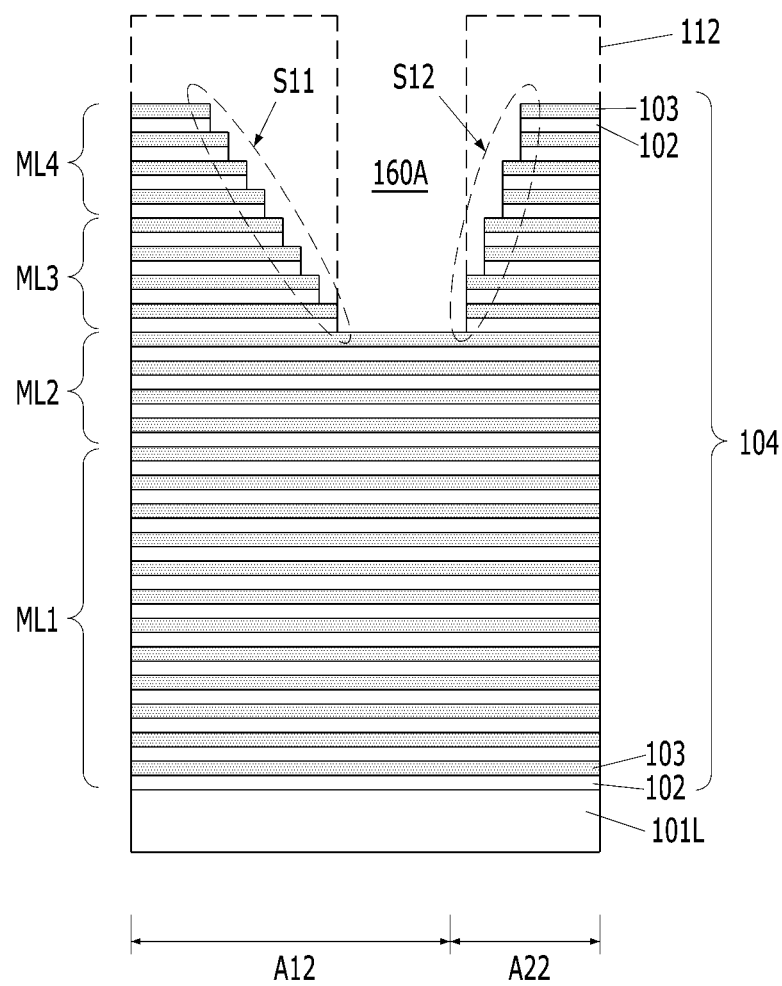

Referring to FIG. 2C, an asymmetric stepped trench 160A may be formed. The asymmetric stepped trench 160A may include a first stepped sidewall S11 and a second stepped sidewall S12. The first stepped sidewall S11 and the second stepped sidewall S12 may be asymmetrical to each other.

The process for forming the asymmetric stepped trenches 160A may be performed by performing a plurality of etch processes and a plurality of slimming processes. For example, an etch process of etching the third multi-layered stack ML3 by using the second mask 112 and a slimming process of slimming the second mask 112 may be included.

The method of forming the asymmetric stepped trenches 160A will be described with reference to FIGS. 4A to 4G. Referring to FIGS. 4A to 4G, a process of forming a pair of a first layer 102 and a second layer 103 that are included in the third multi-layered stack ML3 in steps in the pad area A12 by using the second mask 112 will be described. An embodiment in which four steps are formed by the step forming processes using one second mask 112 is described as an example. Hereafter, fifth to eighth patterns 125 to 128 are named according to the sequence in which the layers are etched, and the fifth to eighth patterns 125 to 128 each formed of steps comprising a pair of a first layer 102 and a second layer 103.

Meanwhile, while the fifth to eighth patterns 125 to 128 are formed, the first to fourth multi-layered dummy patterns D1 to D4 may be formed. The first to fourth multi-layered dummy patterns D1 to D4 may be formed in the dummy pad area A22. The first to fourth multi-layered dummy patterns D1 to D4 may be steps of two pairs of a first layer 102 and a second layer 103. In short, each of the first to fourth multi-layered dummy patterns D1 to D4 may be a stack of a first layer 102/a second layer 103/a first layer 102/a second layer 103.

Figure 4A:
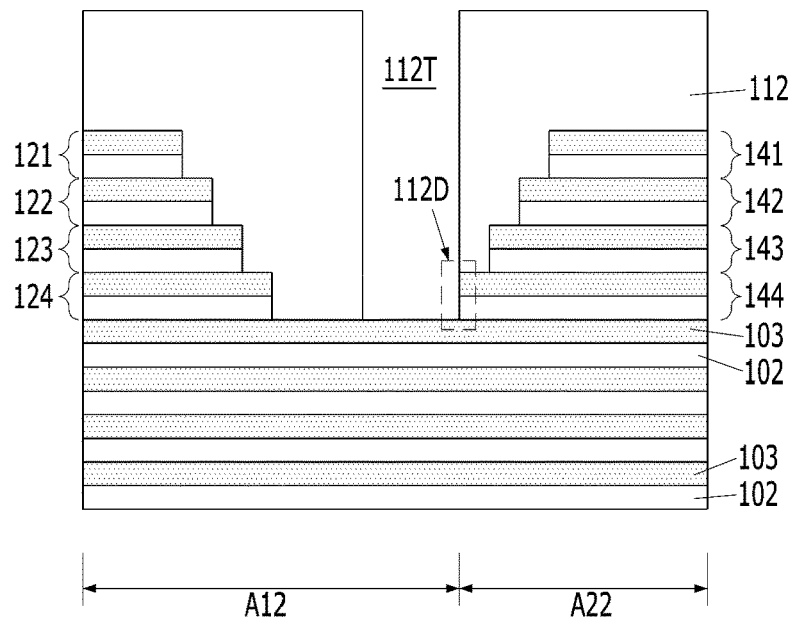
FIGS. 4A to 4G are cross-sectional views illustrating a method of forming an asymmetric stepped trench 160A shown in FIG. 2C.

Referring to FIG. 4A, the second mask 112 may be formed over the resultant structure in which the fourth pattern 124 and the fourth dummy pattern 144 are formed. The second mask 112 may include a second opening 112T. The second opening 112T may have a smaller size than the first openings (111T of FIG. 3A), and may have a smaller size than the opening defined by the first mask (111C of FIG. 3E). A first sidewall of the second opening 112T may be formed to overlap with the fourth dummy pattern 144 (see reference numeral '112D'), and a second sidewall of the second opening 112T may be spaced apart from the fourth pattern 124. For example, the first sidewall of the second opening 112T and the sidewall of the fourth dummy pattern 144 may be self-aligned, and the second sidewall of the second opening 112T may cover a sidewall of the fourth pattern 124. The second opening 112T may have a form of a trench extended in a predetermined direction. The second mask 112 may cover the sidewalls of the first to fourth patterns 121 to 124 and the sidewalls of the first to third dummy patterns 141 to 143, and the sidewall of the fourth dummy pattern 144 may be exposed. To add up, the second mask 112 may fully block the first to fourth patterns 121 to 124 and the first to third dummy patterns 141 to 143. Also, the second mask 112 may not block the exposed sidewall of the fourth dummy pattern 144 while blocking the exposed edges of the fourth dummy pattern 144.

Figure 4B:
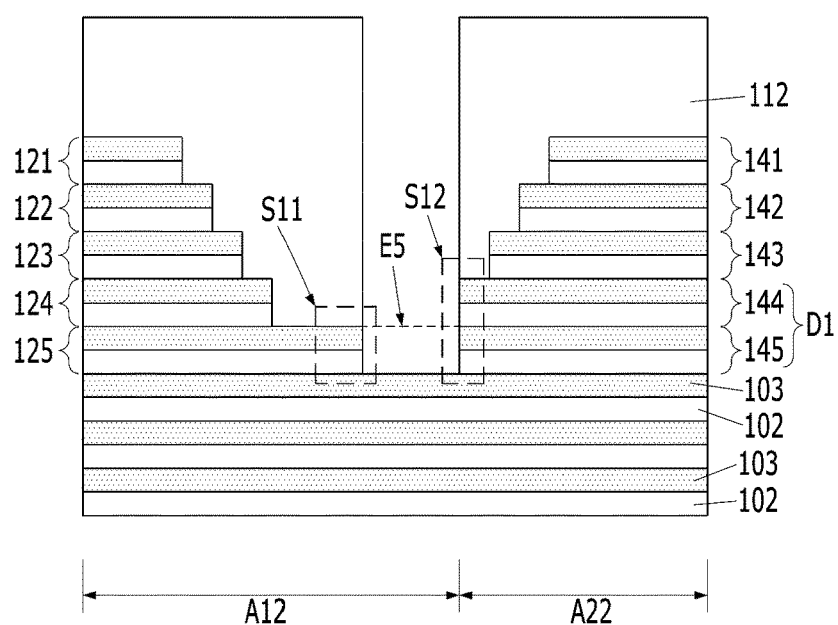
Figure 4C:
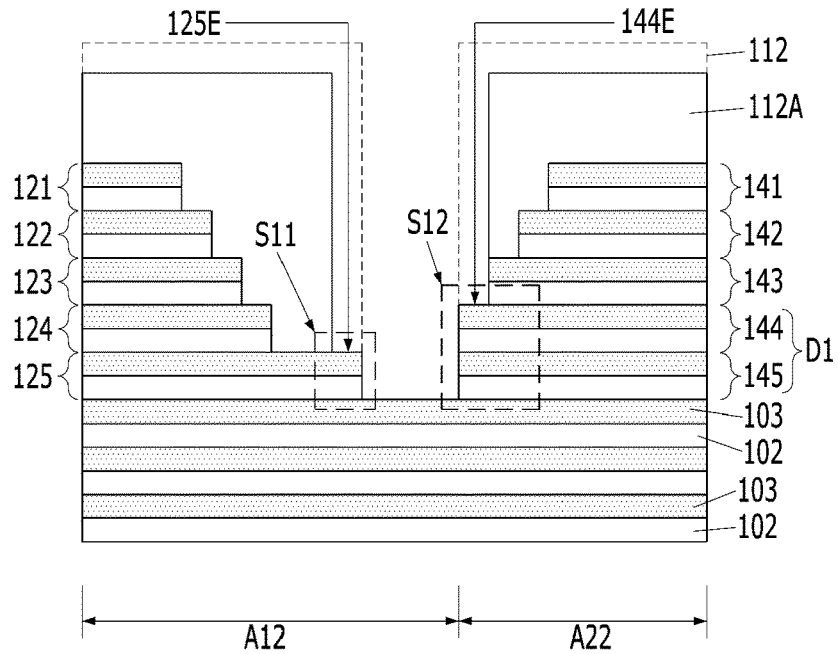

Referring to FIGS. 4B and 4C, a fifth patterning process may be performed. The fifth patterning process may include a fifth etch process and a fifth slimming process that are performed sequentially. The fifth etch process may etch the second layer 103 and the first layer 102 below the fourth pattern 124 and the fourth dummy pattern 144 by using the second mask 112 as an etch barrier. The fifth slimming process may refer to a process in which the top and sides of the second mask 112 are etched to have a reduced volume after the fifth etch process. As a result of the fifth slimming process, a second mask 112A having the reduced volume may be formed.

The fifth pattern 125 and the fifth dummy pattern 145 may be formed by the fifth etch process. The fifth pattern 125 and the fifth dummy pattern 145 may be divided by a fifth etched portion E5. The fifth etched portion E5 may be a portion where a pair of a first layer 102 and a second layer 103 are partially etched and removed, and each of the fifth pattern 125 and the fifth dummy pattern 145 may be a stack of a first layer 102 and a second layer 103. The fifth pattern 125 may be formed in the pad area A12, and the fifth dummy pattern 145 may be formed in the dummy pad area A22. The fifth etched portion E5 may have a form of a trench extended in a predetermined direction.

The second mask 112A formed by the fifth slimming process may expose an edge 125E of the fifth pattern 125 and an edge 144E of the fourth dummy pattern 144. The exposed area of the edge 125E of the fifth pattern 125 and the exposed area of the edge 144E of the fourth dummy pattern 144 may be the same. The exposed edges 125E and 144E may be the edges of the second layer 103.

A first stepped sidewall S11 and a second stepped sidewall S12 may be formed by the fifth patterning process. The first stepped sidewall S11 may be provided by the fifth pattern 125, and the second stepped sidewall S12 may be provided by a stack of the fourth dummy pattern 144 and the fifth dummy pattern 145. The fifth patterning process may define a first multi-layered dummy pattern D1 in the dummy pad area A22. The first multi-layered dummy pattern D1 may have a stack structure of the fifth dummy pattern 145 and the fourth dummy pattern 144. Since each of the fourth dummy pattern 144 and the fifth dummy pattern 145 includes a pair of a first layer 102 and a second layer 103, the first multi-layered dummy pattern D1 may be formed of two pairs of a first layer 102 and a second layer 103. In other words, the first multi-layered dummy pattern D1 may be a stack of a first layer 102/a second layer 103/a first layer 102/a second layer 103. The fifth pattern 125 may be a stack of a pair of a first layer 102/a second layer 103. The sidewall of the first multi-layered dummy pattern D1 may have a non-step profile of a vertical sidewall. The sidewall of the fourth dummy pattern 144 and the sidewall of the fifth dummy pattern 145 may be self-aligned.

As a result of the fifth patterning process, the first multi-layered dummy pattern D1 may be defined in the dummy pad area A22, while the fifth pattern 125 may be formed in the pad area A12 at the same time. The fifth pattern 125 may have a single step structure in which each step has two layers, and the first multi-layered dummy pattern D1 may have a single step structure in which each step has four layers. The height of the first multi-layered dummy pattern D1 may be higher than the height of the fifth pattern 125. Therefore, the first stepped sidewall S11 and the second stepped sidewall S12 may be asymmetric with respect to each other.

Figure 4D:
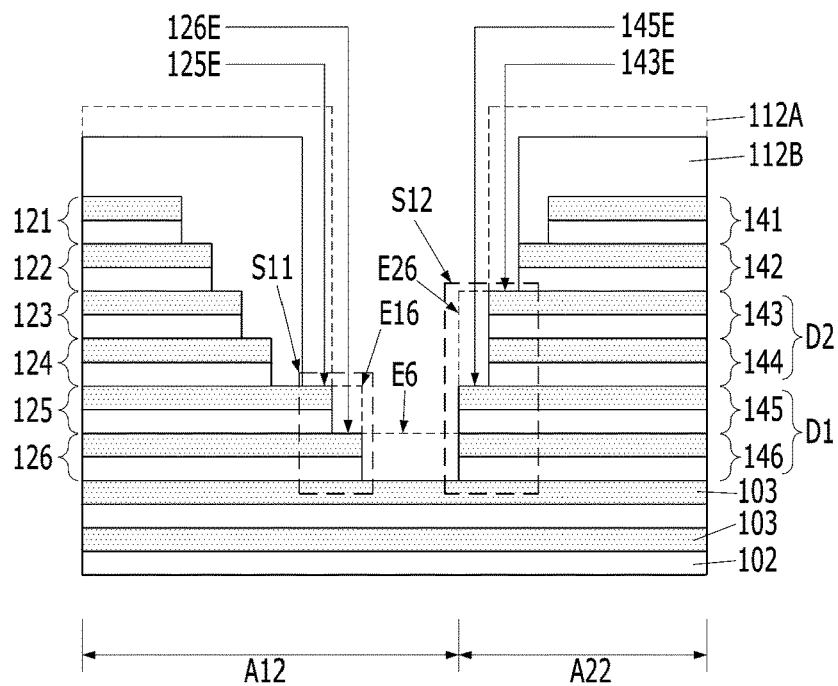

Referring to FIG. 4D, a sixth patterning process may be performed. The sixth patterning process may include a sixth etch process and a sixth slimming process that are performed sequentially. The sixth etch process may etch the second layer 103 and the first layer 102 below the fifth pattern 125 and the fifth dummy pattern 145 by using the second mask 112A as an etch barrier. The sixth slimming process may refer to a process in which the top and sides of the second mask 112A are etched to have a reduced volume after the sixth etch process. As a result of the sixth slimming process, a second mask 112B having the reduced volume may be formed.

The sixth pattern 126 and the sixth dummy pattern 146 may be formed by the sixth etch process. The sixth pattern 126 and the sixth dummy pattern 146 may be divided by a sixth etched portion E6. The sixth etched portion E6 may be a portion from which a pair of a first layer 102 and a second layer 103 are etched and removed, and each of the sixth pattern 126 and the sixth dummy pattern 146 may be a pattern of a stack of a first layer 102 and a second layer 103. The sixth pattern 126 may be formed in the pad area A12, and the sixth dummy pattern 146 may be formed in the dummy pad area A22. The sixth etched portion E6 may have a form of a trench extended in a predetermined direction.

The sixth etch process may etch an edge E16 of the fifth pattern 125 and an edge E26 of the third dummy pattern 143 and the fourth dummy pattern 144 that are exposed by the second mask 112A.

The second mask 112B formed by the sixth slimming process may have an opening wider than the opening of the second mask 112A and expose the edge 125E of the fifth pattern 125 and the edge 143E of the third dummy pattern 143 through the wide opening. The exposed area of the edge 125E of the fifth pattern 125 and the exposed area of the edge 143E of the third dummy pattern 143 may be the same. The edge 126E of the sixth pattern 126 and the edge 145E of the fifth dummy pattern 145 may be exposed by the sixth slimming process. The exposed area of the edge 126E of the sixth pattern 126 and the exposed area of the edge 145E of the fifth dummy pattern 145 may be the same.

A first stepped sidewall S11 and a second stepped sidewall S12 may be formed by the sixth patterning process. The first stepped sidewall S11 may be provided by a stack of the fifth pattern 125 and the sixth pattern 126, and the second stepped sidewall S12 may be provided by a stack of the third dummy pattern 143 to the sixth dummy pattern 146. The sixth patterning process may define a first multi-layered dummy pattern D1 and a second multi-layered dummy pattern D2 in the dummy pad area A22. The first multi-layered dummy pattern D1 may have a stack structure of the sixth dummy pattern 146 and the fifth dummy pattern 145. The second multi-layered dummy pattern D2 may have a stack structure of the fourth dummy pattern 144 and the third dummy pattern 143. Since each of the sixth dummy pattern 146 and the fifth dummy pattern 145 includes a pair of a first layer 102 and a second layer 103, the first multi-layered dummy pattern D1 may be formed of a stack of two pairs of a first layer 102 and a second layer 103. In other words, the first multi-layered dummy pattern D1 may be a stack of a first layer 102/a second layer 103/a first layer 102/a second layer 103. Since each of the third dummy pattern 143 and the fourth dummy pattern 144 includes a pair of a first layer 102 and a second layer 103, the second multi-layered dummy pattern D2 may be formed of a stack of two pairs of a first layer 102 and a second layer 103. In other words, the second multi-layered dummy pattern D2 may be a stack of a first layer 102/a second layer 103/a first layer 102/a second layer 103. Each of the fifth pattern 125 and the sixth pattern 126 may be a stack of a pair of a first layer 102 and a second layer 103. The first multi-layered dummy pattern D1 and the second multi-layered dummy pattern D2 may have the same height.

As a result of the sixth patterning process, the first multi-layered dummy pattern D1 and the second multi-layered dummy pattern D2 may be defined in the dummy pad area A22, while the fifth pattern 125 and the sixth pattern 126 are formed in the pad area A12 at the same time. The fifth pattern 125 and the sixth pattern 126 may have a single step structure of two layers, and the first multi-layered dummy pattern D1 and the second multi-layered dummy pattern D2 may have a single step structure of four layers. The fifth pattern 125 and the sixth pattern 126 may have the same height. The heights of the first multi-layered dummy pattern D1 and the second multi-layered dummy pattern D2 may be higher than the heights of the fifth pattern 125 and the sixth pattern 126. Therefore, the first stepped sidewall S11 and the second stepped sidewall S12 may be asymmetric with respect to each other.

Figure 4E:
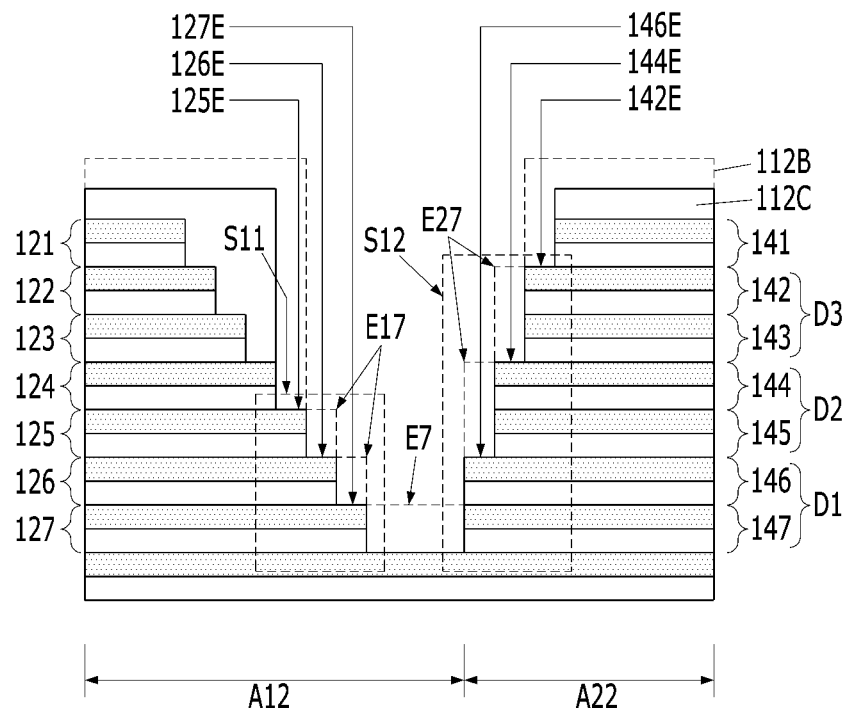

Referring to FIG. 4E, a seventh patterning process may be performed. The seventh patterning process may include a seventh etch process and a seventh slimming process that are performed sequentially. The seventh etch process may etch the second layer 103 and the first layer 102 below the sixth pattern 126 and the sixth dummy pattern 146 by using the second mask 112B as an etch barrier. The seventh slimming process may refer to a process in which the top and sides of the second mask 112B are etched to have a reduced volume after the seventh etch process. As a result of the seventh slimming process, a second mask 112C having the reduced volume may be formed.

The seventh pattern 127 and the seventh dummy pattern 147 may be formed by the seventh etch process. The seventh pattern 127 and the seventh dummy pattern 147 may be divided by a seventh etched portion E7. The seventh etched portion E7 may be a portion from which a pair of a first layer 102 and a second layer 103 are etched and removed, and each of the seventh pattern 127 and the seventh dummy pattern 147 may be a pattern formed of a stack of a first layer 102 and a second layer 103. The seventh pattern 127 may be formed in the pad area A12, and the seventh dummy pattern 147 may be formed in the dummy pad area A22. The seventh etched portion E7 may have a form of a trench extended in a predetermined direction.

The seventh etch process may etch an edge E17 of the fifth pattern 125 and the sixth pattern 126 and an edge E27 of the second dummy pattern 142 to the fifth dummy pattern 145 that are exposed by the second mask 112B.

The second mask 112C formed by the seventh slimming process may have an opening wider than the opening of the second mask 112B and expose an edge 125E of the fifth pattern 125 and an edge 142E of the second dummy pattern 142 through the wide opening. The wide opening of the second mask 112C may expose an edge 126E of the sixth pattern 126 and an edge 127E of the seventh pattern 127. Also, the wide opening of the second mask 112C may expose an edge 144E of the fourth dummy pattern 144 and an edge 146E of the sixth dummy pattern 146. The exposed areas of the exposed edges 125E, 126E, 127E, 142E, 144E and 146E may be the same.

A first stepped sidewall S11 and a second stepped sidewall S12 may be formed by the seventh patterning process. The first stepped sidewall S11 may be provided by the fifth pattern 125 to the seventh pattern 127, and the second stepped sidewall S12 may be provided by the second dummy pattern 142 to the seventh dummy pattern 147. The seventh patterning process may define a first multi-layered dummy pattern D1, a second multi-layered dummy pattern D2, and a third multi-layered dummy pattern D3 in the dummy pad area A22. The first multi-layered dummy pattern D1 may have a stack structure of the seventh dummy pattern 147 and the sixth dummy pattern 146. The second multi-layered dummy pattern D2 may have a stack structure of the fifth dummy pattern 145 and the fourth dummy pattern 144. The third multi-layered dummy pattern D3 may have a stack structure of the third dummy pattern 143 and the second dummy pattern 142. Each of the second dummy pattern 142 to the seventh dummy pattern 147 may include a pair of a first layer 102 and a second layer 103. Therefore, each of the first to third multi-layered dummy patterns D1 to D3 may be a stack of a first layer 102/a second layer 103/a first layer 102/a second layer 103. Each of the fifth pattern 125 to the seventh pattern 127 may be a stack of a pair of a first layer 102 and a second layer 103. The first multi-layered dummy pattern D1, the second multi-layered dummy pattern D2, and the third multi-layered dummy pattern D3 may have the same height.

As a result of the seventh patterning process, the first to third multi-layered dummy patterns D1 to D3 may be defined in the dummy pad area A22, while the fifth to seventh patterns 125 to 127 are formed in the pad area A12 at the same time. The fifth pattern 125 to the seventh pattern 127 may have a single step structure of two layers, and the first multi-layered dummy pattern D1 to the third multi-layered dummy pattern D3 may have a single step structure of four layers. The fifth pattern 125, the sixth pattern 126, and the seventh pattern 127 may have the same height. The heights of the first multi-layered dummy pattern D1 to the third multi-layered dummy pattern D3 may be higher than the heights of the fifth pattern 125 and the sixth pattern 126. Therefore, the first stepped sidewall S11 and the second stepped sidewall S12 may be asymmetric with respect to each other.

Figure 4F:
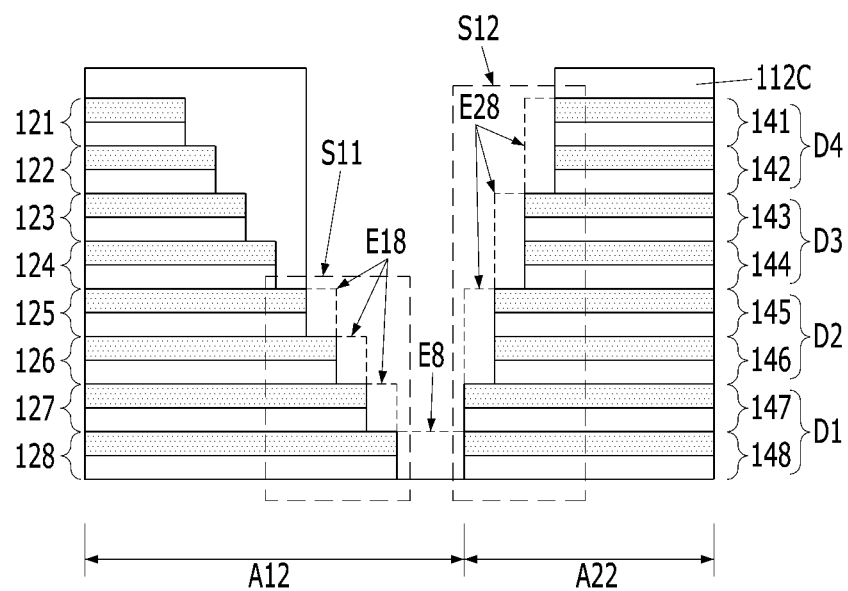

Referring to FIG. 4F, an eighth patterning process may be performed. The eighth patterning process may include an eighth etch process. The eighth etch process may etch the second layer 103 and the first layer 102 below the seventh pattern 127 and the seventh dummy pattern 147 by using the second mask 112C as an etch barrier. The eighth patterning process may not include a slimming process after the eighth etch process.

The eighth pattern 128 and the eighth dummy pattern 148 may be formed by the eighth etch process. The eighth pattern 128 and the eighth dummy pattern 148 may be divided by an eighth etched portion E8. The eighth etched portion E8 may be a portion from which a pair of a first layer 102 and a second layer 103 are etched and removed, and each of the eighth pattern 128 and the eighth dummy pattern 148 may be a pattern formed of a stack of a first layer 102 and a second layer 103. The eighth pattern 128 may be formed in the pad area A12, and the eighth dummy pattern 148 may be formed in the dummy pad area A22. The eighth etched portion E8 may have a form of a trench extended in a predetermined direction.

The eighth etch process may etch edges E18 of the fifth pattern 125 to the seventh pattern 127 and edges E28 of the first dummy pattern 141 to the sixth dummy pattern 146 that are exposed through the first mask 112C.

As a result of the eighth patterning process, the first to fourth multi-layered dummy patterns D1 to D4 may be defined in the dummy pad area A22 while the fifth to eighth patterns 125 to 128 are formed in the pad area A12 at the same time. The first multi-layered dummy pattern D1 may have a stack structure of the eighth dummy pattern 148 and the seventh dummy pattern 147. The second multi-layered dummy pattern D2 may have a stack structure of the sixth dummy pattern 146 and the fifth dummy pattern 145. The third multi-layered dummy pattern D3 may have a stack structure of the fourth dummy pattern 144 and the third dummy pattern 143. The fourth multi-layered dummy pattern D4 may have a stack structure of the second dummy pattern 142 and the first dummy pattern 141. Each of the first to eighth dummy patterns 141 to 148 may include a pair of a first layer 102 and a second layer 103. Accordingly, each of the first to fourth multi-layered dummy patterns D1 to D4 may be a stack of a first layer 102/a second layer 103/a first layer 102/a second layer 103. Each of the fifth to eighth patterns 125 to 128 may be a stack of a pair of a first layer 102 and a second layer 103. The first multi-layered dummy pattern D1, the second multi-layered dummy pattern D2, the third multi-layered dummy pattern D3, and the fourth multi-layered dummy pattern D4 may have the same height. Each of the fifth to eighth patterns 125 to 128 may have a single step structure of two layers, and each of the first to fourth multi-layered dummy patterns D1 to D4 may have a single step structure of four layers.

Referring to FIGS. 4A to 4F, an etch process and a slimming process may be repeatedly performed to form the fifth to eighth patterns 125 to 128 and the first to fourth multi-layered dummy patterns D1 to D4.

Figure 4G:
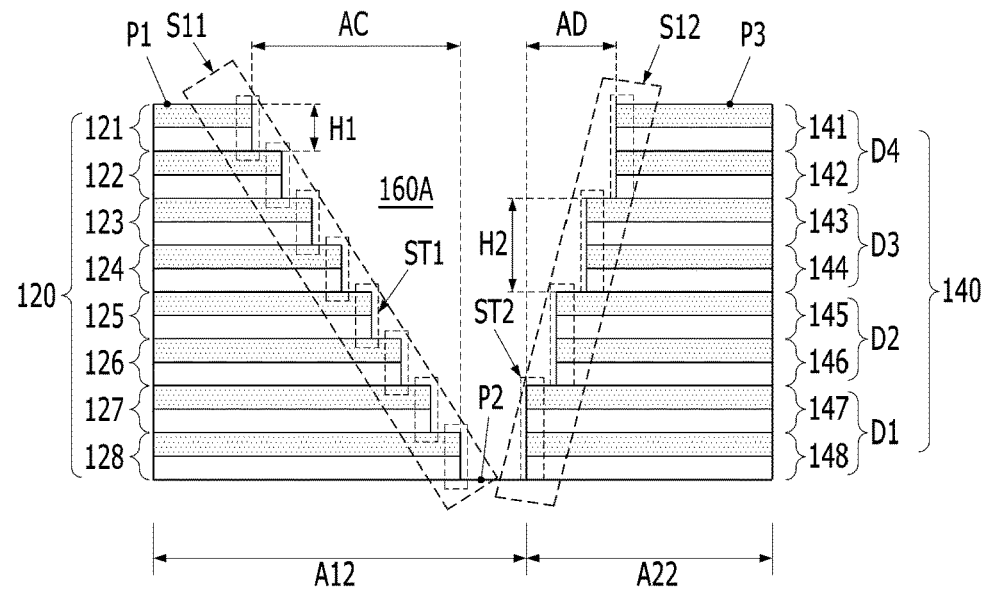

Referring to FIG. 4G, the first mask 112C may be removed.

A pad stack 120 including the first to eighth patterns 121 to 128 may be formed in the pad area A12 and a dummy pad stack 140 including the first to fourth multi-layered dummy patterns D1 to D4 may be formed in the dummy pad area A22 by the series of the patterning processes illustrated in FIGS. 3A to 4G. The pad stack 120 and the dummy pad stack 140 may be divided by an asymmetric stepped trench 160A. The asymmetric stepped trenches 160A may be provided by the first etched portion E1 to the eighth etched portion E8. The heights of the pad stack 120 and the dummy pad stack 140 may be the same as the depth of the asymmetric stepped trenches 160A.

The asymmetric stepped trenches 160A may have a tapered-trench shape having a width reducing in the depth direction. Each of the asymmetric stepped trenches 160A may include two sidewalls, and each of the two sidewalls may have a stepped shape. The asymmetric stepped trench 160A may include the first stepped sidewall S11 and the second stepped sidewall S12. The first stepped sidewall S11 may be defined at an edge of the pad stack 120. The first stepped sidewall S11 may be provided by a stack of first to eighth patterns 121 to 128. The second stepped sidewall S12 may be defined at an edge of the dummy pad stack 140. The second stepped sidewall S12 may be provided by a stack of the first to fourth multi-layered dummy patterns D1 to D4. The first stepped sidewall S11 may be positioned in the pad area A12, and the second stepped sidewall S12 may be positioned in the dummy pad area A22. The first stepped sidewall S11 and the second stepped sidewall S12 may face each other.

The first stepped sidewall S11 and the second stepped sidewall S12 may have asymmetric sidewall profiles. The first stepped sidewall S11 may have a greater slope than the second stepped sidewall S12. Herein, the slope may refer to the inclination of a line that runs through corners of the steps. The first stepped sidewall S11 may have a slope that is less than a slope of the second stepped sidewall S12.

The first stepped sidewall S11 may include a plurality of first steps ST1 that are formed to descend from a first position P1 to a second position P2. The second stepped sidewall S12 may include a plurality of second steps ST2 that are formed to ascend from the second position P2 to a third position P3. The first steps ST1 may have a slope that is lower than a slope of the second steps ST2.

The first steps ST1 may have a bilayer stack structure, and the second steps ST2 may have a four-layer stack structure. For example, the first steps ST1 may include a stack of a pair of a first layer 102 and a second layer 103, and the second steps ST2 may include a stack of two pairs of a first layer 102 and a second layer 103. The first steps ST1 may have a first height H1, and the second steps ST2 may have a second height H2. The second height H2 may be greater than the first height H1. The first stepped sidewall S11 may be formed of eight first steps ST1, and the second stepped sidewall S12 may be formed of four second steps ST2. The heights of the first stepped sidewall S11 and the second stepped sidewall S12 may be the same.

The first stepped sidewall S11 and the second stepped sidewall S12 may be asymmetric, and the area AD occupied by the second stepped sidewall S12 may be less than the area AC occupied by the first stepped sidewall S11 (AD<AC).

As described above, since the first stepped sidewall S11 and the second stepped sidewall S12 are asymmetric to one another by having different slopes, the asymmetric stepped trench 160A has an asymmetric sidewall profile.

Since the second stepped sidewall S12 occupies less area than the first stepped sidewall S11, the area AD occupied by the dummy pad area A22 may be decreased.

Also, the chip size of a multi-layer semiconductor device may be reduced by decreasing the area AD occupied by the dummy pad area A22.

According to another embodiment of the present disclosure, the asymmetric stepped trenches 160A may be varied in depth depending on the number of steps. The first stepped sidewall S11 may include M first steps ST1, and the second stepped sidewall S12 may include N second steps ST2, where N is an integer smaller than M. The first steps ST1 may be a stack structure of two layers, and the second steps ST2 may be a stack structure of six or more layers. For example, the first steps ST1 may include a stack of a pair of a first layer 102 and a second layer 103, and the second steps ST2 may include a stack of three or more pairs of a first layer 102 and a second layer 103.

Figure 2D:
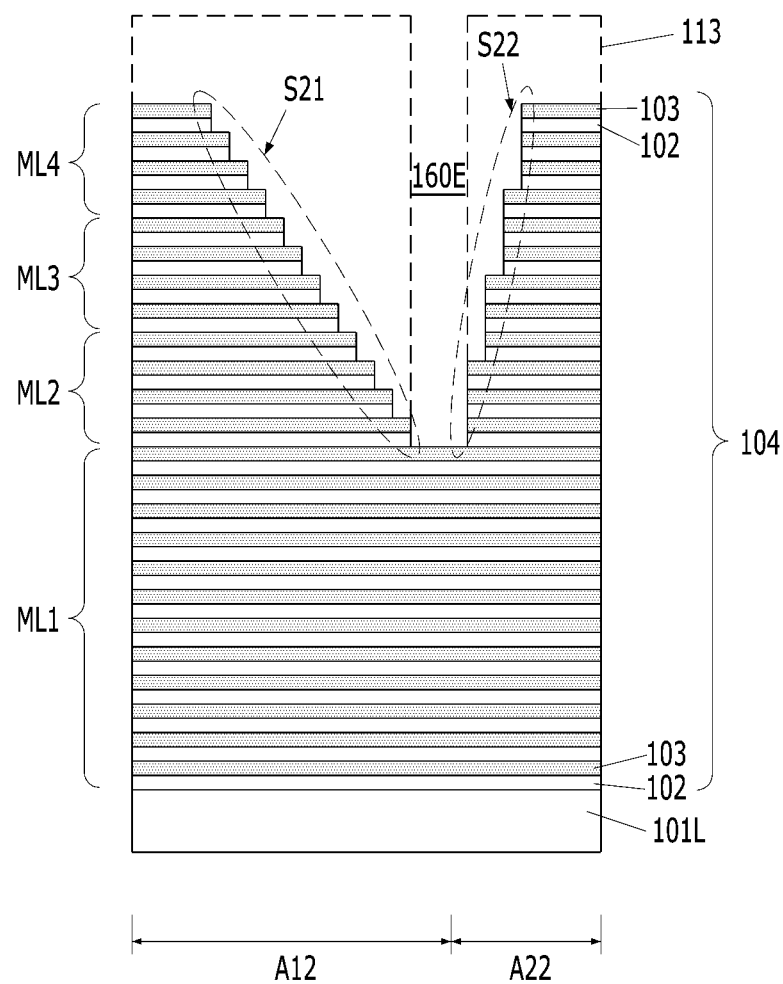

Referring to FIG. 2D, the asymmetric stepped trenches 160A may extend. The asymmetric stepped trenches 160A may extend in the depth direction and may be formed as shown by \160E. The asymmetric stepped trenches 160E may include a first stepped sidewall S21 and a second stepped sidewall S22. The first stepped sidewall S21 and the second stepped sidewall S22 may be asymmetric with respect to each other.

The asymmetric stepped trenches 160E may be formed by performing a plurality of etch processes and a plurality of slimming processes. For example, an extension process for forming the asymmetric stepped trenches 160E may include an etch process of etching the second multi-layered stack ML2 by using a third mask 113 and a slimming process of slimming the third mask 113.

The method of forming the asymmetric stepped trenches 160E will be described with reference to FIGS. 5A to 5D.

Figure 5A:
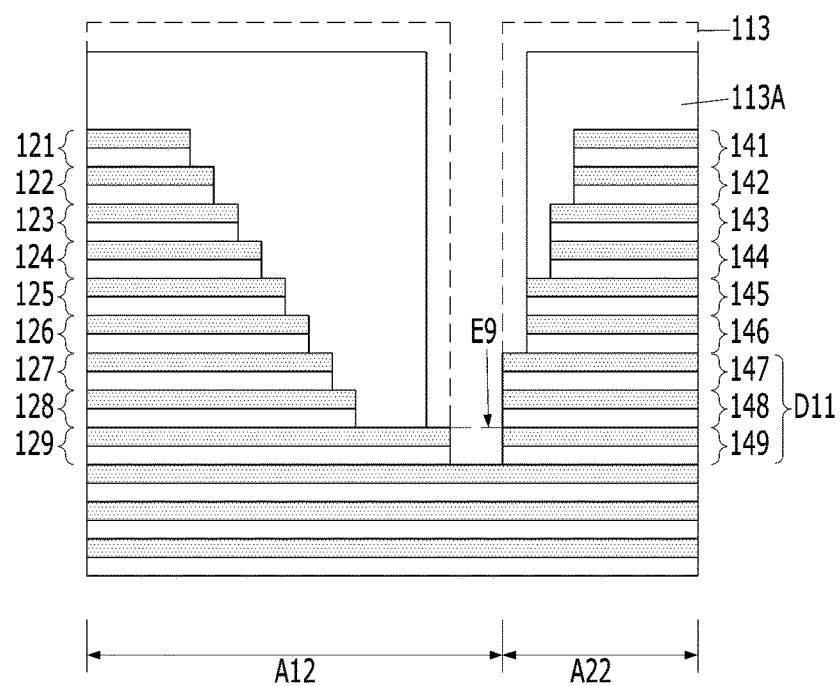
FIGS. 5A to 5D are cross-sectional views illustrating a method of forming the asymmetrical stepped trench 160E shown in FIG. 2D.

Referring to FIG. 5A, the third mask 113 may be formed over the resultant structure from FIG. 4G where the asymmetric stepped trenches 160A are formed.

A ninth patterning process may be performed. The ninth patterning process may include a ninth etch process and a ninth slimming process that are sequentially performed. The ninth etch process may etch the second layer 103 and the first layer 102 below the eighth pattern 128 and the eighth dummy pattern 148 by using the third mask 113 as an etch barrier. The ninth slimming process may refer to a process in which the top and sides of the third mask 113 are etched to have a reduced volume after the ninth etch process. As a result of the ninth slimming process, a third mask 113A having the reduced volume may be formed.

The ninth pattern 129 and the ninth dummy pattern 149 may be formed by the ninth etch process. The ninth pattern 129 and the ninth dummy pattern 149 may be divided by a ninth etched portion E9. Each of the ninth pattern 129 and the ninth dummy pattern 149 may be a pattern formed of a stack of a first layer 102 and a second layer 103. The ninth pattern 129 may be formed in the pad area A12, and the ninth dummy pattern 149 may be formed in the dummy pad area A22. The ninth etched portion E9 may have a form of a trench extended in a predetermined direction.

The first multi-layered dummy pattern D11 may be defined in the dummy pad area A22, while the ninth pattern 129 is formed in the pad area A12 at the same time. The ninth pattern 129 may have a single step structure of two layers, and the first multi-layered dummy pattern D11 may have a single step structure of six layers. The first multi-layered dummy pattern D11 may be a stack of the ninth dummy pattern 149/the eighth dummy pattern 148/the seventh dummy pattern 147. Since each of the ninth dummy pattern 149, the eighth dummy pattern 148, and the seventh dummy pattern 147 is a stack of a pair of a first layer 102 and a second layer 103, the first multi-layered dummy pattern 149 D11 may be a stack of three pairs of a first layer 102 and a second layer 103.

Figure 5B:
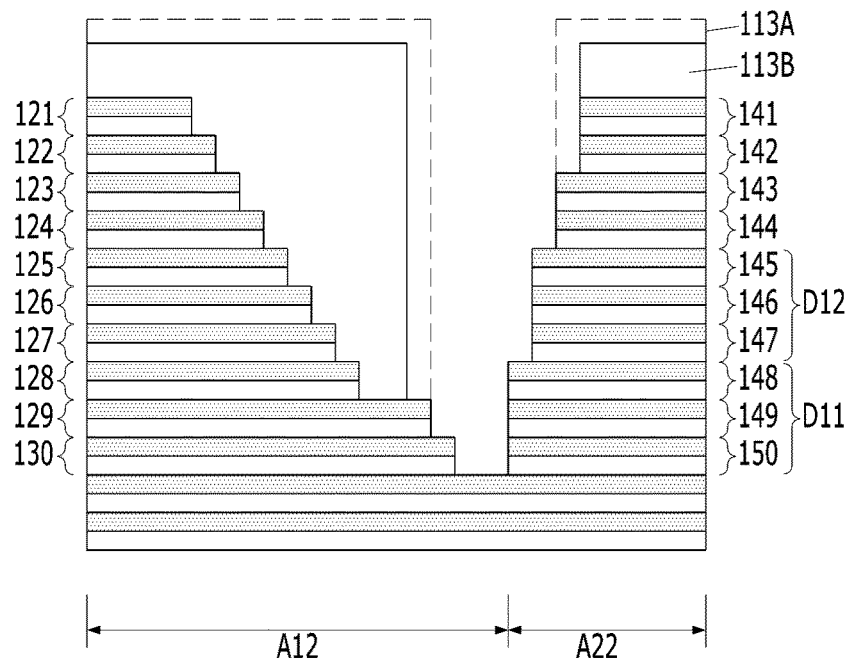
Figure 5C:
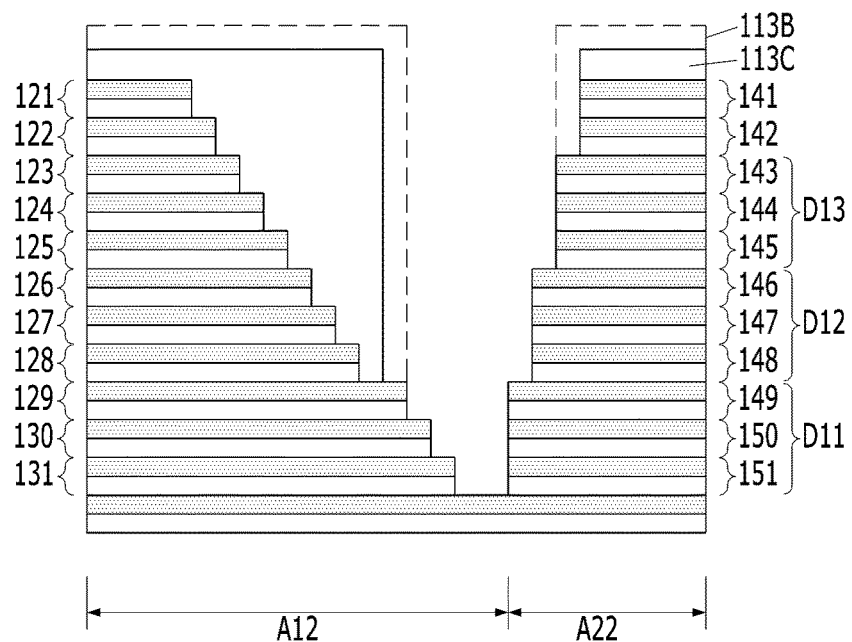
Figure 5D:
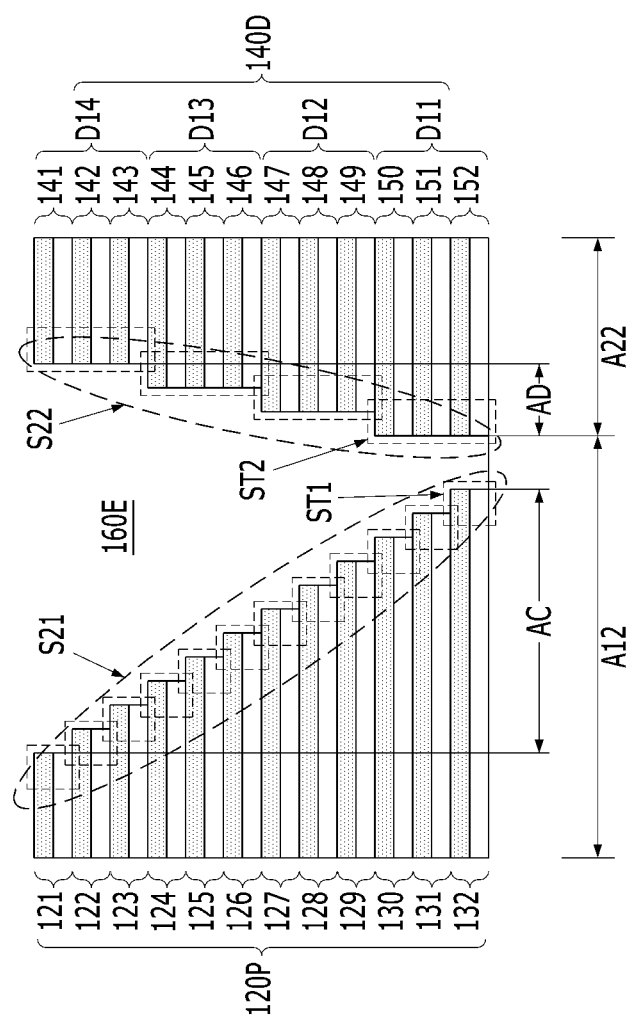

Hereinafter, as shown in FIGS. 5B to 5D, an etch process and a slimming process may be repeatedly performed.

Referring to FIG. 5B, the second layer 103 and the first layer 102 below the ninth pattern 129 and the ninth dummy pattern 149 may be etched by an etch process using the third mask 113A. As a result, the $10^{th}$ pattern 130 and the $10^{th}$ dummy pattern 150 may be formed. The $10^{th}$ pattern 130 may be formed below the ninth pattern 129, and the $10^{th}$ dummy pattern 150 may be formed below the ninth dummy pattern 149.

After the $10^{th}$ pattern 130 and the $10^{th}$ dummy pattern 150 are formed, a slimming process of etching the top and sides of the third mask 113A may be performed. As a result of the slimming process, a third mask 113B having a reduced volume may be formed.

The first multi-layered dummy pattern D11 and the second multi-layered dummy pattern D12 may be defined in the dummy pad area A22, while the $10^{th}$ pattern 130 is formed in the pad area A12 at the same time. The $10^{th}$ pattern 130 may have a step structure of two layers, and each of the first multi-layered dummy pattern D11 and the second multi-layered dummy pattern D12 may have a step structure of six layers. The first multi-layered dummy pattern D11 may be a stack of the $10^{th}$ dummy pattern 150/the ninth dummy pattern 149/the eighth dummy pattern 148. The second multi-layered dummy pattern D12 may be a stack of the seventh dummy pattern 147/the sixth dummy pattern 146/the fifth dummy pattern 145. Since each of the fifth to $10^{th}$ dummy patterns 145 to 149 is a stack of a pair of a first layer 102 and a second layer 103, each of the first multi-layered dummy pattern D11 and the second multi-layered dummy pattern D12 is a stack of three pairs of a first layer 102 and a second layer 103.

Referring to FIG. 5C, the second layer 103 and the first layer 102 below the $10^{th}$ pattern 130 and the $10^{th}$ dummy pattern 150 may be etched by an etch process using the third mask 113B. As a result, an $11^{th}$ pattern 131 and an $11^{th}$ dummy pattern 151 may be formed. The $11^{th}$ pattern 131 may be formed below the $10^{th}$ pattern 130, and the $11^{th}$ dummy pattern 151 may be formed below the $10^{th}$ dummy pattern 150.

After the $11^{th}$ pattern 131 and the $11^{th}$ dummy pattern 151 are formed, a slimming process for etching the top and sides of the third mask 113B may be performed. As a result of the slimming process, a third mask 113C having a reduced volume may be formed.

The first multi-layered dummy pattern D11, the second multi-layered dummy pattern D12, and the third multi-layered dummy pattern D13 are formed in the dummy pad area A22, while the $11^{th}$ pattern 131 is formed in the pad area A12 at the same time. The $11^{th}$ pattern 131 may have a step structure of two layers, and each of the first to third multi-layered dummy patterns D11 to D13 may have a step structure of six layers. The first multi-layered dummy pattern D11 may be a stack of the $11^{th}$ dummy pattern 151/the $10^{th}$ dummy pattern 150/the ninth dummy pattern 149. The second multi-layered dummy pattern D12 may be a stack of the eighth dummy pattern 148/the seventh dummy pattern 147/the sixth dummy pattern 146. The third multi-layered dummy pattern D13 may be a stack of the fifth dummy pattern 145/the fourth dummy pattern 144/the third dummy pattern 143. Since each of the third to $11^{th}$ dummy patterns 143 to 151 is a stack of a pair of a first layer 102 and a second layer 103, each of the first to third multi-layered dummy patterns D11 to D13 may correspond to a stack of three pairs of a first layer 102 and a second layer 103.

Referring to FIG. 5D, the second layer 103 and the first layer 102 below the $11^{th}$ pattern 131 and the $11^{th}$ dummy pattern 151 may be etched by an etch process using the third mask 113C. As a result, a $12^{th}$ pattern 132 and a $12^{th}$ dummy pattern 152 may be formed. The $12^{th}$ pattern 132 may be formed below the $11^{th}$ pattern 131, and the $12^{th}$ dummy pattern 152 may be formed below the $11^{th}$ dummy pattern 151.

After the $12^{th}$ pattern 132 and the $12^{th}$ dummy pattern 152 are formed, the third mask 113C may be removed.

The first multi-layered dummy pattern D11, the second multi-layered dummy pattern D12, the third multi-layered dummy pattern D13, and the fourth multi-layered dummy pattern D14 may be formed in the dummy pad area A22, while the $12^{th}$ pattern 132 is defined. The $12^{th}$ pattern 132 may have a single step structure of two layers, and each of the first to fourth multi-layered dummy patterns D11 to D14 may have a single step structure of six layers. The first multi-layered dummy pattern D11 may be a stack of the $12^{th}$ dummy pattern 152/the $11^{th}$ dummy pattern 151/the $10^{th}$ dummy pattern 150. The second multi-layered dummy pattern D12 may be a stack of the ninth dummy pattern 149/the eighth dummy pattern 148/the seventh dummy pattern 147. The third multi-layered dummy pattern D13 may be a stack of the sixth dummy pattern 146/the fifth dummy pattern 145/the fourth dummy pattern 144. The fourth multi-layered dummy pattern D14 may be a stack of the third dummy pattern 143/the second dummy pattern 142/the first dummy pattern 141. Since each of the first to $12^{th}$ dummy patterns 141 to 152 is a stack of a pair of a first layer 102 and a second layer 103, each of the first to fourth multi-layered dummy patterns D11 to D14 may correspond to a stack of three pairs of a first layer 102 and a second layer 103.

A pad stack 120P including the first to the $12^{th}$ patterns 121 to 132 may be formed in the pad area A12 and a dummy pad stack 140D including the first to $12^{th}$ dummy patterns 141 to 152 may be formed in the dummy pad area A22 by the series of the processes illustrated in FIGS. 3A to 5D. The pad stack 120P and the dummy pad stack 140D may be divided by an asymmetric stepped trench 160E. The asymmetric stepped trench 160E may have a form of a tapered trench whose width is decreased in the depth direction.

The asymmetric stepped trench 160E may include two sidewalls, and each of the two sidewalls may have a stepped shape. The asymmetric stepped trench 160E may include a first stepped sidewall S21 and a second stepped sidewall S22. The first stepped sidewall S21 and the second stepped sidewall S22 may have an asymmetric sidewall profile.

The first stepped sidewall S21 may have a greater slope than the second stepped sidewall S22. Herein, the slope may refer to the inclination of the steps. The first stepped sidewall S21 may have a shallow slope, and the second stepped sidewall S22 may have a steeper slope.

The first stepped sidewall S21 may be positioned in the pad area A12, and the second stepped sidewall S22 may be positioned in the dummy pad area A22. The first stepped sidewall S21 and the second stepped sidewall S22 may face each other. The first stepped sidewall S21 and the second stepped sidewall S22 may be formed by etching the second multi-layered stack ML2 to the fourth multi-layered stack ML4.

The first stepped sidewall S21 may include a plurality of first steps ST1 that are formed to descend from the first pattern 121 to the twelfth pattern 132. The second stepped sidewall S22 may include a plurality of second steps ST2 that are formed to increase in height as it goes from the $12^{th}$ dummy pattern 152 to the first dummy pattern 141. The first steps ST1 may ascend at a lesser slope than the second steps ST2.

The first stepped sidewall S21 may include M first steps ST1, and the second stepped sidewall S12 may include N second steps ST2, where N is an integer smaller than M.

The first steps ST1 may have a stack structure of two layers, and the second steps ST2 may have a stack structure of six layers. The first steps ST1 may include a stack of a pair of a first layer 102 and second layer 103, and the second steps ST2 may include a stack of three pairs of a first layer 102 and a second layer 103. The second steps ST2 may be higher than the first steps ST1. The first stepped sidewall S21 may be formed of twelve first steps ST1, and the second stepped sidewall S22 may be formed of four second steps ST2. The heights of the first stepped sidewall S21 and the second stepped sidewall S22 may be the same.

As described above, the first stepped sidewall S21 and the second stepped sidewall S22 may be asymmetric, and the area AD occupied by the second stepped sidewall S22 may be smaller than the area AC occupied by the first stepped sidewall S21.

As described above, since the first stepped sidewall S21 and the second stepped sidewall S22 are formed in an asymmetric stepped structure having different slopes, both sidewalls of the asymmetric stepped trench 160E may have an asymmetric sidewall profile.

Since the area occupied by the second stepped sidewall S22 is formed smaller than the area of the first stepped sidewall S21, the area AD occupied by the dummy pad area A22 may be reduced. Also, the chip size of a multi-layer semiconductor device may be reduced by reducing the area AD occupied by the dummy pad area A22.

Figure 2E:
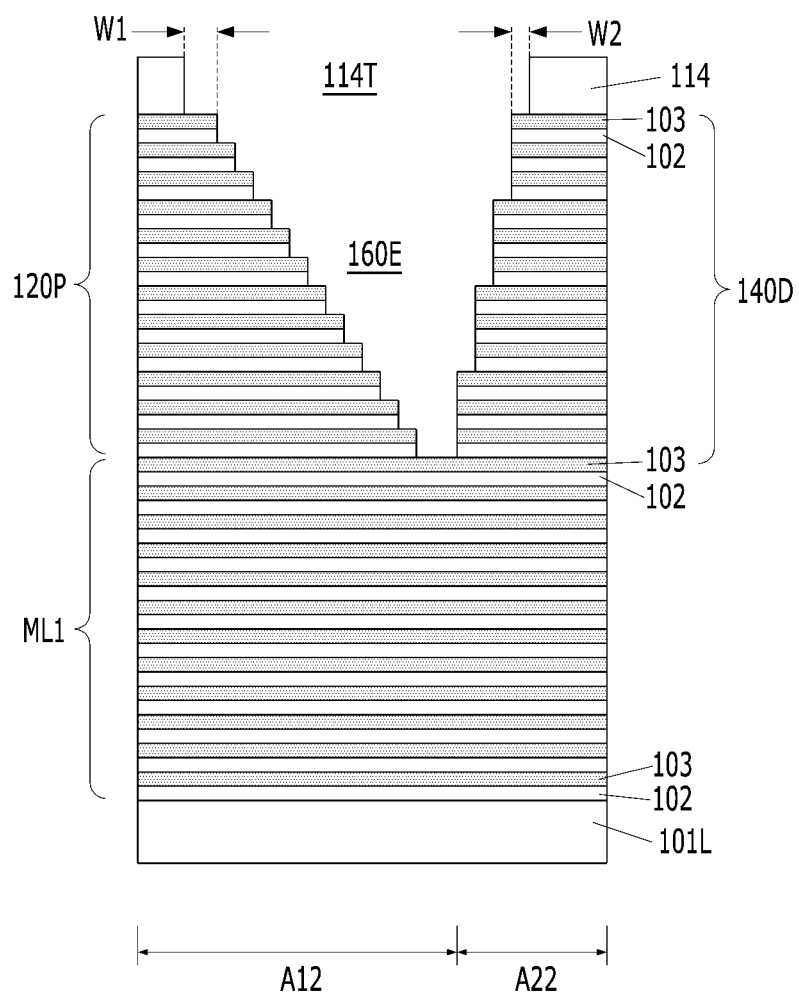
Figure 2F:
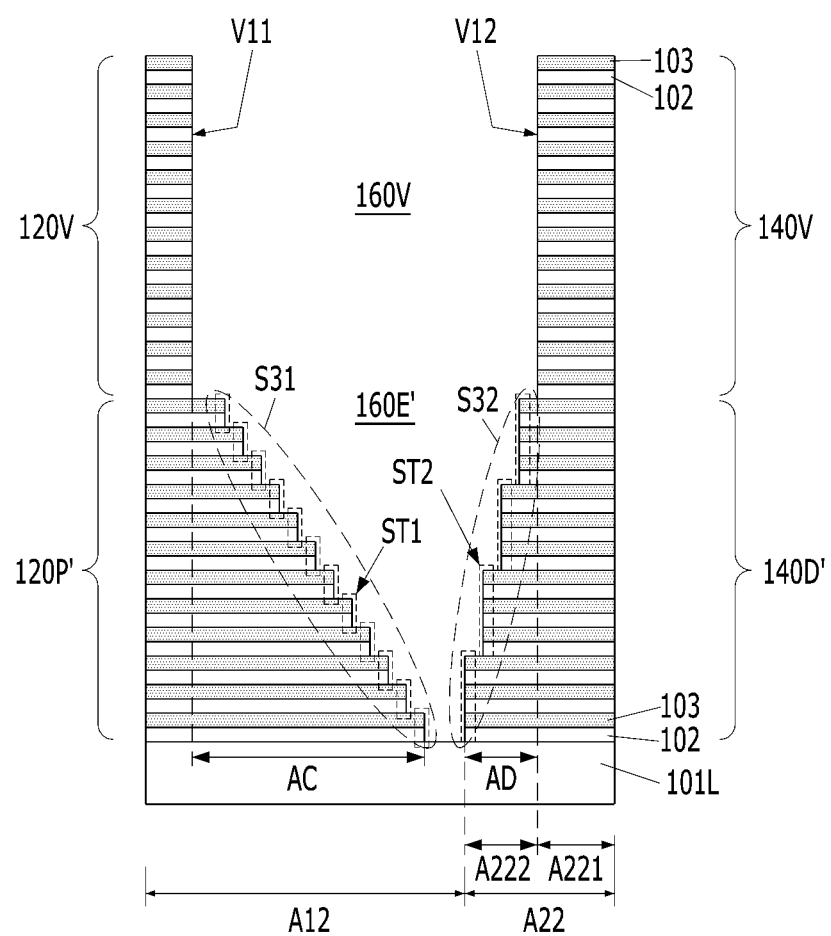

Referring to FIGS. 2E and 2F, the asymmetric stepped trenches 160E may extend vertically.

Hereinafter, the asymmetric stepped trenches 160E formed as shown in FIGS. 3A to 5D will be referred to as 'initial asymmetric trenches 160E'. The series of the etch processes and the slimming processes illustrated in FIGS. 3A to 5D may be performed in a first direction (which is an X direction in FIG. 1A), and the series of the etch processes shown in FIGS. 2E and 2F may be performed in a direction (which is a Z direction in FIG. 1A) intersecting with the first direction X.

Referring to FIG. 2E, the fourth mask 114 may be formed over the pad stack 120P and the dummy pad stack 140D including the initial asymmetric stepped trenches 160E. The fourth mask 114 may include a fourth opening 114T. When the fourth opening 114T is formed, one sidewall of the fourth opening 114T may be shifted to a first width W1. For example, the mask starting point of the fourth mask 114, for example, the edge of the uppermost first pattern 121 corresponding to the pad area A12, may be formed to be shifted to the first width W1. Another sidewall of the fourth opening 114T may be shifted to a second width W2. The sidewall of the fourth opening 114T may be formed by shifting the mask starting point of the fourth mask 114, for example, the edge of the uppermost first dummy pattern 141 corresponding to the dummy pad area A22, to the second width W2. The first width W1 may be greater than the second width W2. The first width W1 may be greater than each step of the pad stack 120P.

Referring to FIG. 2F, the first multi-layered stack ML1 may be etched by using the fourth mask 114 as an etch barrier. The etch process of etching the first multi-layered stack ML1 may include an etch-back process. By the etch-back process, the profiles of the initial asymmetric stepped trenches 160E, the pad stack 120P, and the dummy pad stack 140D may be transcribed into the first multi-layered stack ML1.

Thus, the first multi-layered stack ML1 may be patterned into a pad stack 120P' and a dummy pad stack 140D'. The pad stack 120P' and the dummy pad stack 140D' may be divided by an asymmetric stepped trench 160E'. The asymmetric stepped trench 160E' may be what the initial asymmetric stepped trench 160E of FIG. 2E is extended downward. The pad stack 120P and the dummy pad stack 140D of FIG. 2E may be patterned into dummy stacks 120V and 140V. The dummy stacks 120V and 140V may be divided by a vertical trench 160V, and the vertical trench 160V may have vertical sidewalls V11 and V12. Herein, the vertical sidewalls V11 and V12 may refer to a step-free sidewall. An asymmetric stepped trench 160E' may be positioned below the vertical trench 160V.

Similar to the asymmetric stepped trenches 160E of FIG. 2E, the asymmetric stepped trench 160E' of FIG. 2F may be of a tapered trench shape having a width decreasing in the depth direction.

The asymmetric stepped trench 160E' may include two sidewalls, and each of the two sidewalls may have a stepped shape. The asymmetric stepped trench 160E' may include a first stepped sidewall S31 and a second stepped sidewall S32. The first stepped sidewall S31 and the second stepped sidewall S32 may have asymmetric sidewall profiles. The first vertical sidewall V11 among the vertical sidewalls V11 and V12 may extend vertically from the first stepped sidewall S31, and the second vertical sidewall V12 may extend vertically from the second stepped sidewall S32.

The first stepped sidewall S31 may have a greater slope than the second stepped sidewall S32. Herein, the slope may refer to the inclination of a line that runs through corners of the steps. The first stepped sidewall S31 may have a gradual slope, and the second stepped sidewall S32 may have a steeper slope.

The first stepped sidewall S31 may be positioned in the pad area A12, and the second stepped sidewall S32 may be positioned in the dummy pad area A22. The first stepped sidewall S31 and the second stepped sidewall S32 may face each other.

The first stepped sidewall S31 may include a plurality of first steps ST1, and the second stepped sidewall S32 may include a plurality of second steps ST2. The first steps ST1 may incline at a lesser angle than the second steps ST2. The first steps ST1 may be a bilayer stack, and the second steps ST2 may have a stack structure of six layers. For example, the first steps ST1 may include a pair of a first layer 102 and a second layer 103, and the second steps ST2 may include three pairs of a first layer 102 and a second layer 103. The second steps ST2 may be higher than the first steps ST1. The first stepped sidewall S31 may be formed of 12 first steps ST1, and the second stepped sidewall S32 may be formed of four second steps ST2. The heights of the first stepped sidewall S31 and the second stepped sidewall S32 may be the same.

The uppermost first step ST1 of the first stepped sidewall S31 may have a wider width than the remaining first steps ST1.

The first stepped sidewall S31 and the second stepped sidewall S32 may be asymmetric, and the area AD occupied by the second stepped sidewall S32 may be smaller than the area AC occupied by the first stepped sidewall S31. The area occupied by the dummy pad area A22 may be reduced by reducing the area AD occupied by the second stepped sidewall S32. Thus, the chip size of the multi-layer semiconductor device may be reduced.

From the perspective of the dummy pad area A22, the dummy pad area A22 may include a dummy body area A221 which occupies most of the dummy pad area A22, and a dummy pad contact area S222 where the second stepped sidewall S32 is formed. The reduction in the area AD occupied by the second stepped sidewall S32 corresponds to a reduction in the area occupied by the dummy pad contact area A222. Therefore, when the area occupied by the dummy pad contact area A222 is reduced, the area occupied by the dummy body area A221 may be increased. When the area occupied by the dummy body area A221 is increased, the structural stability of the dummy pad area A22 may be increased.

Meanwhile, the dummy stack 140V formed over the dummy pad area A22 may serve as a supporter to prevent a dishing phenomenon in the subsequent Chemical Mechanical Polishing (CMP) process. The area A22 occupied by the dummy stack 140V may be increased in proportion to the increase in the area occupied by the dummy body area A221.

The dishing phenomenon in the subsequent CMP process may be improved by increasing the area AS occupied by the dummy stack 140V.

As will be described later, the dummy stack 120V formed over the pad area A12 may serve as a supporter to prevent the dishing phenomenon in a subsequent CMP process. The dummy stacks 120V and 140V may correspond to the supporting stacks of FIG. 1C.

The dummy stacks 120V and 140V may not have active circuitry. For example, subsequent contact plugs may not be formed in the dummy stacks 120V and 140V.

Figure 2G:
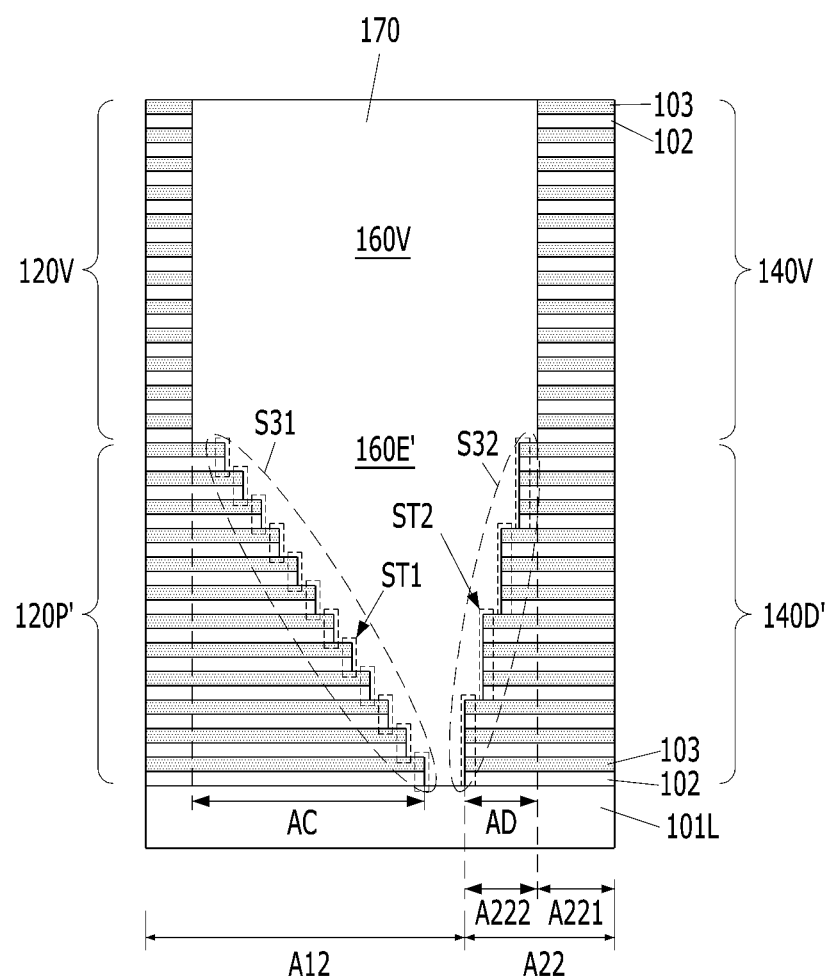

Referring to FIG. 2G, an interlayer dielectric layer 170 may be formed to fill the vertical symmetric trenches 160V and the asymmetric stepped trenches 160E'. Subsequently, a Chemical Mechanical Polishing (CMP) may be performed on the interlayer dielectric layer 170 to expose the upper surfaces of the dummy stacks 120V and 140V. During the CMP process of the inter-layer dielectric layers 170, the dummy stacks 120V and 140V may serve as a supporter. Accordingly, embodiments of the present disclosure improve semiconductor technology by reducing the dishing phenomenon, and a pattern leaning of the pad stack 120P' may be improved as well.

Hereinafter, the process of replacing the second layer 103 with a conductive layer will be described with reference to FIGS. 6A to 6E.

FIGS. 6A to 6E illustrate an example of a method for fabricating a vertical semiconductor device by presenting views taken along the line A-A' and the line C-C' shown in FIG. 1A. The line A-A' may illustrate a fabrication method for the cell region CR, and the line C-C' may be a fabrication method for the second area A2 of the peripheral region PR. FIGS. 6A to 6E illustrate a fabrication method for the cell region CR and the second area A2 after the process of FIG. 2G. Although not shown, the processes illustrated in FIGS. 6A to 6E may also be performed simultaneously in areas A1 to A6.

Figure 6A:
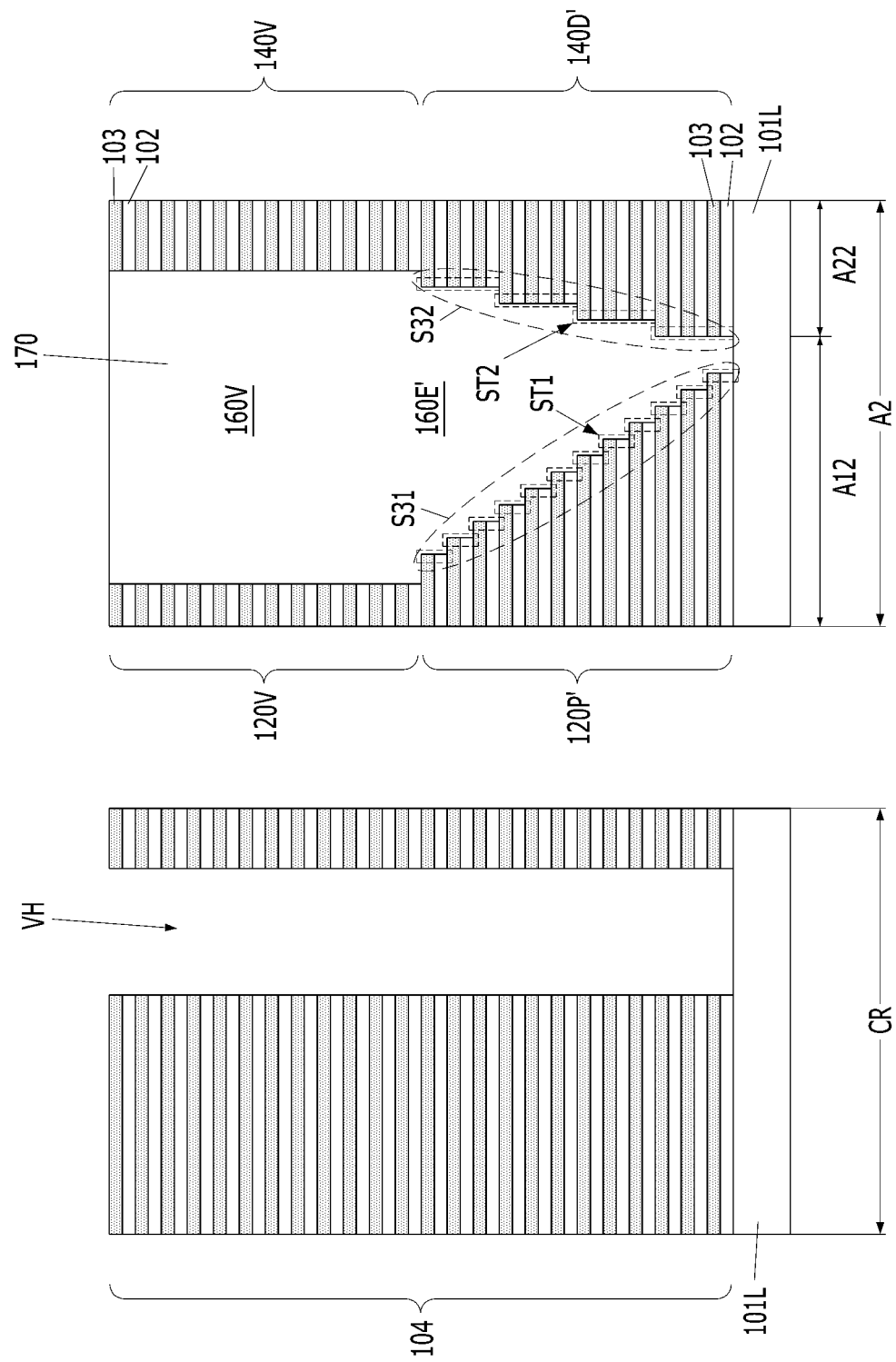
FIGS. 6A to 6E illustrate an example of a method for fabricating a vertical semiconductor device by presenting views taken along line A-A' and line C-C' shown in FIG. 1A.

Referring to FIG. 6A, the multi-layered stack structure 104 may be etched to form vertical holes VH. The vertical holes VH may be formed in the cell region CR and may not be formed in the second area A2. As shown in FIG. 1A, a plurality of vertical holes VH may be formed in the cell region CR.

The vertical holes VH may expose a portion of the surface of the lower structure 101L. The vertical holes VH may be formed perpendicular to the surface of the lower structure 101L.

Figure 6B:
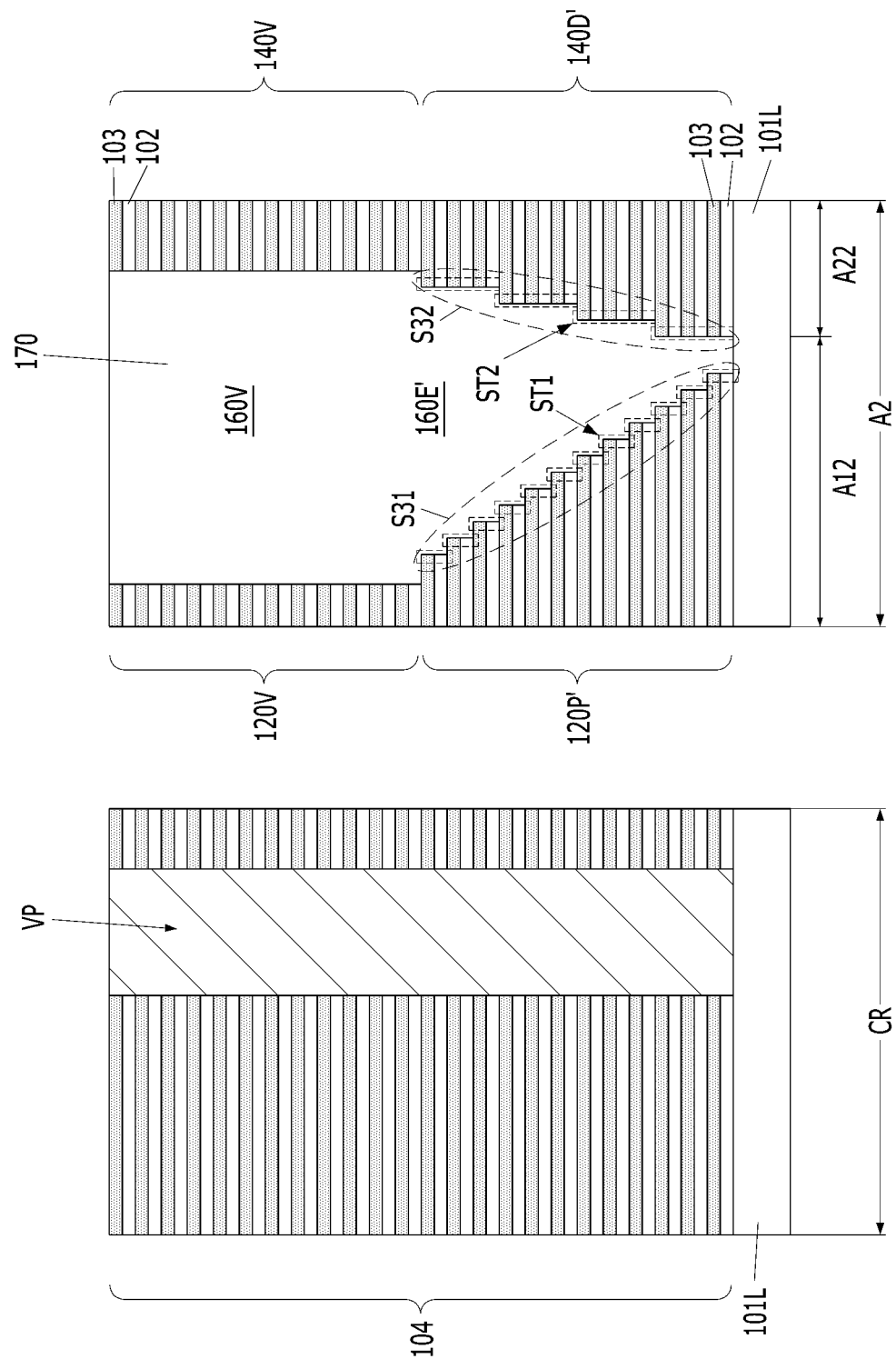

Referring to FIG. 6B, a vertical pillar structure VP may be formed. The vertical pillar structure VP may fill the vertical holes VH. The vertical pillar structure VP may be referred to as a 'vertical channel structure'. The vertical pillar structure VP may include a tunnel dielectric layer, a charge storage layer, a channel layer, and a blocking layer.

Hereinafter, the process of replacing the second layers 103 with a conductive layer will be described. The conductive layer may include a gate electrode, a gate pad, a dummy gate pad, and a dummy pad.

Figure 6C:
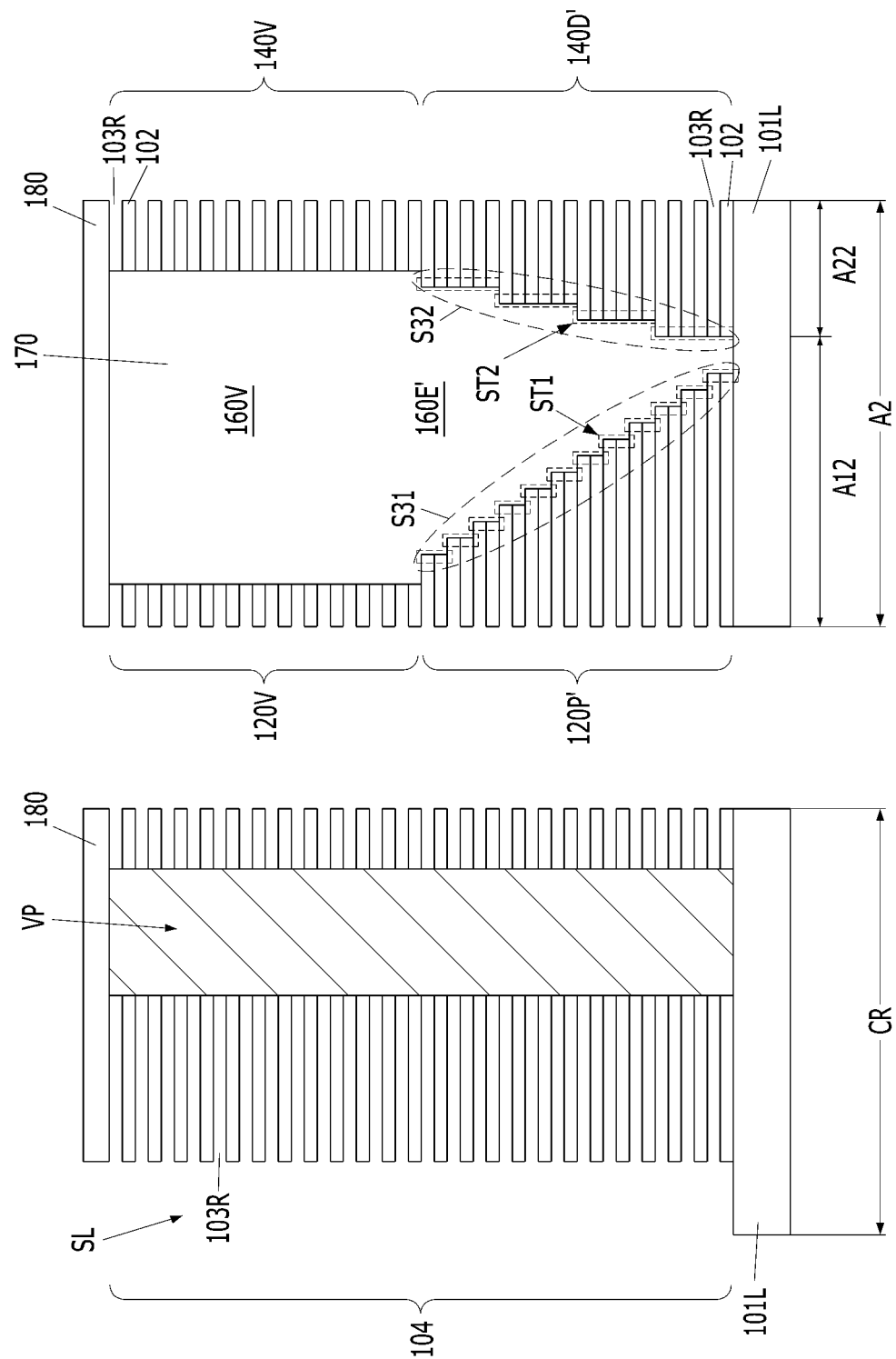

Referring to FIG. 6C, a capping layer 180 may be formed over the entire structure including the vertical pillar structure VP.

Subsequently, a slit SL and a plurality of recesses 103R may be formed. After the slit SL is formed, a plurality of recesses 103R may be formed. The slit SL may be formed by etching the multi-layered stack structure 104. The slit SL may extend in the first direction X (see SL in FIG. 1A). The pad stack 120P', the dummy pad stack 140D', and the dummy stacks 120V and 140V may be separated on the basis of a unit of a block by the slit SL. The multi-layered stack structure 104 of the cell region CR may also be divided by the slit SL. Both sidewalls of the slit SL may expose the multi-layered stack structure 104 of the cell region CR, the pad stack 120P', the dummy pad stack 140D', and the first layers 102 and the second layers 103 of the dummy stacks 120V and 140V.

The second layers 103 may be selectively removed through the slit SL. Thus, a recess 103R may be formed between the first layers 102. The second layers 103 may be removed by a wet-etch process. For example, when the second layers 103 include silicon nitride, the second layers 103 may be removed by a wet etch process using a phosphoric acid ($H_3PO_4$) solution. The recesses 103R may be parallel to the surface of the lower structure 101L. The recesses 103R may be referred to as lateral recesses. The recesses 103R may expose sidewalls of the vertical pillar structure VP.

The recesses 103R may extend to the second area A2 along the first direction X. In the second area A2, the recesses 103R may be divided by the interlayer dielectric layer 170. To take an example, the recesses 103R formed in the pad area A12 and the recesses 103R formed in the dummy pad area A22 may be separated by the interlayer dielectric layer 170. The second layers 103 of the pad area A12 and the second layers 103 of the dummy pad area A22 may be removed through the slit SL.

Figure 6D:
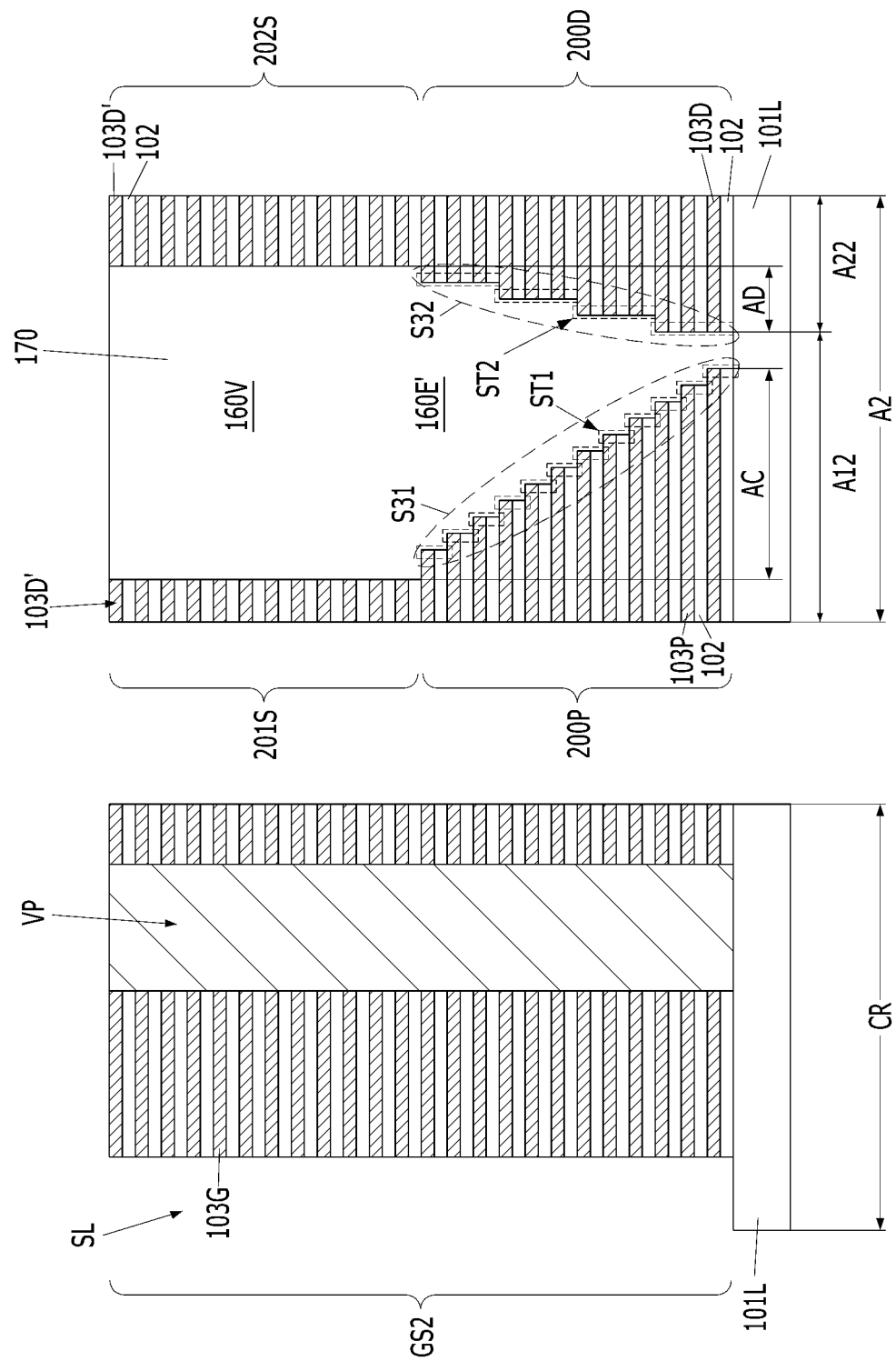

Referring to FIG. 6D, a gate electrode stack GS2 may be formed. The gate electrode stack GS2 may include a plurality of gate electrodes 103G. In order to form a plurality of gate electrodes 103G, the recesses 103R may be filled with a conductive material. This may be referred to as an 'inner filling process'.

The gate electrodes 103G may include tungsten. According to another embodiment of the present disclosure, the gate electrodes 103G may be a stack of titanium nitride and tungsten (TiN/W). The gate electrodes 103G may surround the vertical pillar structure VP. The gate electrodes 103G may be formed to be stacked with the first layers 102 interposed therebetween.

The gate electrodes 103G may extend horizontally to the peripheral region PR along the first direction X while being formed in the cell region CR. For example, the gate electrodes 103G may fill the recesses 103R of the cell region CR and the recesses 103R of the second area A2.

A portion of the gate electrode 103G formed in the pad area A12 of the second area A2 may be simply referred to as a 'gate pad 103P', and a portion of the gate electrode 103G formed in the dummy pad area A22 of the second area A2 may be simply referred to as a dummy gate pad 103D'.

A gate pad stack 200P in which the first layer 102 and the gate pad 103P are alternately stacked may be formed in the pad area A12. A dummy gate pad stack 200D in which the first layer 102 and the dummy gate pad 103D are alternately stacked may be formed in the dummy pad area A22.

The gate pad stack 200P and the dummy gate pad stack 200D may be isolated from each other by the asymmetric stepped trench 160E'. The gate pad stack 200P and the dummy gate pad stack 200D may be isolated from each other by the interlayer dielectric layers 170.

While the gate electrodes 103G are formed, the second layers 103 of the dummy stacks 120V and 140V may be replaced with dummy pads 103D'. The dummy pads 103D' and the gate electrodes 103G may be of the same material. The dummy stack 120V including the dummy pads 103D' may be simply referred to as a 'gate pad-side supporting stack 201S'. The dummy stack 140V including the dummy pads 103D' may be referred to as a 'dummy gate pad-side supporting stack 202S'.

The gate pad-side supporting stack 201S may be formed over the gate pad stack 200P, and the dummy gate pad-side supporting stack 202S may be formed over the dummy gate pad stack 200D. The gate pad-side supporting stack 201S may be formed by alternately stacking the first layer 102 and the dummy pad 103D'. The dummy gate pad-side supporting stack 202S may be formed by alternately stacking the first layer 102 and the dummy pad 103D'. The gate pad-side supporting stack 201S and the dummy gate pad-side supporting stack 202S may be isolated by the vertical trench 160V. The gate pad-side supporting stack 201S and the dummy gate pad-side supporting stack 202S may be isolated from each other by the interlayer dielectric layer 170.

The asymmetric stepped trench 160E' of FIG. 6D may be identical to the asymmetric stepped trench 160E' of FIG. 2G. The asymmetric stepped trench 160E' may have a tapered trench shape with a width reducing in the depth direction. The asymmetric stepped trench 160E' may include two sidewalls, and each of the two sidewalls may have a stepped shape. The asymmetric stepped trench 160E' may include a first stepped sidewall S31 and a second stepped sidewall S32. The first stepped sidewall S31 and the second stepped sidewall S32 may have an asymmetric sidewall profile. The first stepped sidewall S31 may be formed at an edge of the gate pad stack 200P, and the second stepped sidewall S32 may be formed at an edge of the dummy gate pad stack 200D.

The vertical trench 160V may include a first vertical sidewall V11 and a second vertical sidewall V12. The first vertical sidewall V11 may extend vertically from the first stepped sidewall S31, and the second vertical sidewall V12 may extend vertically from the second stepped sidewall S32. The first vertical sidewall V11 may be formed on one sidewall of the gate pad-side supporting stack 201S, and the second vertical sidewall V12 may be formed on one sidewall of the dummy gate pad-side supporting stack 2002S.

As described above, the first stepped sidewall S31 may be positioned in the pad area A12, and the second stepped sidewall S32 may be positioned in the dummy pad area A22. The first stepped sidewall S31 and the second stepped sidewall S32 may face each other. The first stepped sidewall S31 may have a greater slope than the second stepped sidewall S32. The first stepped sidewall S31 may have a gradual slope, and the second stepped sidewall S32 may have a steeper slope.

The first stepped sidewall S31 may include a plurality of first steps ST1, and the second stepped sidewall S32 may include a plurality of second steps ST2. The first steps ST1 may have a smoother tilt than the second steps ST2. The first steps ST1 may have a stack structure of two layers, and the second steps ST2 may have a stack structure of six layers. For example, the first steps ST1 may include a pair of the first layer 102 and the gate pad 103P, the second steps ST2 may include three pairs of the first layer 102 and the dummy gate pad 103D. The second steps ST2 may be higher than the first steps ST1. The first stepped sidewall S31 may be formed of 12 first steps ST1, and the second stepped sidewall S32 may be formed of four second steps ST2. The heights of the first stepped sidewall S31 and the second stepped sidewall S32 may be the same.

The first stepped sidewall S31 and the second stepped sidewall S32 may be asymmetric, and the area AD occupied by the second stepped sidewall S32 may be smaller than the area AC occupied by the first stepped sidewall S31. The area occupied by the dummy pad area A22 may be reduced by reducing the area AD occupied by the second stepped sidewall S32. Thus, the chip size of the vertical semiconductor device may be reduced.

From the perspective of the dummy pad area A22, the dummy pad area A22 may include a dummy body area A221 that occupies most of the dummy pad area A22, and a dummy pad contact area S222 in which the second stepped sidewall S32 is formed. Reduction in the area occupied by the second stepped sidewall S32 may refer to a reduction in the area occupied by the dummy pad contact area A222. Therefore, when the area occupied by the dummy pad contact area A222 is reduced, the area occupied by the dummy body area A221 may be increased. When the area occupied by the dummy body area A221 is increased, the structural stability of the dummy pad area A22 and the dummy gate pad-side supporting stack 202S may be increased.

Figure 6E:
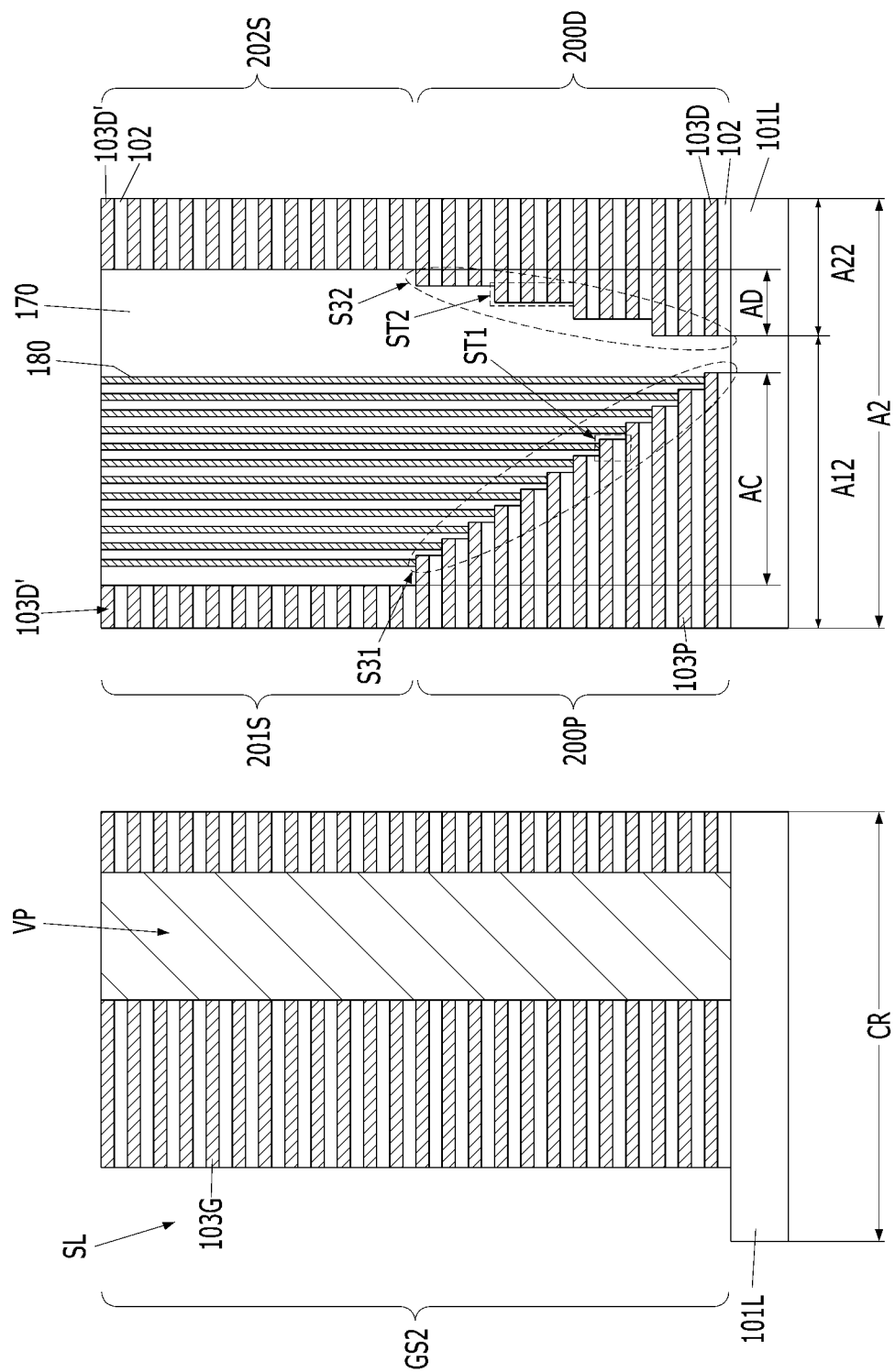

Referring to FIG. 6E, a plurality of contact plugs 180 may be formed. The contact plugs 180 may be coupled to the gate pad 103P by penetrating through the interlayer dielectric layer 170. In order to form the contact plugs 180, a contact hole forming process and a process of filling the contact holes with a conductive material may be performed. For example, a plurality of contact holes may be formed by etching the interlayer dielectric layer 170, each of which exposes the gate pad 103P, and then the contact holes may be filled with a metal material. The metal material may be planarized by a CMP process. As a result, contact plugs 180 that are respectively coupled to the gate pads 103P may be formed. The contact plugs 180 may not be coupled to the dummy gate pads 103D.

The present embodiment may minimize the size change of the steps when the gate pad stack 200P is formed stepwise by the shift W1 in FIG. 2E. Therefore, when the contact plugs 180 are formed, bridging of the gate pads by the punch may be prevented.

FIGS. 7A to 7D are views illustrating a method for fabricating a vertical semiconductor device according to a comparative example. The method for fabricating a vertical semiconductor device according to the comparative example may include the series of the processes illustrated in FIGS. 2A to 2F.

First, as shown in FIG. 2A, the multi-layered stack structure 104 may be formed over the lower structure 101L.

As illustrated in FIG. 2B, etch processes using the first mask 111 and slimming processes of the first mask 111 may be performed. However, according to the comparative example, the etch processes using the second mask 112 and the slimming processes of the second mask 112, and the etch processes using the third mask 113 and the slimming processes of the mask 113, which are shown in FIGS. 2C and 2D, may not be performed.

Figure 7A:
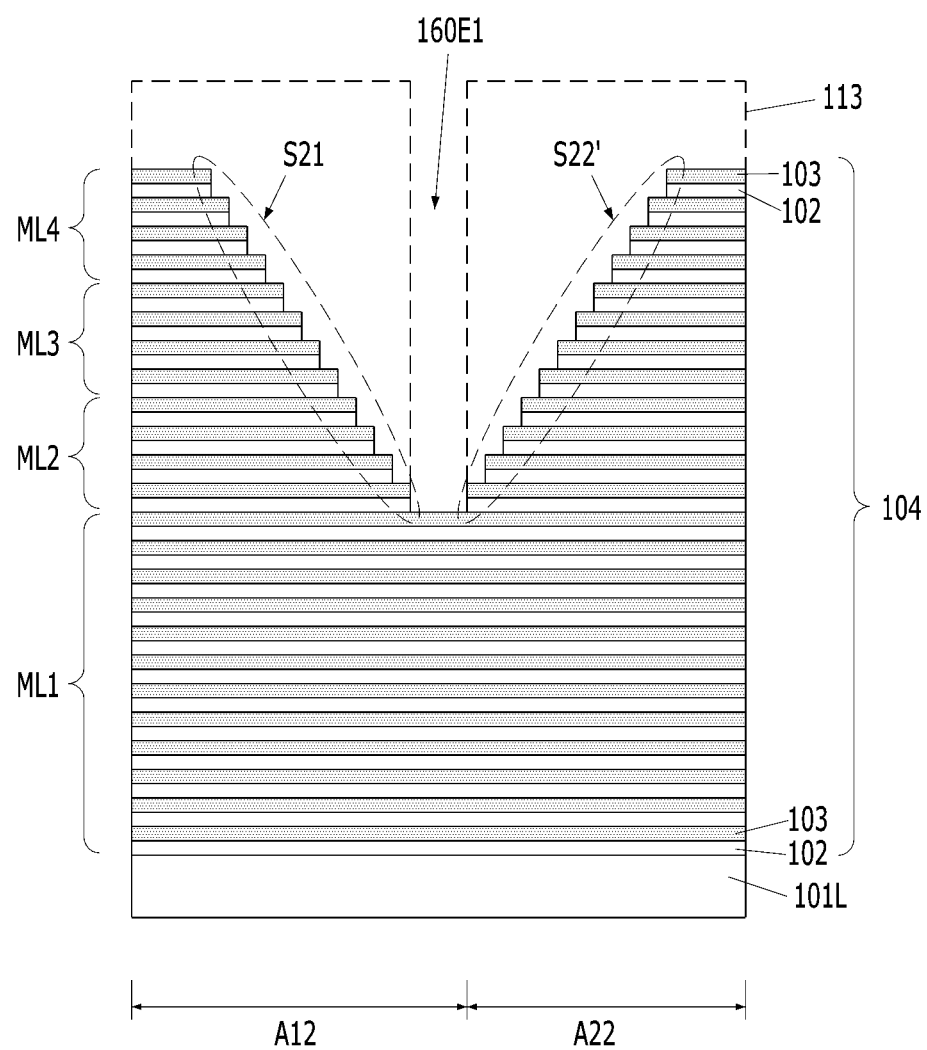
FIGS. 7A to 7D are views illustrating a method for fabricating a vertical semiconductor device according to a comparative example.

As a result, according to the comparative example, the symmetric stepped trench 160E1 shown in FIG. 7A may be formed by repeatedly performing the etch processes using only the first mask 111 and the slimming processes. The symmetric stepped trench 160E1 of FIG. 7A differs from the asymmetric stepped trench 160E of FIG. 2D. Whereas the symmetric stepped trench 160E1 has a first stepped sidewall S21 and a second stepped sidewall S21 that are asymmetrical to each other, the symmetric stepped trench 160E1 may have a first stepped sidewall S21' and a second stepped sidewall S22'.

Figure 7B:
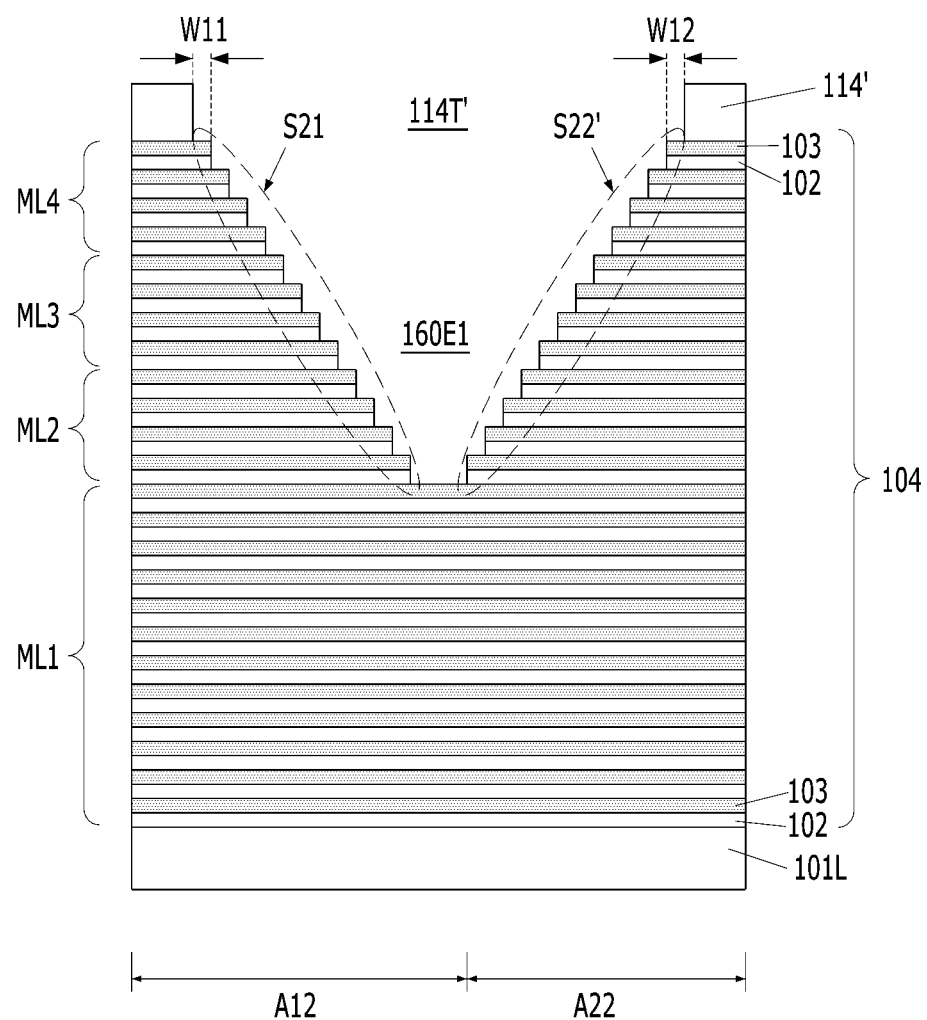

Referring to FIG. 7B, a fourth mask 114' may be formed over the symmetric stepped trench 160E1. The fourth mask 114' of the comparative example may include a fourth opening 114T'. One sidewall of the fourth opening 114T' may be shifted by the first width W11. For example, a mask starting point of the fourth mask 114', for example, an edge of the uppermost first pattern 121 corresponding to the pad area A12, may be formed to be shifted to the first width W11. Another sidewall of the fourth opening 114T' may be shifted by the second width W12. The sidewall of the fourth opening 114T' may be formed by shifting the mask starting point of the fourth mask 114', for example, an edge of the uppermost first dummy pattern 141 corresponding to the dummy pad area A22, to the second width W12. The first width W11 and the second width W12 may be the same. The first width W11 may be the same width as each step. The first width W11 of FIG. 7B may be smaller than the first width W1 of FIG. 2E.

Figure 7C:
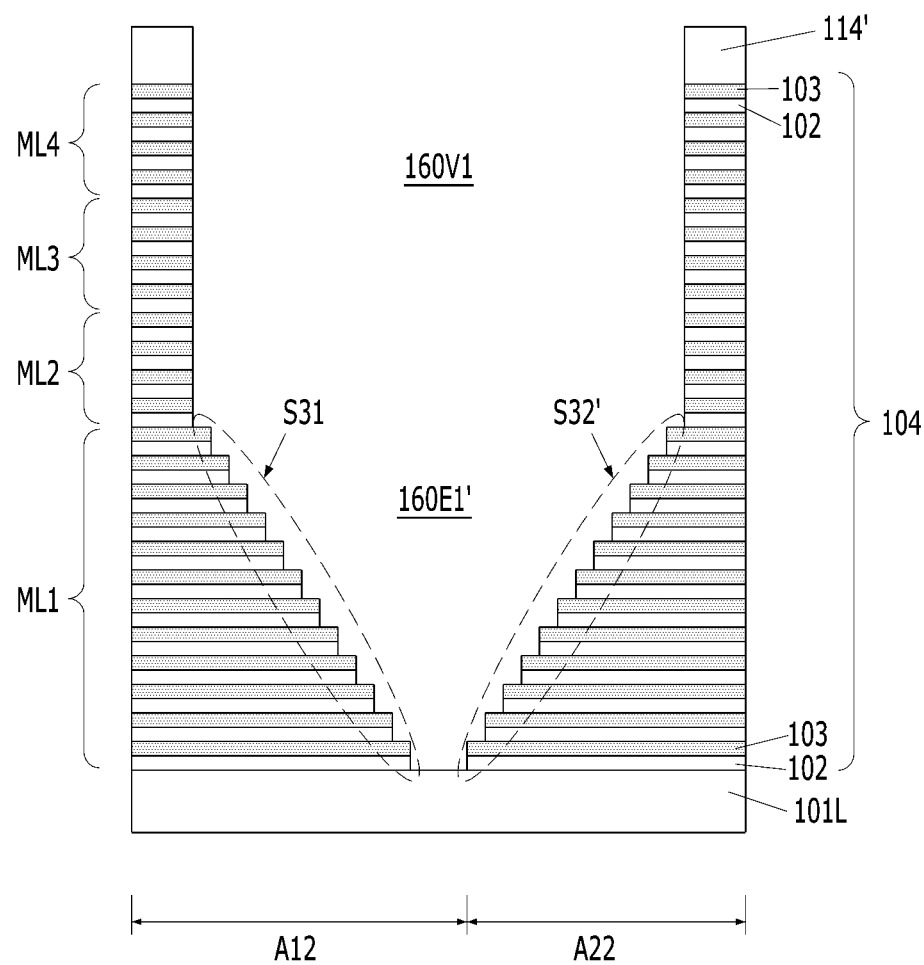

Referring to FIG. 7C, an etch process using the fourth mask 114' may be performed. As a result, a vertical trench 160V1 and a symmetric stepped trench 160E1' may be formed.

Whereas the asymmetric stepped trenches 160E in accordance with the embodiments of the present disclosure have the first stepped sidewall S31 and the second stepped sidewall S32, the symmetric stepped trench 160E1' may have the first stepped sidewall S31 and the second stepped sidewall S32' that are symmetrical to each other.

Figure 7D:
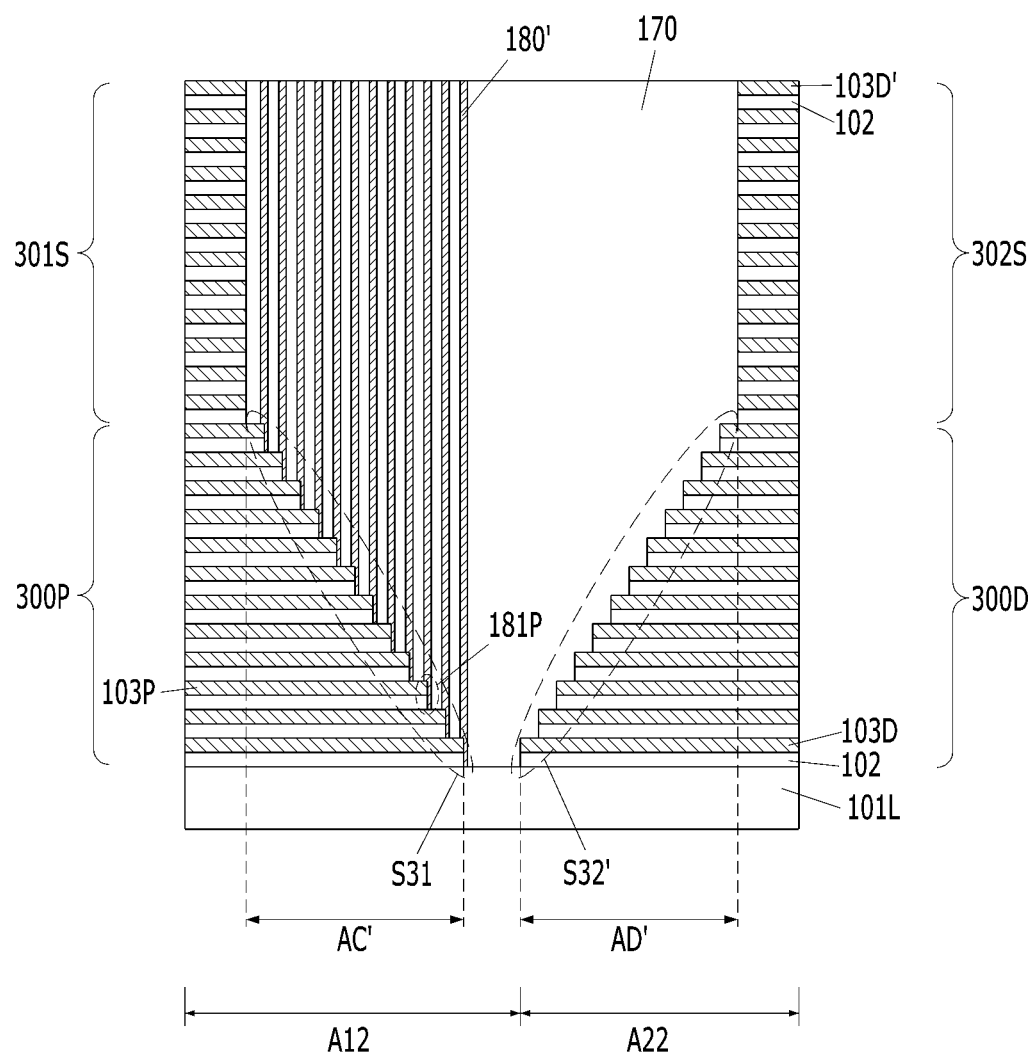

Subsequently, the series of the processes shown in FIGS. 6A to 6E may be performed. Referring to FIG. 7D, the interlayer dielectric layer 170, the gate pad 103P, the dummy gate pad 103D, and the contact plug 180' may be sequentially formed.

The vertical semiconductor device according to the comparative example may include a gate pad stack 300P and a dummy gate pad stack 300D that are formed over the lower structure 101L. The gate pad stack 300P may be formed by alternately stacking a plurality of first layers 102 and a plurality of gate pads 103P. The dummy gate pad stack 300D may be formed by alternately stacking a plurality of first layers 102 and a plurality of dummy gate pads 103D. The gate pad-side supporting stack 301S may be formed over the gate pad stack 300P, and the dummy gate pad-side supporting stack 302S may be formed over the dummy gate pad stack 300D.

The gate pad stack 300P and the dummy gate pad stack 300D may be isolated by the symmetric stepped trench 160E1'. The gate pad-side supporting stack 301S and the dummy gate pad-side supporting stack 302S may be isolated by the vertical trench 160V1. The symmetric stepped trench 160E1' and the vertical trench 160V1 may be filled with the interlayer dielectric layer 170, and a plurality of contact plugs 180' may be formed by penetrating through the interlayer dielectric layer 170.

As described above, since the etch process is performed by using the fourth mask 114' in the comparative example, the size of the steps providing the symmetric stepped trench 160E1' may vary substantially. For example, one or more of the etching processes may cause polymers to adhere to a photoresist mask, causing the steps to become offset relative to a planned orientation. On the other hand, since the etch process is performed by using the fourth mask 114' which is shifted more than the fourth mask 114' of the comparative example, the size of the steps providing the asymmetric stepped trench may vary insubstantially, thereby preventing a bridging phenomenon.

Since the size of the steps varies substantially in the comparative example, a punching phenomenon 181P may be caused when the contact plug 180' is formed, as shown in FIG. 7D. The punching phenomenon 181P may cause a bridge between the gate pads 103P.

Since the size of the steps is minimized in embodiments of the present disclosure, the punching phenomenon may be prevented while the contact plug 180 is formed, thereby preventing a bridge between the gate pads 103P.

FIGS. 8A to 8M are views illustrating an example of a method for fabricating a vertical semiconductor device in accordance with another embodiment of the present disclosure. FIGS. 8A to 8M are views illustrating the method for fabricating a vertical semiconductor device taken along the line B-B' shown in FIG. 1A.

Figure 8A:
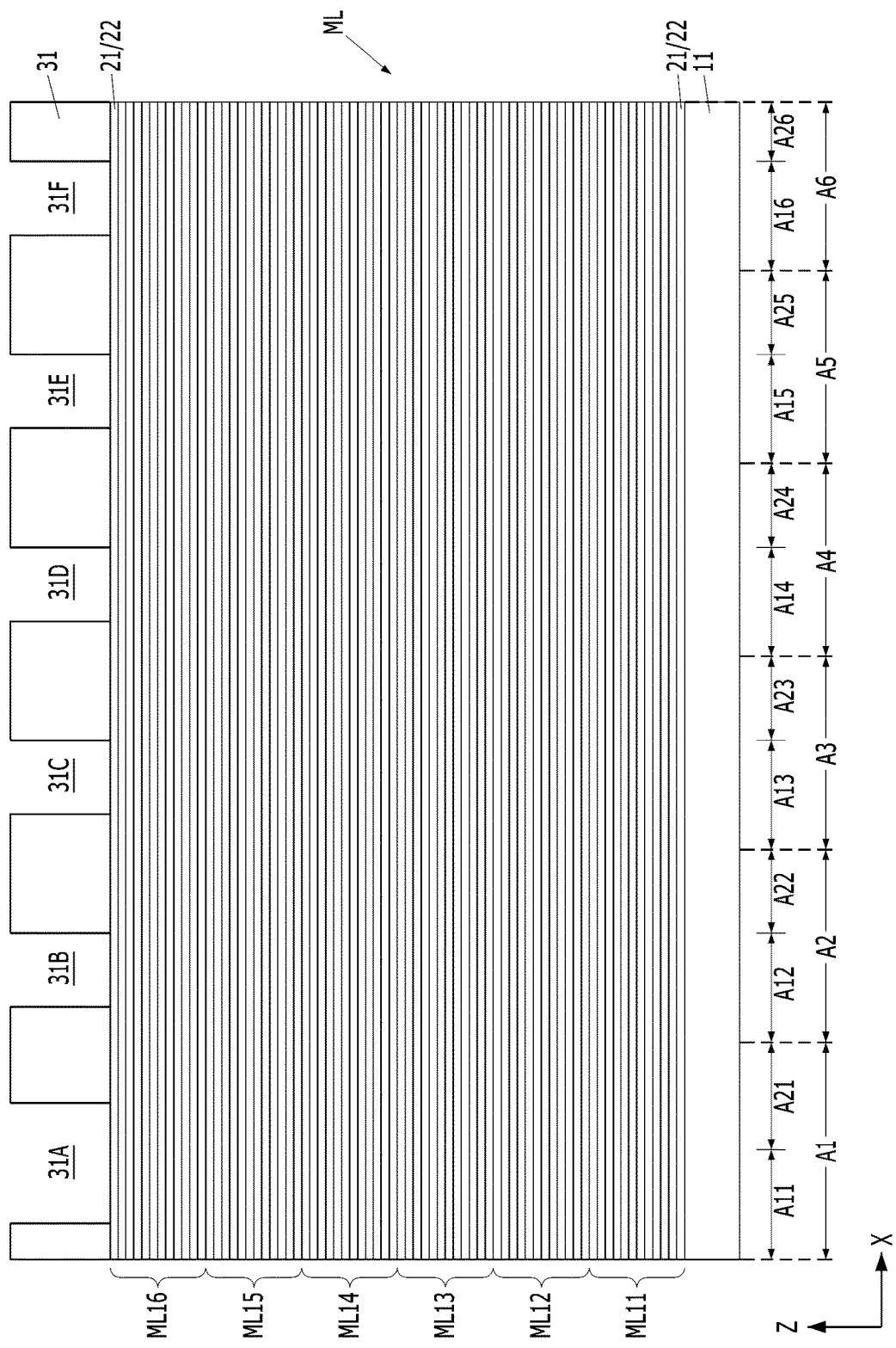
FIGS. 8A to 8M are views illustrating an example of a method for fabricating a vertical semiconductor device in accordance with another embodiment of the present disclosure.

Referring to FIG. 8A, a multi-layered stack structure ML may be formed over the substrate 11. The multi-layered stack structure ML may include first to sixth multi-layered stacks ML11 to ML16.

The substrate 11 may include a cell region CR and a peripheral region PR which extends from the cell region CR. The peripheral region PR may include first to sixth areas A1 to A6. The first to sixth areas A1 to A6 may be arranged serially along the first direction X, which is parallel to the substrate 11. The first area A1 may be closest to the cell region CR, while the sixth area A6 may be farthest from the cell region CR. The first to sixth areas A1 to A6 may include the pad areas A11 to A16 and the dummy pad areas A21 to A26, respectively. The pad areas A11 to A16 may be the areas to be coupled with the contact plugs, and the dummy pad areas A21 to A26 may be the areas that are not coupled with any contact plugs. The pad areas A11 to A16 may extend from the cell region CR. As will be described later, the pad areas A11 to A16 and the dummy pad areas A21 to A26 may be isolated from each other by the asymmetric stepped trenches.

The substrate 11 may be of a material suitable for semiconductor processing. The substrate 11 may include a semiconductor substrate. The substrate 11 may be a silicon-containing material. The substrate 11 may include silicon, monocrystalline silicon, polysilicon, amorphous silicon, silicon germanium, monocrystalline silicon germanium, polycrystalline silicon germanium, carbon-doped silicon, or a combination thereof. The substrate 11 may include other semiconductor materials, such as germanium. The substrate 11 may include a III/V-group semiconductor substrate, for example, a compound semiconductor substrate, such as GaAs. The substrate 11 may include an SOI (Silicon-On-Insulator) substrate.

Each of the first to sixth multi-layered stacks ML11 to ML16 may include a first layer 21 and a second layer 22 that are alternately stacked. The first layer 21 and the second layer 22 may be alternately stacked in the second direction Z.

The second layer 22 may be formed of a material which is different from that of the first layer 21. For example, the first layer 21 may include a dielectric material, and the second layer 22 may be formed of a sacrificial material. The sacrificial material may be formed of a sacrificial dielectric material having an etch selectivity to the first layer 21. The first layer 21 may be formed of silicon oxide, and the second layer 22 may be formed of silicon nitride.

According to another embodiment of the present disclosure, both of the first layer 21 and the second layer 22 may be formed of a silicon-containing material. For example, the first layer 21 may be formed of undoped polysilicon, and the second layer 22 may be formed of doped polysilicon. Herein, the doped polysilicon may refer to polysilicon doped with an impurity, such as boron, arsenic, or phosphorous, and the undoped polysilicon may refer to polysilicon that is not doped with an impurity.

Hereinafter, for the sake of convenience in explanation, a combination of the first layer 21 and the second layer 22 may be shown as a single layer (which is represented by a reference numeral '21/22').

A first mask 31 may be formed over the sixth multi-layered stack ML16. The first mask 31 may include a photoresist pattern. The first mask 31 may correspond to the first mask 111 of FIG. 2B and FIG. 3A. The first mask 31 may include first openings 31A to 31F that expose the first to sixth pad areas A11 to A16. Each of the first openings 31A to 31F may correspond to the first opening 111T of FIG. 3A.

An etch process using the first mask 31 and a slimming process may be repeatedly performed. For example, the etch process of the sixth multi-layered stack ML6 and the slimming process of the first mask 31 may be repeated.

Figure 8B:
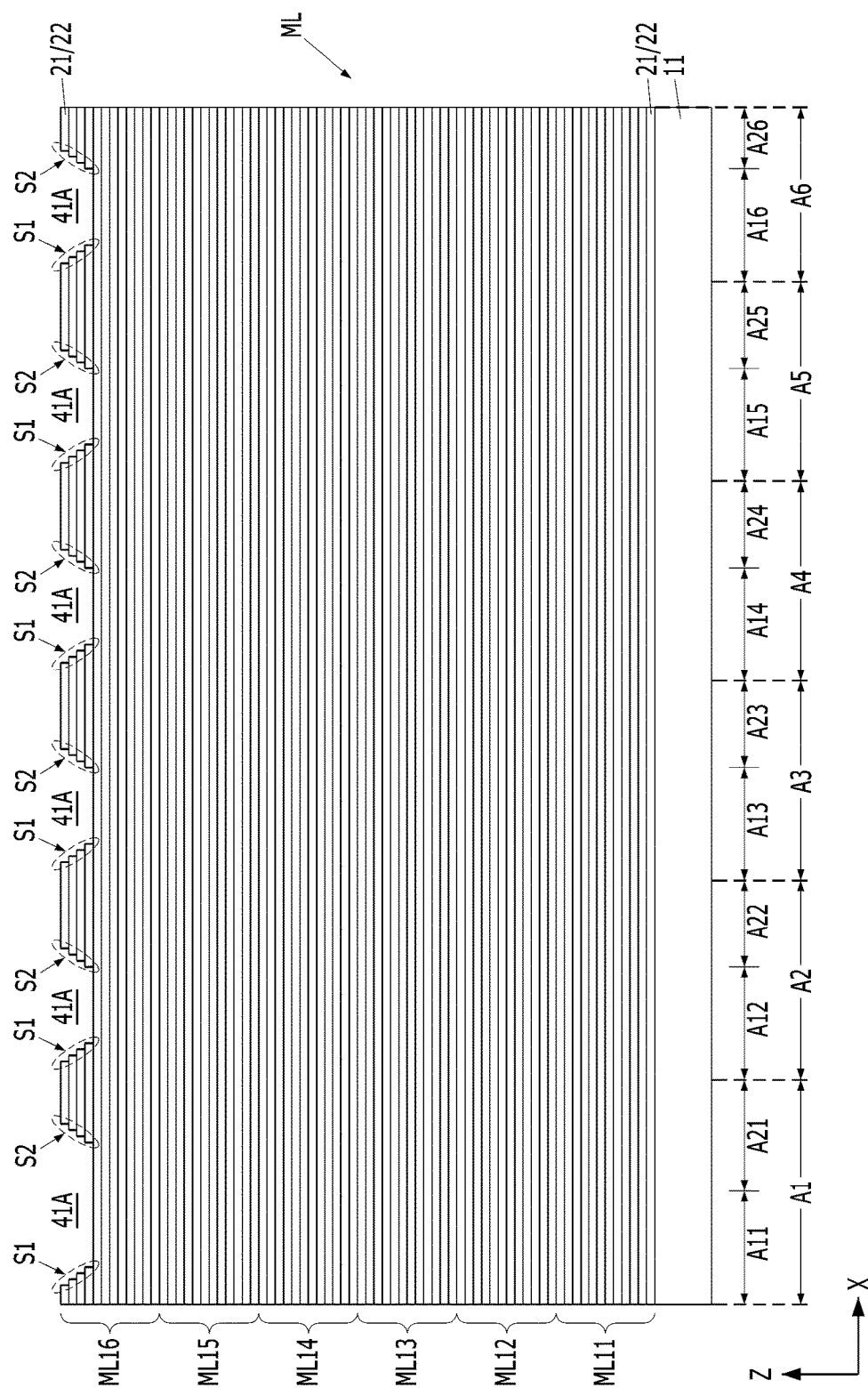

Thus, as shown in FIG. 8B, a plurality of symmetric trenches 41A may be formed. The symmetric trenches 41A may have a first stepped sidewall S1 and a second stepped sidewall S2 facing each other, and the first stepped sidewall S1 and the second stepped sidewall S2 may be symmetrical to each other. The first stepped sidewall S1 may be provided by a stack of patterns, and the second stepped sidewall S2 may be provided by a stack of dummy patterns. The symmetric trenches 41A, the patterns and the dummy patterns, may be formed according to the processes shown in FIGS. 3A to 3F.

The first mask 31 may be removed after the symmetric trenches 41A are formed.

Figure 8C:
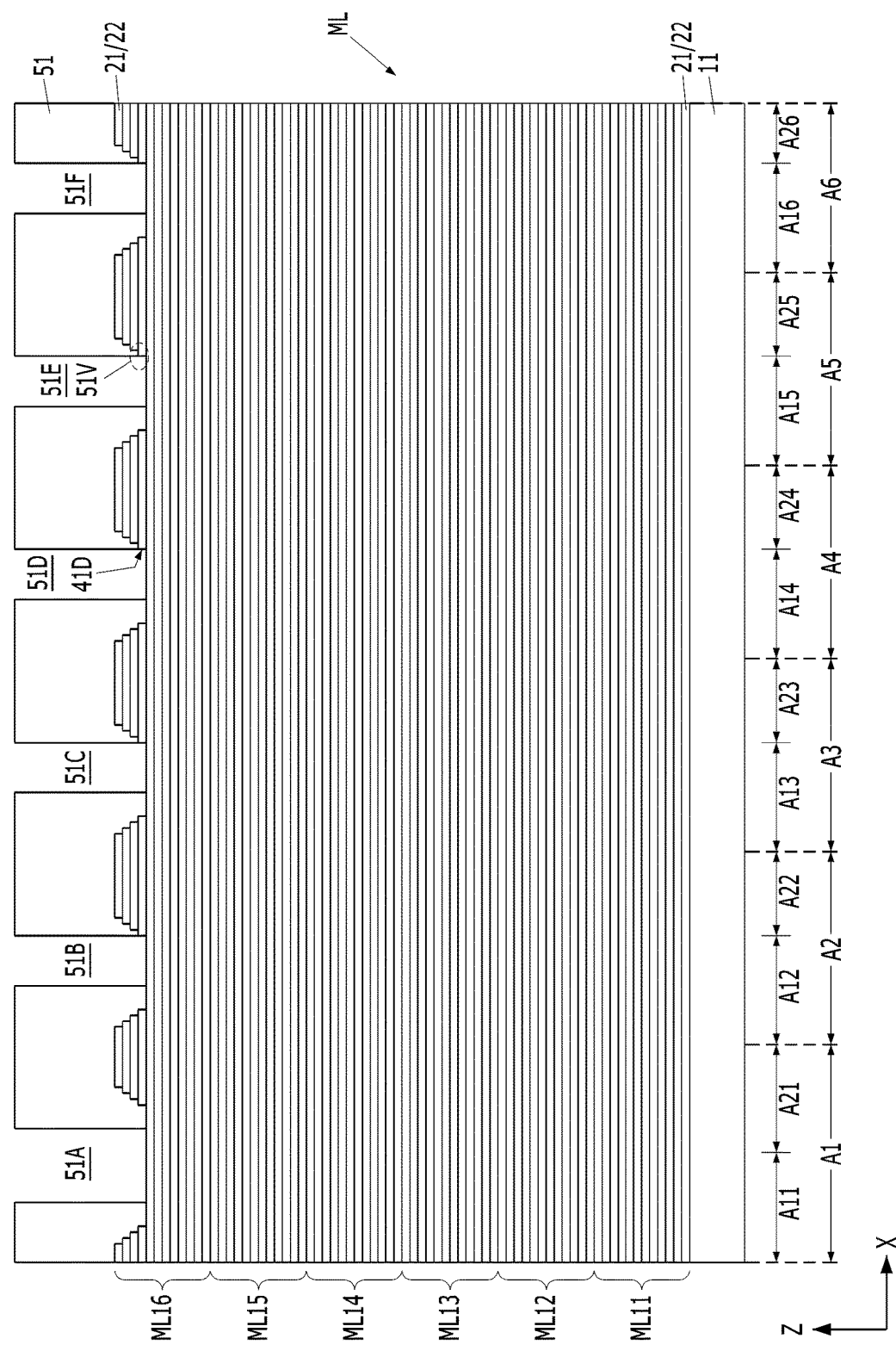

Referring to FIG. 8C, a second mask 51 partially exposing the symmetric trenches 41A may be formed. The second mask 51 may include a photoresist pattern. The second mask 51 may correspond to the second mask 112 of FIGS. 2C and 4A.

The second mask 51 may include second openings 51A to 51F that respectively expose the first to sixth pad areas A11 to A16. The second opening 51A for opening the first pad area A1 among the second openings 51A to 51F may cover the first stepped sidewall S1 and the second stepped sidewall S2 of the symmetric trench 41A. The remaining second openings 51B to 51F may have a shape corresponding to the second opening 112T of FIG. 4A. For example, one sidewall of each of the second openings 51B to 51F may cover the first stepped sidewall S1, and another sidewall of each of the second openings 51B to 51F may be self-aligned to the sidewall of the lowermost dummy pattern 41D of the second stepped sidewall S2.

As described above, when the second mask 51 is formed, the mask starting points of the dummy pad areas A22 to A26 may be formed to overlap (51V) with the lowermost dummy pattern 41D.

Subsequently, the etch process using the second mask 51 and the slimming process of the second mask 51 may be repeatedly performed.

Figure 8D:
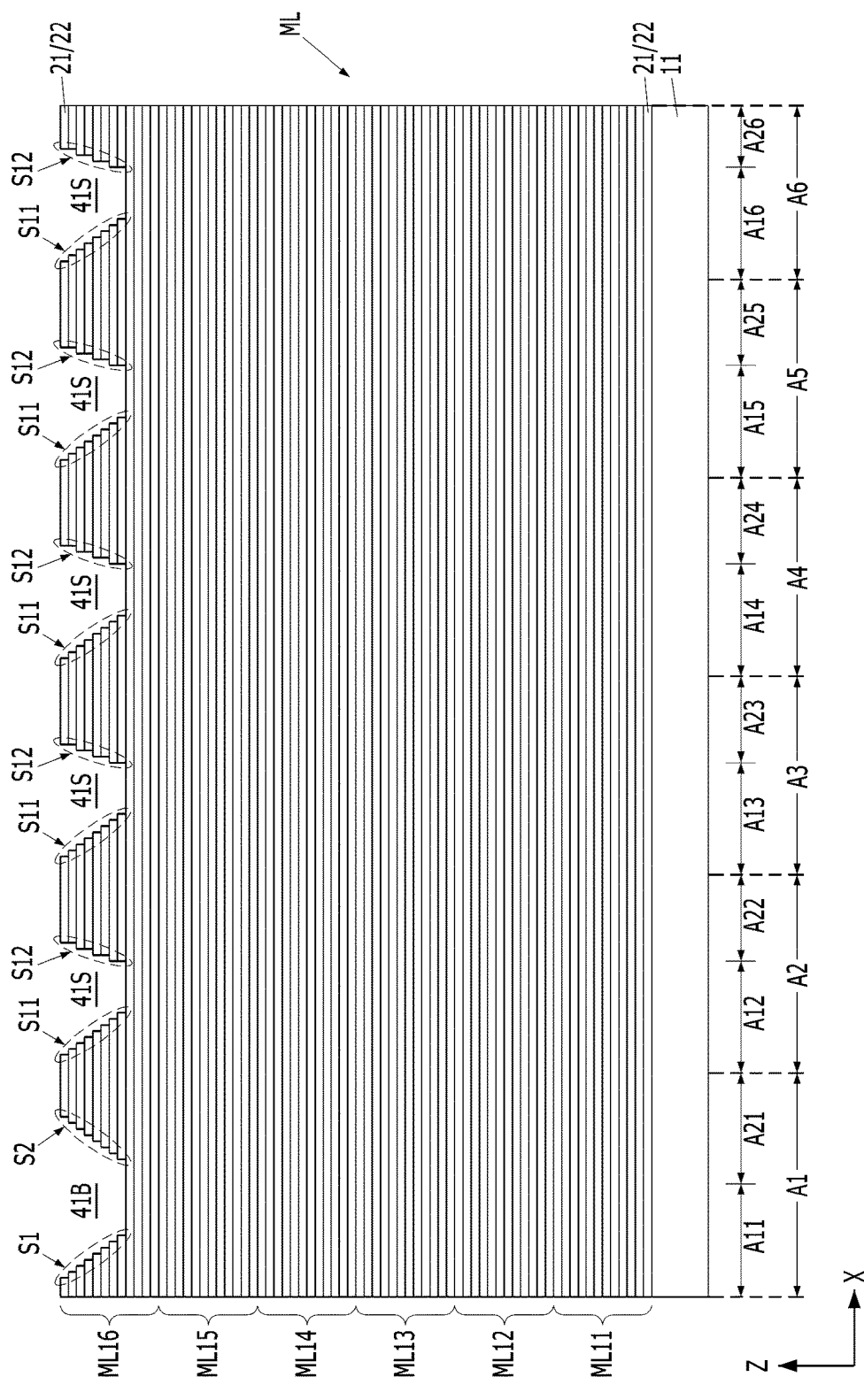

As a result, as shown in FIG. 8D, a symmetric trench 41B and asymmetric stepped trenches 41S may be formed. The symmetric trenches 41A may have stepped sidewalls S1 and S2 facing each other, and the stepped sidewalls S1 and S2 may be symmetrical to each other.

The asymmetric stepped trenches 41S may have the first stepped sidewall S11 and the second stepped sidewall S12 facing each other, and the first stepped sidewall S11 and the second stepped sidewall S12 may be asymmetrical to each other. The first stepped sidewall S11 may be provided by a stack of patterns, and the second stepped sidewall S12 may be provided by a stack of dummy patterns.

The first mask 31 may be removed after the symmetric trench 41B and the asymmetric stepped trenches 41S are formed.

The symmetric trench 41B may be formed in the first area A1, and the asymmetric stepped trenches 41S may be formed in the second to sixth areas A2 to A6. The symmetric trench 41B and the asymmetric stepped trenches 41S may be formed simultaneously. From the perspective of a top view, each of the symmetric trench 41B and the asymmetric stepped trenches 41S may have a linear shape.

For the method of repeatedly performing the etch process using the second mask 51 and the slimming process of the second mask 51, FIGS. 4A to 4G may be referred to.

The symmetric trench 41B may be what the symmetric trench 41A formed in the first area A1 of FIG. 8C is vertically downwardly extended. The symmetric trench 41B may include more steps than the symmetric trench 41A. The symmetric trench 41B may be deeper than the symmetric trench 41A. The asymmetric stepped trenches 41S may be what the symmetric trenches 41A formed in the second to sixth areas A2 to A6 are vertically downwardly extended.

Figure 8E:
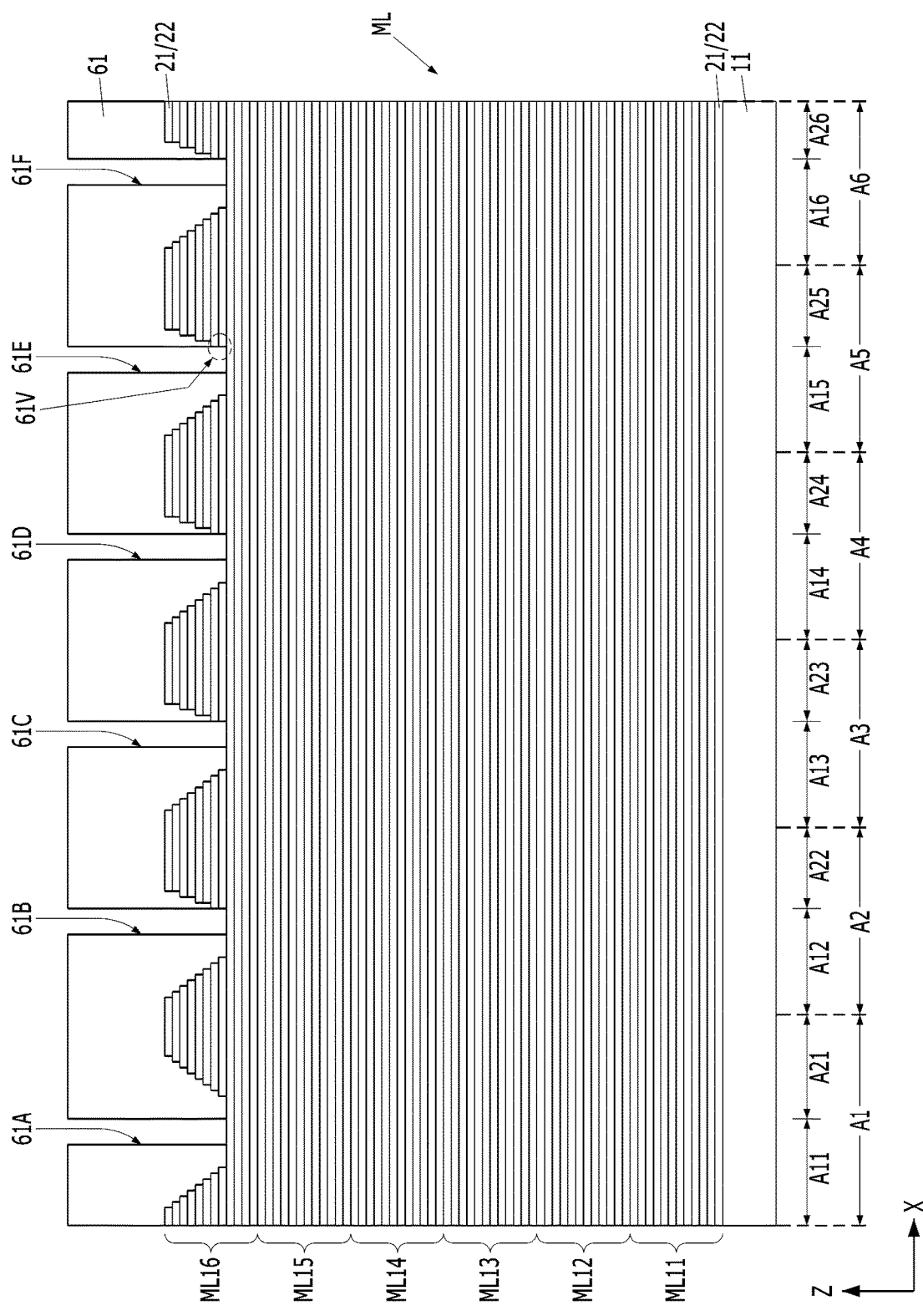

Referring to FIG. 8E, a third mask 61 which partially exposes each of the symmetric trench 41B and the asymmetric stepped trenches 41S may be formed. The third mask 61 may include a photoresist pattern. The third mask 61 may correspond to the third mask 113 of FIGS. 2D and 5A.

The third mask 61 may include third openings 61A to 61F that respectively expose the first to sixth pad areas A11 to A16. The third opening 61A opening the first pad area A11 among the third openings 61A to 61F may cover stepped sidewalls of the symmetric trench 41B. The remaining third openings 61B to 61F may have the same shape as the third opening 113T of FIG. 5A. For example, one sidewall of each of the third openings 61B to 61F may cover the sidewall of the lowermost pattern, and another sidewall of each of the third openings 61B to 61F may be self-aligned to the sidewall of the lowermost dummy pattern.

Thus, when the third mask 61 is formed, the mask starting points of the dummy pad areas A22 to A26 may be formed to overlap (61V) with the lowermost dummy pattern.

Figure 8F:
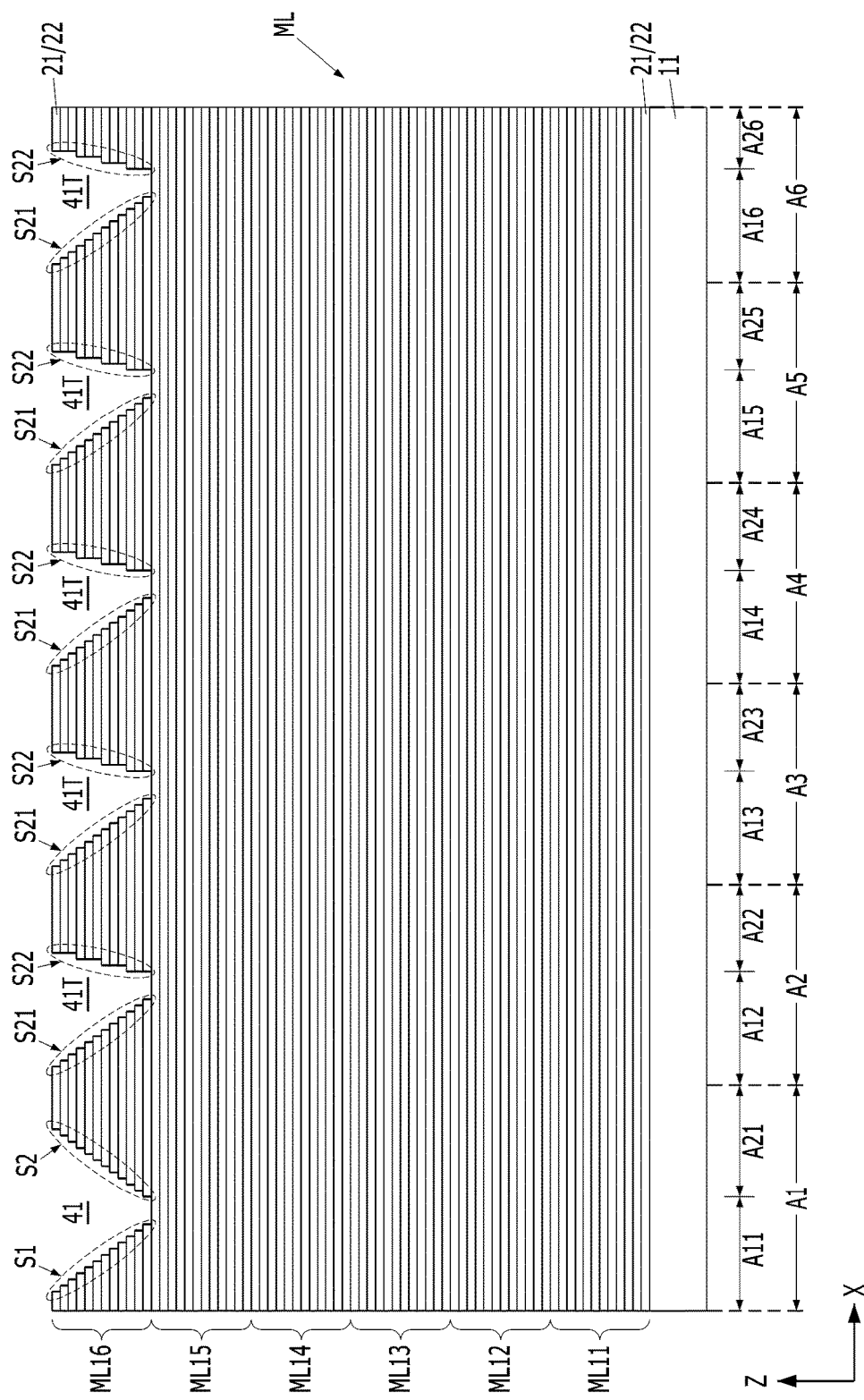

Referring to FIG. 8F, the etch process using the third mask 61 and the slimming process of the third mask 61 may be repeatedly performed. As a result, a symmetric trench 41 and asymmetric stepped trenches 41T may be formed. The symmetric trench 41 may be formed in the first area A1, and the asymmetric stepped trenches 41T may be formed in the second to sixth areas A2 to A6. The symmetric trench 41 and the asymmetric stepped trenches 41T may be formed simultaneously. From the perspective of a top view, each of the symmetric trench 41 and the asymmetric stepped trenches 41T may have a linear shape.

For the method of forming the asymmetric stepped trenches 41T by repeating the etch process using the third mask 61 and the slimming process of the third mask 61, FIGS. 5A to 5D may be referred to.

The symmetric trench 41 may be what the symmetric trench 41B formed in the first area A1 of FIG. 8D is vertically downwardly extended. The symmetric trench 41 may include more steps than the symmetric trenches 41B. The symmetric trench 41 may be deeper than the symmetric trench 41B. The asymmetric stepped trenches 41T may be what the asymmetric stepped trenches 41S formed in the second to sixth areas A2 to A6 are vertically downwardly extended. The symmetric trench 41 may include the stepped sidewalls S1 and S2 facing each other, and the stepped sidewalls S1 and S2 may be symmetrical to each other.

The asymmetric stepped trenches 41T may have a first stepped sidewall S21 and a second stepped sidewall S22 facing each other, and the first stepped sidewall S21 and the second stepped sidewall S22 may be asymmetrical to each other. The first stepped sidewall S21 may be provided by a stack of patterns, and the second stepped sidewall S22 may be provided by a stack of dummy patterns.

The third mask 61 may be removed after the symmetric trench 41 and the asymmetric stepped trenches 41T are formed.

The symmetric trench 41 and the asymmetric stepped trenches 41T may be formed in the sixth multi-layered stack ML16. The symmetric trench 41 may be formed in the first area A1.

Figure 8G:
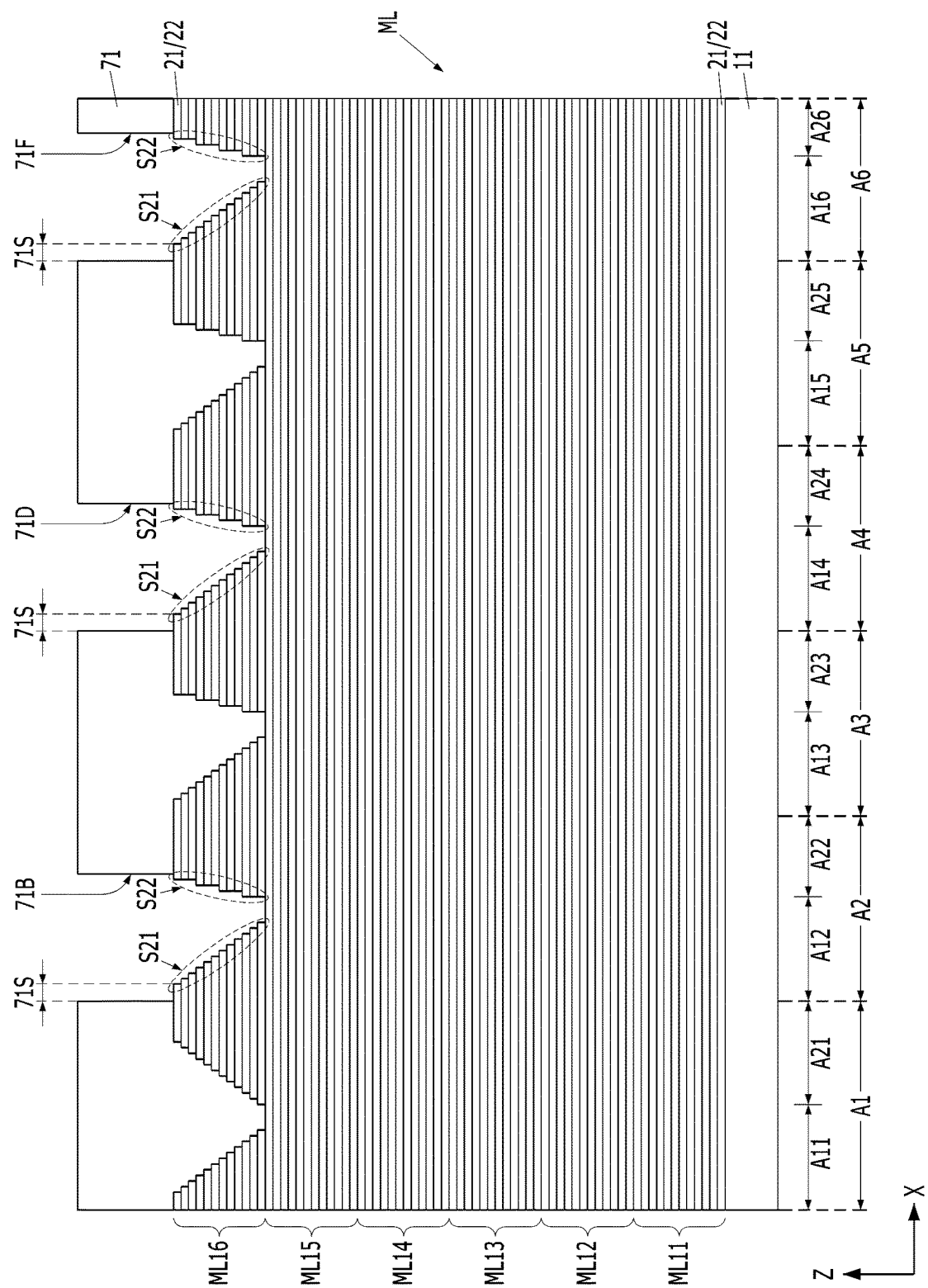

Referring to FIG. 8G, a fourth mask 71 partially exposing the asymmetric stepped trenches 41T may be formed. The fourth mask 71 may include a photoresist pattern. The fourth mask 71 may correspond to the fourth mask 114 of FIG. 2E.

The fourth mask 71 may include fourth openings 71B, 71D and 71F exposing the second area A2, the fourth area A4, and the sixth area A6, respectively. The fourth mask 71 may block the first area A1, the third area A3, and the fifth area A5. When the fourth openings 71B, 71D and 71F are formed, one sidewall of each of the fourth openings 71B, 71D, and 71F may be shifted in the first direction X. For example, the mask starting points of the second area A2, the fourth area A4, and the sixth area A6 may be formed to be shifted (71S) in the first direction X from the uppermost pattern.

Figure 8H:
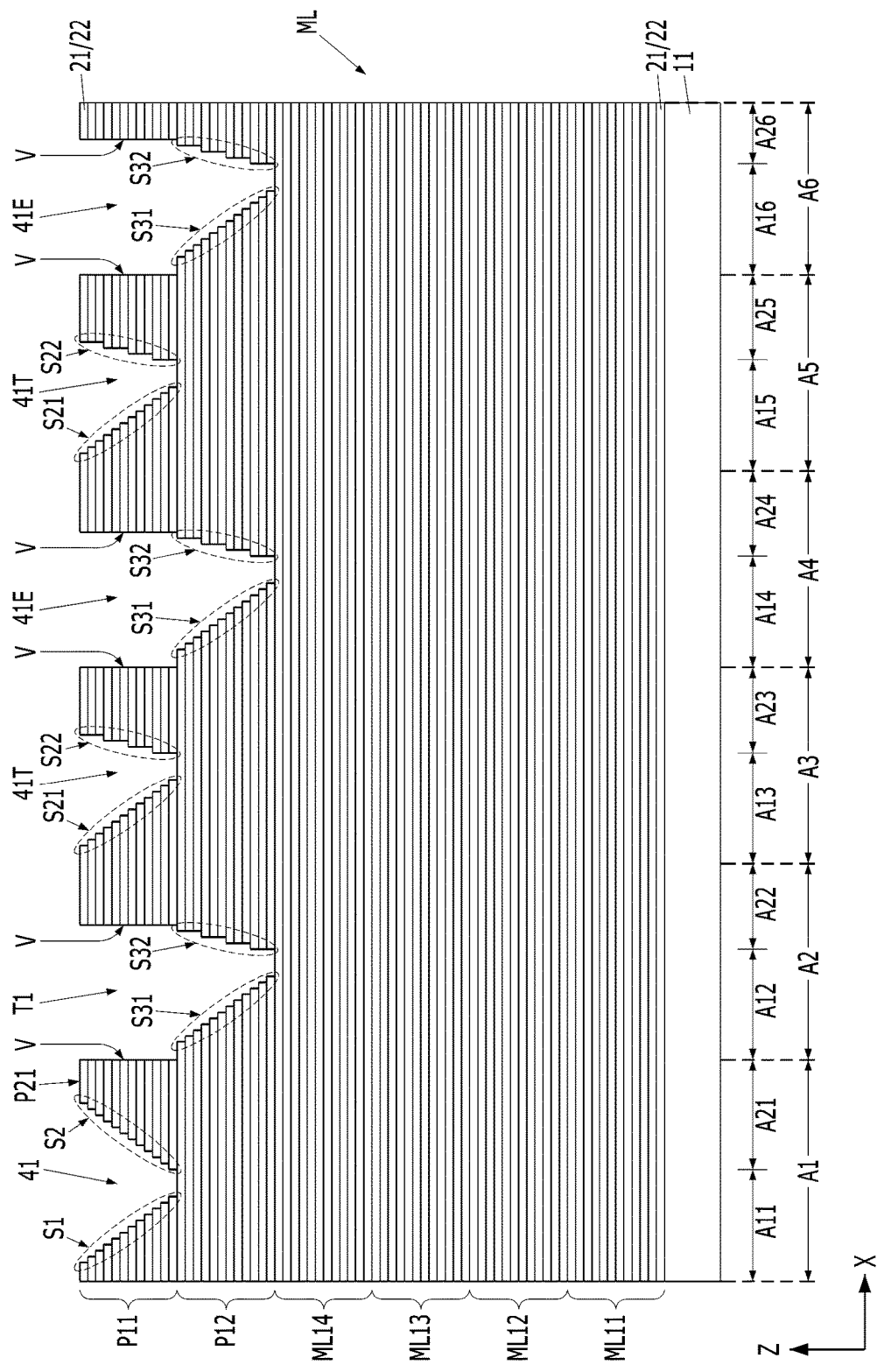

Referring to FIG. 8H, the asymmetric stepped trenches 41T and the sixth multi-layered stack ML16 that are exposed through the fourth openings 71B, 71D and 71F may be etched by using the fourth mask 71. Subsequently, the fifth multi-layered stack ML15 below the asymmetric stepped trenches 41T may be etched. The etch process using the fourth mask 71 may include an etch-back process. For the etch process using the fourth mask 71, FIG. 2F may be referred to.

By the etch process, first extended asymmetric stepped trenches 41E may be formed. Each of the first extended asymmetric stepped trenches 41E may include the first and second stepped sidewalls S31 and S32 and vertical sidewalls V extended vertically from the first and second stepped sidewalls S31 and S32. The etch process for forming the first and second stepped sidewalls S31 and S32 may include an etch process of the fifth multi-layered stack ML15, and the etch process for forming the vertical sidewalls V may include the etch process of the asymmetric stepped trenches 41T and the sixth multi-layered stack ML16. The fifth multi-layered stack ML15, the asymmetric stepped trenches 41T, and the sixth multi-layered stack ML16 may be exposed to the etch-back process to form the first extended asymmetric stepped trenches 41E. The vertical sidewalls V may have a symmetric non-stepped profile, and the first and second stepped sidewalls S31 and S32 may have an asymmetric stepped profile. The non-stepped profile may refer to a step-free vertical sidewall.

The first extended asymmetric stepped trenches 41E may be what the profile of the asymmetric stepped trenches 41T is transcribed. The first extended asymmetric stepped trench formed in the second area A2 among the first extended asymmetric stepped trenches 41E may be simply referred to as a 'first asymmetric stepped trench T1'. The first asymmetric stepped trenches T1 may be formed by etching the fifth multi-layered stack ML15 and the sixth multi-layered stack ML16 of the second area A2.

After the first extended asymmetric stepped trenches 41E are formed, the fourth mask 71 may be removed.

After the first asymmetric stepped trenches T1 are formed, the first pad stack P11 and the first dummy pad stack P21 may be defined in the first area A1. The first pad stack P11 and the first dummy pad stack P21 may be divided by the symmetric trench 41. The second pad stack P12 may be defined in the second area A2 by the first asymmetric stepped trench T1.

Figure 8I:
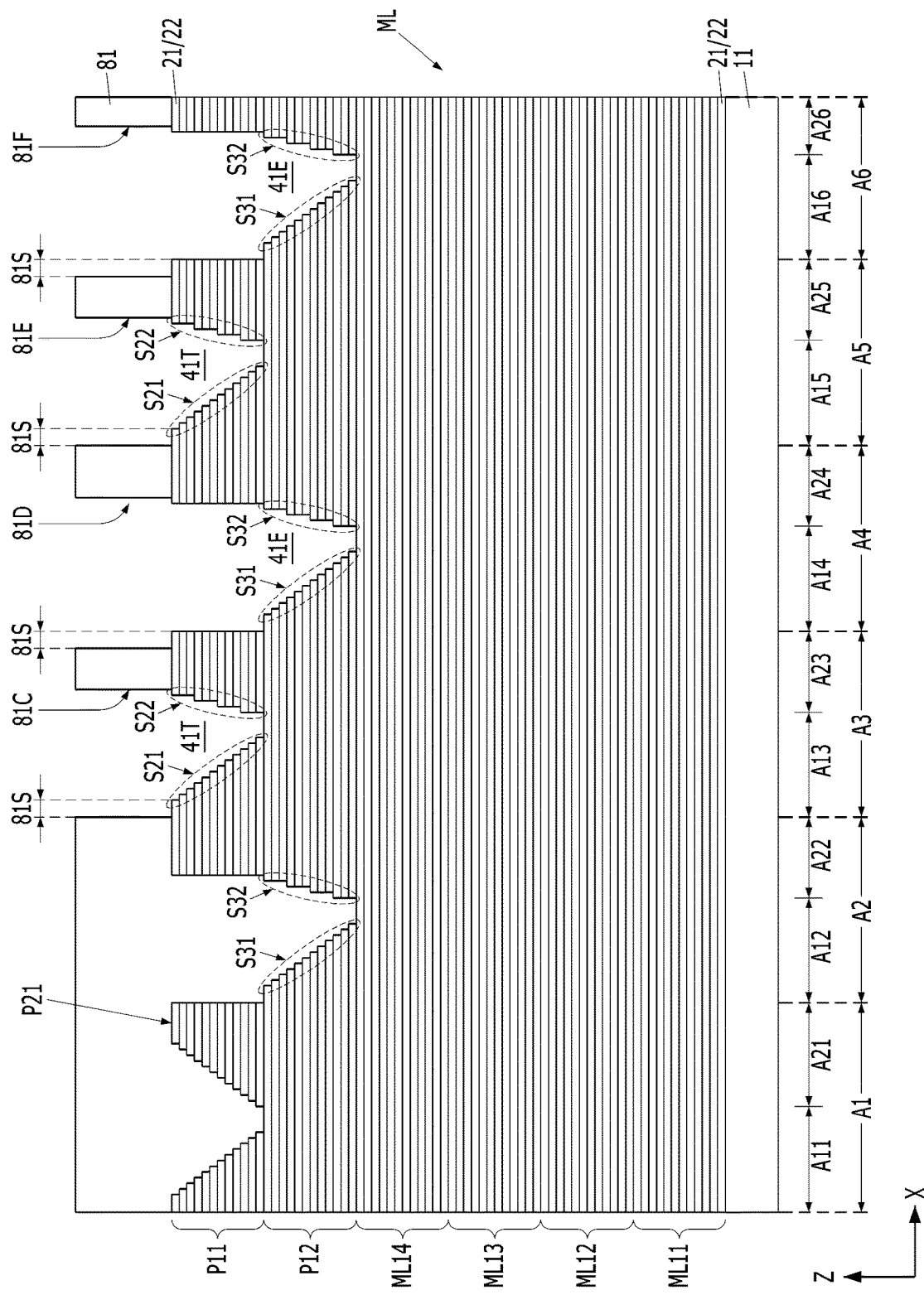

Referring to FIG. 8I, a fifth mask 81 may be formed. The fifth mask 81 may include a photoresist pattern. The fifth mask 81 may include fifth openings 81C, 81D, 81E and 81F that expose the third area A3 to the sixth area A6, respectively. The fifth mask 81 may block the first area A1 and the second area A2. One sidewall of each of the fifth openings 81C, 81D, 81E and 81F may be shifted (81S) in the first direction X when the fifth openings 81C, 81D, 81E and 81F are formed. For example, the mask starting points of the third area A3 to the sixth area A6 may be formed to be shifted (81S) in the first direction X from the uppermost pattern.

The fifth openings 81C, 81D, 81E and 81F may expose the asymmetric stepped trenches 41T and the first extended asymmetric stepped trenches 41E. The first asymmetric stepped trench T1 may be blocked by the fifth mask 81.

Figure 8J:
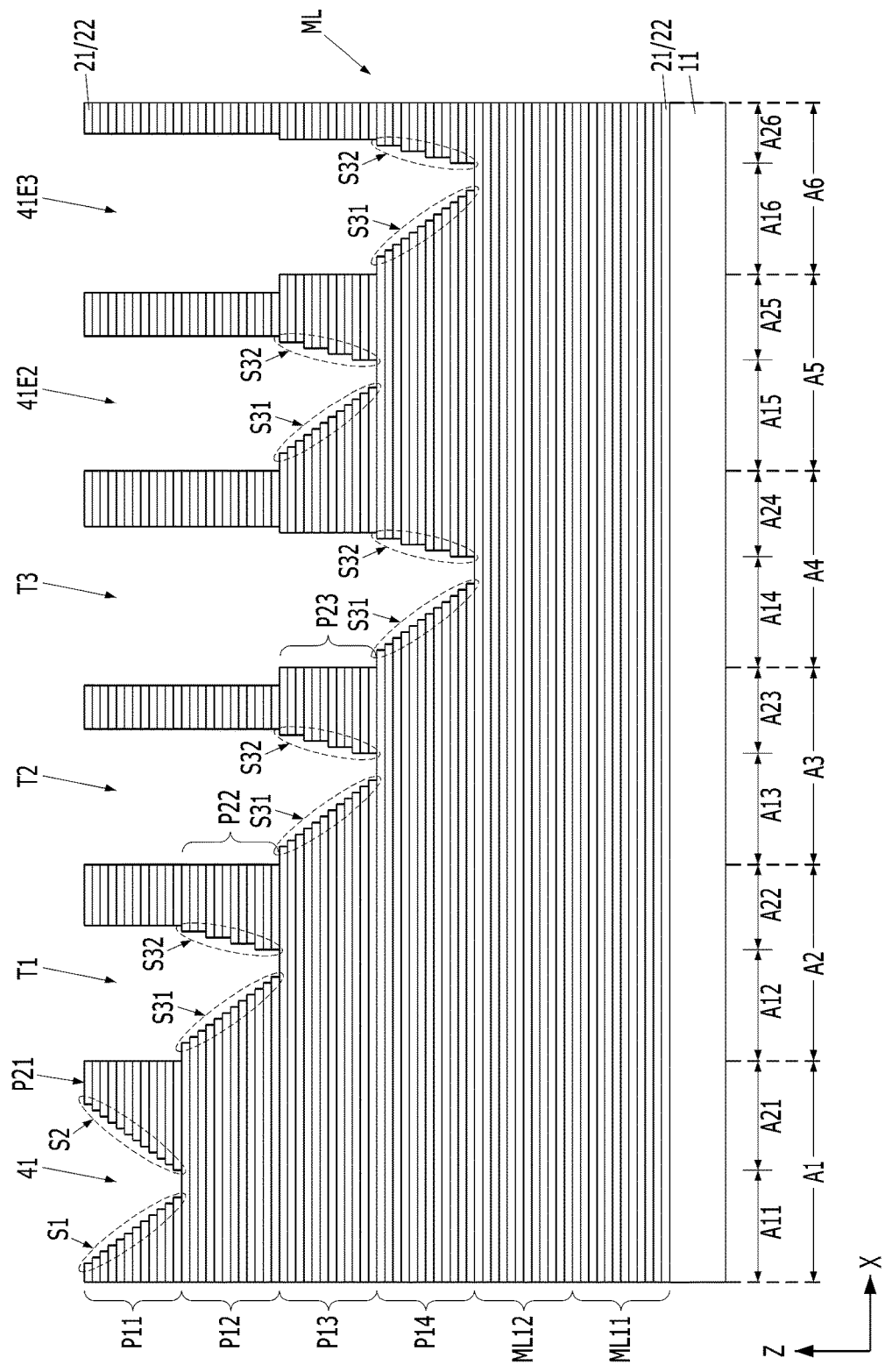

Referring to FIG. 8J, the asymmetric stepped trenches 41T and the first extended asymmetric stepped trenches 41E that are exposed through the fifth openings 81C, 81D, 81E and 81F may be etched. Subsequently, the sixth multi-layered stack ML16 to the third multi-layered stack ML13 below the asymmetric stepped trenches 41T and the first extended asymmetric stepped trenches 41E may be etched. As a result, second extended asymmetric stepped trenches 41E2 and third extended asymmetric stepped trenches 41E3 may be formed.

Each of the second extended asymmetric stepped trenches 41E2 may include vertical sidewalls extended vertically from the first and second stepped sidewalls S31 and S32 and the first and second stepped sidewalls S31 and S32. The etch process for forming the first and second stepped sidewalls S31 and S32 may include an etch process of the fourth multi-layered stack ML14, and the etch process for forming the vertical sidewalls may include an etch process of the asymmetric stepped trenches 41T and the fifth and sixth multi-layered stacks ML15 and ML16. The fourth multi-layered stack ML14, the fifth multi-layered stack ML15, the asymmetric stepped trenches 41T and the sixth multi-layered stack ML16 may be exposed to the etch-back process to form the second extended asymmetric stepped trenches 41E2. The vertical sidewalls may have a non-stepped profile that is symmetrical to each other, and the first and second stepped sidewalls S31 and S32 may have a stepped profile that is asymmetrical to each other. The second extended asymmetric stepped trenches 41E2 may be what the profile of the asymmetric stepped trenches 41T are transcribed. The second extended asymmetric stepped trench 41E2 formed in the third area A3 among the second extended asymmetric stepped trenches 41E2 may be simply referred to as a 'second asymmetric stepped trench T2'. The second asymmetric stepped trenches T2 may be formed by etching the fourth multi-layered stack ML14, the fifth multi-layered stack ML15, and the sixth multi-layered stack ML16 of the third area A3.

Each of the third extended asymmetric stepped trenches 41E3 may include the first and second stepped sidewalls S31 and S32 and vertical sidewalls (not shown) extended vertically from the first and second stepped sidewalls S31 and S32. The etch process for forming the first and second stepped sidewalls S31 and S32 may include an etch process of the third multi-layered stack ML13, and the etch process for forming the vertical sidewalls may include an etch process of the asymmetric stepped trenches 41T, and the fourth to sixth multi-layered stacks ML14 to ML16. The third extended asymmetric stepped trenches 41E3 may be formed by exposing the third multi-layered stack ML13, the fourth multi-layered stack ML14, the fifth multi-layered stack ML15, the first extended asymmetric stepped trenches 41E, and the sixth multi-layered stack ML16 to an etch-back process. The vertical sidewalls may have a non-stepped profile that is symmetrical to each other, and the first and second stepped sidewalls S31 and S32 may have a stepped profile that is asymmetric to each other. The third extended asymmetric stepped trenches 41E3 may be what the profile of the first extended asymmetric stepped trenches 41E is transcribed. The third extended asymmetric stepped trench 41E3 formed in the fourth area A4 among the third extended asymmetric stepped trenches 41E3 may be simply referred to as a 'third asymmetric stepped trench T3'. The third asymmetric stepped trenches T3 may be formed by etching the third multi-layered stack ML13, the fourth multi-layered stack ML14, the fifth multi-layered stack ML15, and the sixth multi-layer stack ML16 of the fourth area A4.

The third pad stack P13 and the third dummy pad stack P23 may be defined by the second asymmetric stepped trench T2, and the fourth pad stack P14 may be defined by the third asymmetric stepped trench T3.

After the second and third extended asymmetric stepped trenches 41E2 and 41E3 are formed, the fifth mask 81 may be removed.

Figure 8K:
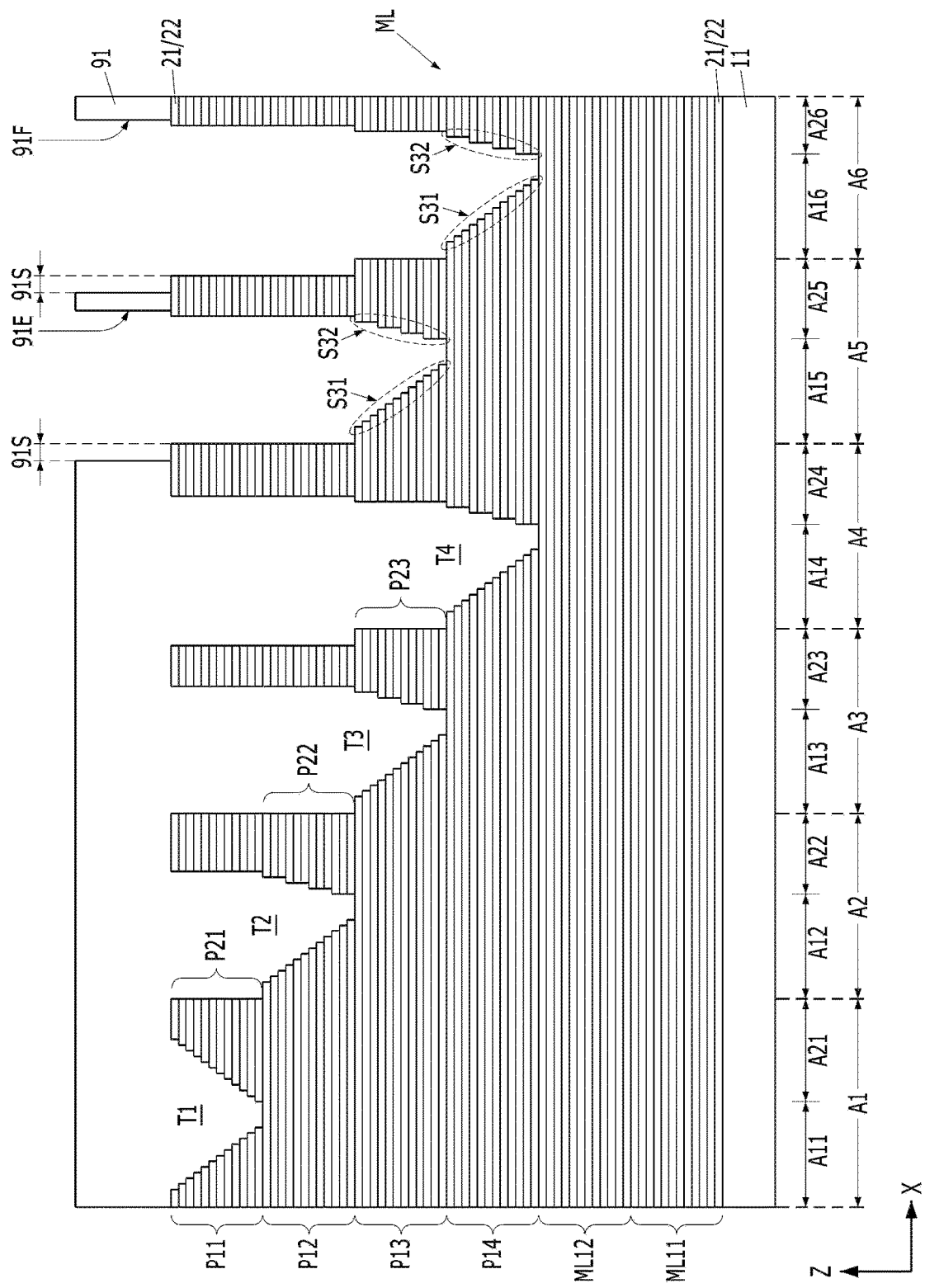

Referring to FIG. 8K, a sixth mask 91 may be formed. The sixth mask 91 may include a photoresist pattern. The sixth mask 91 may include sixth openings 91E and 91F that expose the fifth area A5 and the sixth area A6, respectively. The sixth mask 91 may block the first area A1 to the fourth area A4. When the sixth openings 91E and 91F are formed, one sidewall of the sixth openings 91E and 91F may be shifted (91S) in the first direction X. For example, the mask starting points of the fifth area A5 and the sixth area A6 may be formed to be shifted (91S) in the first direction X from the uppermost pattern.

Figure 8L:
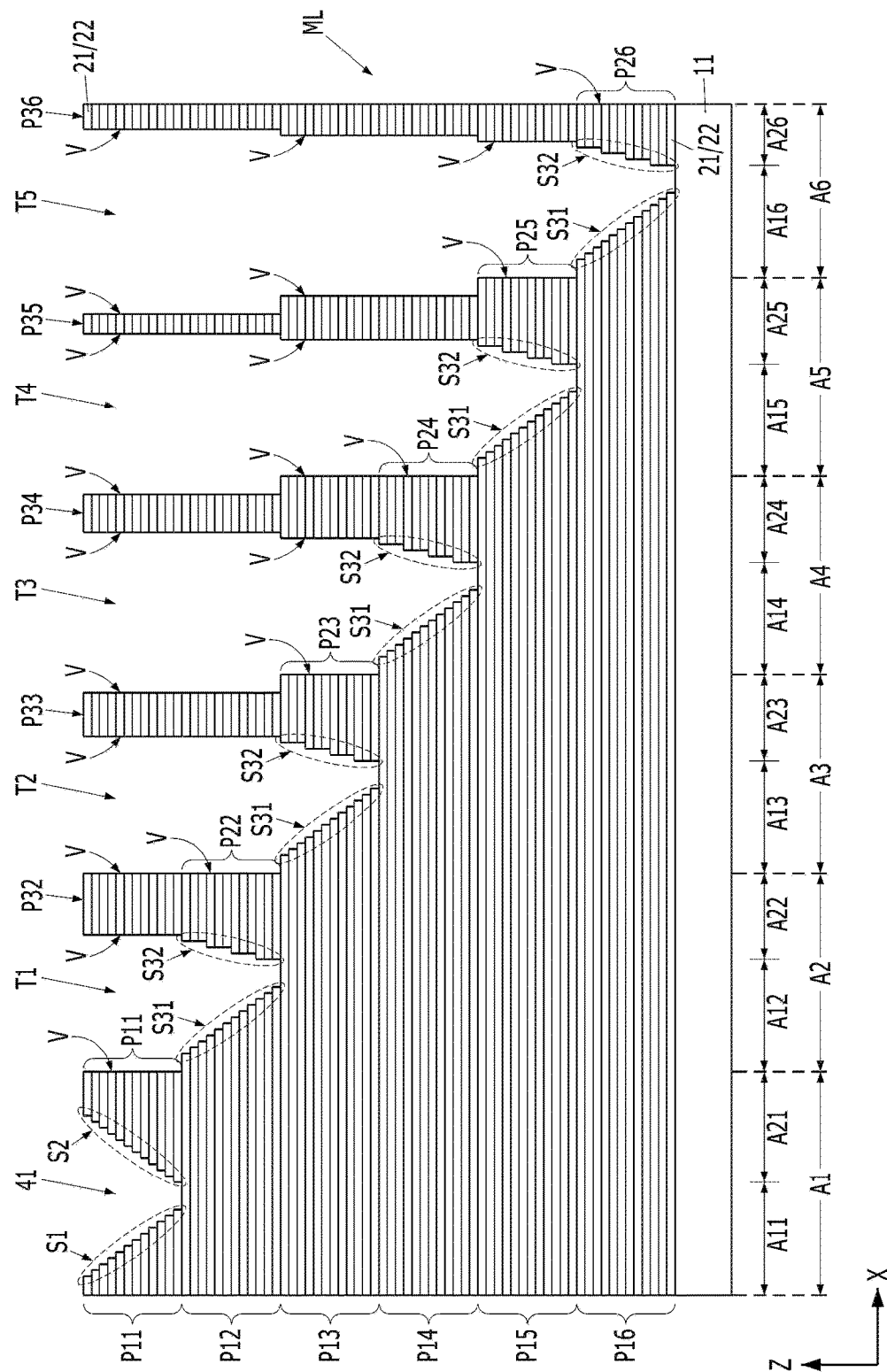

Referring to FIG. 8L, the second extended asymmetric stepped trench 41E2 and the third extended asymmetric stepped trench 41E3 exposed through the sixth openings 91E and 91F may be etched by using the sixth mask 91. Subsequently, the third multi-layered stack ML31, the second multi-layered stack ML12, and the first multi-layered stack ML11 below the second extended asymmetric stepped trench 41E2 may be etched. As a result, a fourth asymmetric stepped trench T4 may be formed.

The fourth asymmetric stepped trench T4 may have the profile of the second extended asymmetric stepped trench 41E2 located at a lower height. The fourth asymmetric stepped trench T4 may be formed in the fifth area A5. The fourth asymmetric stepped trench T4 may be formed by etching the second to sixth multi-layered stacks ML12 to ML16 of the fifth area A5.

The second multi-layered stack ML12 and the first multi-layered stack ML11 below the third extended asymmetric stepped trench 41E3 may be etched while the fourth asymmetric stepped trench T4 is formed at the same time. As a result, a fifth asymmetric stepped trench T5 may be formed.

The fifth asymmetric stepped trench T5 may be what the profile of the third extended asymmetric stepped trench 41E3 is vertically downwardly extended. The fifth asymmetric stepped trench T5 may be formed in the sixth area A6. The fifth asymmetric stepped trench T5 may be formed by etching the first multi-layered stack ML11, the second multi-layered stack ML12, the third multi-layered stack ML13, the fourth multi-layered stack ML14, the fifth multi-layered stack ML15, and the sixth multi-layered stack ML16.

A fifth pad stack P15 and a fifth dummy pad stack P25 may be defined by the fourth asymmetric stepped trench T4. A sixth pad stack P16 and a sixth dummy pad stack P26 may be defined by the fifth asymmetric stepped trench T5.

The fifth asymmetric stepped trench T5 may be deeper than the fourth asymmetric stepped trench T4. The fourth asymmetric stepped trench T4 may be deeper than the third asymmetric stepped trench T3. The third asymmetric stepped trench T3 may be deeper than the second asymmetric stepped trench T2. The second asymmetric stepped trench T2 may be deeper than the first asymmetric stepped trench T1.

The first asymmetric stepped trench to the fifth asymmetric stepped trenches T1 to T5 may be formed by the series of the processes described above. The first asymmetric stepped trench T1 may be the shallowest, while the fifth asymmetric stepped trench T5 may be the deepest. Each of the first asymmetric stepped trench to the fifth asymmetric stepped trenches T1 to T5 may include the first stepped sidewall S31 and the second stepped sidewall S32 which are asymmetrical to each other.

The first stepped sidewall S31 may be positioned in the pad areas A12 to A16, and the second stepped sidewall S2 may be positioned in the dummy pad areas A22 to A26. The first stepped sidewall S31 and the second stepped sidewall S32 may face each other. For the detailed description on the first stepped sidewall S31 and the second stepped sidewall S32, FIG. 2F and the description thereof may be referred to.

Supporting dummy stacks P32 to P36 may be positioned over the dummy pad stacks P22 to P26, respectively. Both sidewalls of the supporting dummy stacks P32 to P36 may be vertical sidewalls V.

Figure 8M:
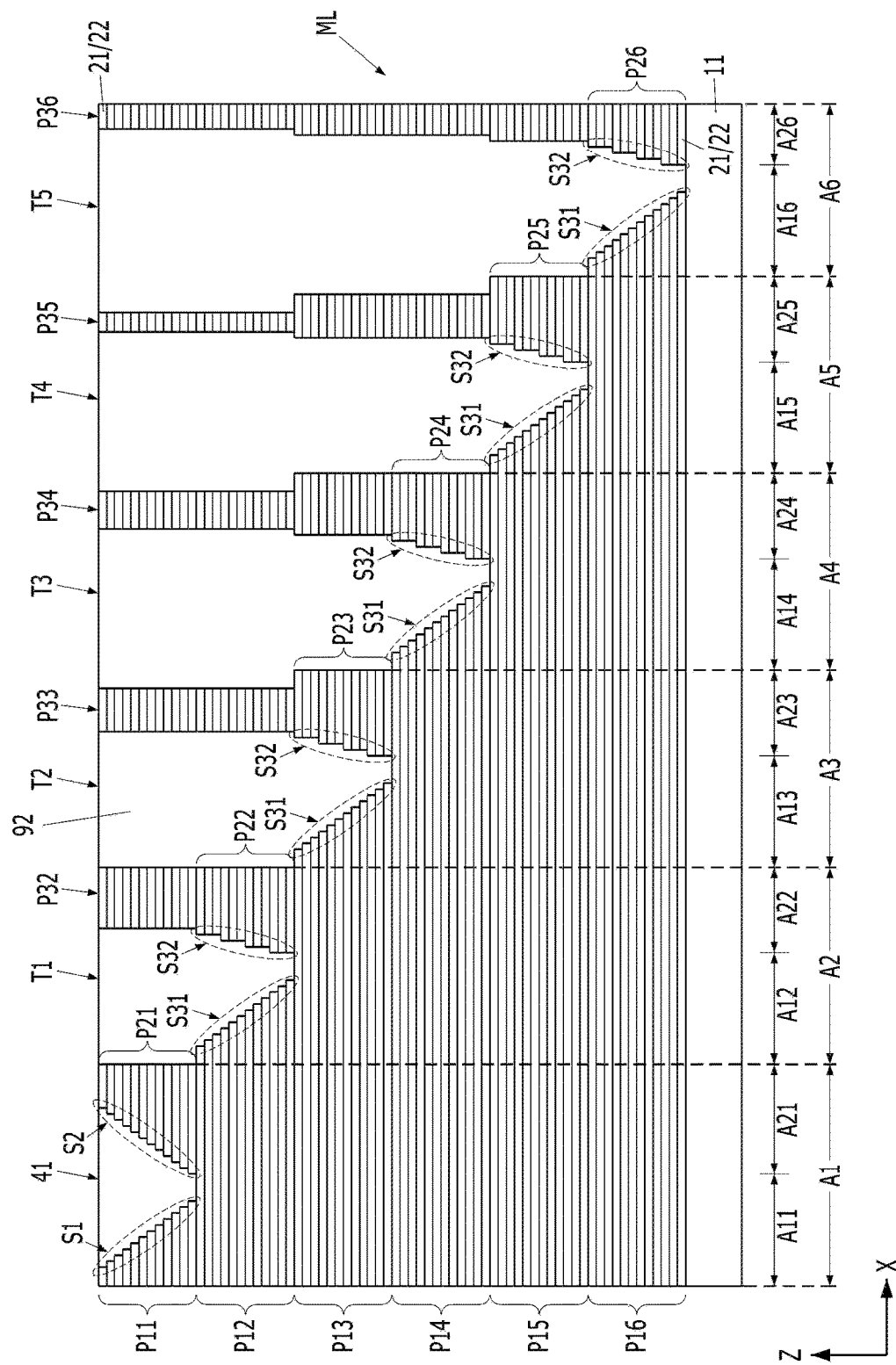

After the first asymmetric stepped trench to the fifth asymmetric stepped trench T1 to T5 are formed, as illustrated in FIG. 8M, an interlayer dielectric layer 92 filling the asymmetric stepped trenches T1 to T5 may be formed. The interlayer dielectric layer 92 may include silicon oxide. The interlayer dielectric layer 92 may be planarized by a Chemical Mechanical Polishing (CMP) process to expose the uppermost second layer 22.

Herein, since the width of the supporting dummy stacks P32 to P36 is increased by the dummy pad areas A21 to A25 having a reduced occupying area, the dishing phenomenon of the CMP process may be improved.

Subsequently, the series of the processes shown in FIGS. 6A to 6E may be performed. As a result, the pad stacks P11 to P16 may be replaced with gate pad stacks, and the dummy pad stacks P21 to P26 may be replaced with dummy gate pad stacks. The supporting dummy stacks P32 to P36 may be replaced with supporting stacks.

According to the embodiments of the present disclosure, the size of a chip may be reduced by minimizing the area occupied by a dummy pad stack.

According to the embodiments of the present disclosure, dishing of a Chemical Mechanical Polishing (CMP) process may be improved by the dummy pad stack of the reduced occupying area.

According to the embodiments of the present disclosure, it is possible to prevent a step of a subsequent pad area from collapsing by shifting the gap between the step of the pad area and a mask. As the pad area is formed in a stepped structure, the change in the size of the step may be minimized, thereby improving the word line bridge margin which may be caused by the contact punch.

Embodiments of the present disclosure include the following devices 1A-1K and 2A-2I.

1A. In accordance with an embodiment 1A, a semiconductor device comprises: an alternating layer stack provided over a substrate, the alternating layer stack comprising a plurality of alternating conductive and dielectric layers; and an asymmetrical stepped trench disposed in the alternating layer stack, the asymmetrical stepped trench having a first stepped sidewall with first steps and a second stepped sidewall with second steps that are different from the first steps.

1B. the device of embodiment 1A, wherein each of the first steps has no more than one of the dielectric layers and no more than one of the conductive layers.

1C. The device of embodiment 1B, wherein each of the second steps comprises at least two of the dielectric layers and at least two of the conductive layers.

1D. The device of embodiment 1C, wherein the first and second steps occupy a same height in a vertical direction.

1E. The device of embodiment 1A, wherein the second stepped sidewall occupies less surface area of the substrate than the first stepped sidewall.

1F. The device of embodiment 1A, wherein the conductive layers of the first steps extend from a peripheral region to a cell region and the asymmetric stepped trench is disposed in the peripheral region.

1G. The device of embodiment 1F, further comprising a plurality of contact plugs disposed in the asymmetric stepped trench and respectively coupled to conductive layers of the first steps.

1H. The device of embodiment 1A, wherein the semiconductor device is a multi-layer memory device.

1I. The device of embodiment 1A, further comprising a plurality of asymmetrical stepped trenches, each of the asymmetric stepped trenches having a different depth.

1J. The device of embodiment 1A, further comprising at least two first steps for every second step in the asymmetric trench.

1K. The device of embodiment 1A, wherein a slope of the first steps is less than a slope of the second steps.

2A. In an embodiment 2A, a semiconductor device comprises an alternating layer stack provided over a substrate, the alternating layer stack comprising a plurality of alternating conductive and dielectric layers; and an asymmetric stepped trench with first and second sidewalls in the plurality of stacked layers, the first sidewall having a number n of first steps within a vertical distance and the second sidewall having a number m of second steps within the same vertical distance, wherein n is greater than m and n is two or more.

2B. The device of embodiment 2A, wherein each of the first steps has no more than one of the dielectric layers and no more than one of the conductive layers.

2C. The device of embodiment 2A, wherein each of the second steps comprises at least two of the dielectric layers and at least two of the conductive layers.

2D. The device of embodiment 2A, wherein the second stepped sidewall occupies less surface area of the substrate than the first stepped sidewall.

2E. The device of embodiment 2A, wherein the conductive layers of the first steps extend from a peripheral region to a cell region and the asymmetric stepped trench is disposed in the peripheral region.

2F. The device of embodiment 2E, further comprising a plurality of contact plugs disposed in the asymmetric stepped trench and coupled to conductive layers of the first steps.

2G. The device of embodiment 2A, wherein the semiconductor device is a multi-layer memory device.

2H. The device of embodiment 2A, further comprising a plurality of asymmetrical stepped trenches, each of the asymmetric stepped trenches having a different depth.

2I. The device of embodiment 2A, further comprising at least two first steps for every second step in the asymmetric trench.

While the present disclosure has been described with respect to the specific embodiments, it will be apparent to those skilled in the art that various changes and modifications may be made without departing from the scope of the disclosure as defined in the following claims.

What is claimed is:

1. A vertical semiconductor device, comprising:
a substrate;
a gate pad stack and a dummy gate pad stack that are formed over the substrate and divided by an asymmetric stepped trench;
a first dummy stack formed over the gate pad stack; and
a second dummy stack formed over the dummy gate pad stack,
wherein the first dummy stack and the second dummy stack are divided by a vertical trench, and
wherein the first and second dummy stacks are electrically isolated structures.

2. The vertical semiconductor device of claim 1, wherein the asymmetric stepped trench includes:
a first stepped sidewall that is defined at an edge of the gate pad stack; and
a second stepped sidewall that is defined at an edge of the dummy gate pad stack facing the first stepped sidewall, and
the first stepped sidewall and the second stepped sidewall have an asymmetric structure of different occupying areas.

3. The vertical semiconductor device of claim 2, wherein the second stepped sidewall occupies a less area than the first stepped sidewall.

4. The vertical semiconductor device of claim 2, wherein the first stepped sidewall includes a plurality of first steps, and the second stepped sidewall includes a plurality of second steps, and
  the second steps are formed to have a greater height than the first steps.

5. The vertical semiconductor device of claim 4, wherein each of the first steps and the second steps includes a stack of a conductive layer and a dielectric layer, and
  the first steps include a stack of a pair of the conductive layer and the dielectric layer, and the second steps include a stack of at least two pairs of the conductive layer and the dielectric layer.

6. The vertical semiconductor device of claim 2, wherein the first stepped sidewall and the second stepped sidewall have the same height.

7. The vertical semiconductor device of claim 6, wherein the first stepped sidewall includes a plurality of first steps, and the second stepped sidewall includes a plurality of second steps, and
  the number of the second steps is smaller than the number of the first steps.

8. The vertical semiconductor device of claim 2, wherein the second stepped sidewall is formed to have a steeper tilt than the first stepped sidewall.

9. The vertical semiconductor device of claim 1, further comprising:
  a gate electrode stack extended from the gate pad stack, wherein the gate electrode stack includes:
  gate electrodes and dielectric layers extended from the gate pad stack in a direction parallel to the substrate; and
  a vertical pillar structure that is perpendicular to the substrate by penetrating through the gate electrodes and the dielectric layers.

10. The vertical semiconductor device of claim 1, wherein the first and second dummy stacks each include a plurality of conductive layers alternately stacked with a plurality of dielectric layers.

11. The semiconductor device of claim 10, wherein each of the first and second dummy stacks comprises at least four conductive layers and four dielectric layers.

\* \* \* \* \*